US009562671B2

(12) United States Patent  
Davis

(10) Patent No.: US 9,562,671 B2
(45) Date of Patent: Feb. 7, 2017

(54) COLOR-TUNABLE LIGHTING DEVICES AND METHODS OF USE

(75) Inventor: James Lynn Davis, Holly Springs, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 899 days.

(21) Appl. No.: 13/817,887

(22) PCT Filed: Aug. 19, 2011

(86) PCT No.: PCT/US2011/048415
§ 371 (c)(1),
(2), (4) Date: May 6, 2013

(87) PCT Pub. No.: WO2012/024582
PCT Pub. Date: Feb. 23, 2012

(65) Prior Publication Data
US 2013/0215597 A1    Aug. 22, 2013

Related U.S. Application Data

(60) Provisional application No. 61/375,449, filed on Aug. 20, 2010.

(51) Int. Cl.
*F21V 14/08* (2006.01)
*F21V 14/00* (2006.01)
(Continued)

(52) U.S. Cl.
CPC ............... *F21V 14/00* (2013.01); *F21V 7/22* (2013.01); *F21V 9/10* (2013.01); *F21V 9/16* (2013.01);
(Continued)

(58) Field of Classification Search
CPC .............. F21V 14/08; F21V 9/10; F21V 9/16; F21V 14/00; F21V 14/02; F21V 14/003; F21V 7/0008; F21V 14/006; F21V 13/14; F21Y 2101/02; F21Y 2103/003; F21Y 2101/00; F21Y 2103/10; F21K 9/54; F21K 9/56; F21K 9/58; F21K 9/00; F21K 9/52; F21K 9/275; F21K 9/61; F21K 9/62; F21K 9/64; F21S 10/026; F21S 10/005; F21S 10/02; H01J 1/63; H01J 1/66; H01J 1/68; G02B 6/0011; G02B 6/0046
See application file for complete search history.

(56) References Cited

U.S. PATENT DOCUMENTS 3,928,757 A  *  12/1975  Nelson ..................... F21S 8/04
                                                    362/228
4,853,594 A       8/1989  Thomas
(Continued)

FOREIGN PATENT DOCUMENTS

AT    DE102005030374 A1    1/2007
NL    WO2008149250 A1     12/2008
(Continued)

OTHER PUBLICATIONS

International Preliminary Report on Patentability dated Mar. 7, 2013 for PCT/US2011/048415.
(Continued)

*Primary Examiner* — Hargobind S Sawhney
(74) *Attorney, Agent, or Firm* — David P. Gloekler; Olive Law Group, PLLC

(57) ABSTRACT

A lighting device (100) includes a housing (104) enclosing a housing interior (108), a light source (132), a light converter (136), and a color tuning device. The light source is configured for emitting a primary light beam of a primary wavelength (140) through the housing interior. The light converter includes a luminescent material (144) facing the housing interior and configured for emitting secondary light
(Continued)

(156, 158) of one or more wavelengths different from the primary wavelength, in response to excitation by the primary light beam. The housing includes a light exit (124) for outputting a combination of primary light and secondary light. The color tuning device is configured for adjusting a position of the primary light beam relative to the luminescent material.

30 Claims, 26 Drawing Sheets

(51) Int. Cl.

| | | |
|---|---|---|
| F21V 7/22 | (2006.01) | |
| H01J 1/63 | (2006.01) | |
| H01L 33/50 | (2010.01) | |
| F21V 9/10 | (2006.01) | |
| F21V 9/16 | (2006.01) | |
| H01L 33/60 | (2010.01) | |
| F21V 7/00 | (2006.01) | |
| F21V 29/74 | (2015.01) | |
| F21Y 101/00 | (2016.01) | |

(52) U.S. Cl.
CPC .............. *F21V 14/08* (2013.01); *H01J 1/63* (2013.01); *H01L 33/507* (2013.01); *F21V 7/0008* (2013.01); *F21V 29/74* (2015.01); *F21Y 2101/00* (2013.01); *H01L 33/60* (2013.01); *H01L 2924/0002* (2013.01)

(56) References Cited

U.S. PATENT DOCUMENTS

| | | | |
|---|---|---|---|
| 5,892,621 | A | 4/1999 | McGregor et al. |
| 5,998,925 | A | 12/1999 | Shimizu et al. |
| 6,357,889 | B1 | 3/2002 | Duggal et al. |
| 6,465,951 | B1 | 10/2002 | Krafcik et al. |
| 6,641,287 | B2 | 11/2003 | Suehiro |
| 6,737,681 | B2 | 5/2004 | Koda |
| 7,014,336 | B1 | 3/2006 | Ducharme et al. |
| 7,070,300 | B2 | 7/2006 | Harbers |
| 7,144,131 | B2 | 12/2006 | Rains |
| 7,311,858 | B2 | 12/2007 | Wang et al. |
| 7,390,437 | B2 | 6/2008 | Dong et al. |
| 7,614,759 | B2 | 11/2009 | Negley |
| 7,618,157 | B1 | 11/2009 | Galvez et al. |
| 7,660,040 | B2 | 2/2010 | Starry et al. |
| 7,703,943 | B2 | 4/2010 | Li et al. |
| 7,703,945 | B2 | 4/2010 | Leung et al. |
| 7,750,359 | B2 | 7/2010 | Narendran et al. |
| 7,942,540 | B2 | 5/2011 | Harbers et al. |
| 7,942,556 | B2 | 5/2011 | Harbers et al. |
| 8,764,210 | B2 * | 7/2014 | Jonsson .................... F21K 9/56 362/84 |
| 9,074,751 | B2 * | 7/2015 | Son ........................... F21V 9/10 |
| 2004/0245912 | A1 | 12/2004 | Thurk et al. |
| 2005/0057145 | A1 | 3/2005 | Shieh et al. |
| 2005/0224998 | A1 | 10/2005 | Andrady et al. |
| 2005/0224999 | A1 | 10/2005 | Andrady et al. |
| 2006/0072314 | A1 | 4/2006 | Rains |
| 2006/0145123 | A1 | 7/2006 | Li et al. |
| 2006/0158090 | A1 | 7/2006 | Wang et al. |
| 2006/0203468 | A1 | 9/2006 | Beeson et al. |
| 2006/0228435 | A1 | 10/2006 | Andrady et al. |
| 2006/0261309 | A1 | 11/2006 | Li et al. |
| 2006/0262310 | A1 | 11/2006 | Starry et al. |
| 2006/0264140 | A1 | 11/2006 | Andrady et al. |
| 2006/0268544 | A1 | 11/2006 | Rains, Jr. et al. |
| 2007/0029526 | A1 | 2/2007 | Cheng et al. |
| 2007/0240346 | A1 | 10/2007 | Li et al. |
| 2008/0110342 | A1 | 5/2008 | Ensor et al. |
| 2008/0111472 | A1 | 5/2008 | Liu et al. |
| 2008/0113214 | A1 | 5/2008 | Davis et al. |
| 2008/0150556 | A1 | 6/2008 | Han et al. |
| 2008/0172197 | A1 | 7/2008 | Skipor et al. |
| 2008/0210953 | A1 | 9/2008 | Ladstatter et al. |
| 2008/0286856 | A1 | 11/2008 | Park et al. |
| 2008/0310158 | A1 * | 12/2008 | Harbers .................... F21K 9/54 362/240 |
| 2009/0212695 | A1 | 8/2009 | Kim et al. |
| 2009/0251884 | A1 | 10/2009 | Rains |
| 2009/0273918 | A1 | 11/2009 | Falicoff |
| 2009/0296384 | A1 | 12/2009 | Van De Ven et al. |
| 2009/0320340 | A1 | 12/2009 | Koren |
| 2010/0020531 | A1 | 1/2010 | Choi et al. |
| 2010/0027293 | A1 | 2/2010 | Li |
| 2010/0031617 | A1 | 2/2010 | Ensor et al. |
| 2010/0032695 | A1 | 2/2010 | Fellows-Demille et al. |
| 2010/0033948 | A1 | 2/2010 | Harbers et al. |
| 2010/0102199 | A1 | 4/2010 | Negley et al. |
| 2010/0103678 | A1 | 4/2010 | Van De Ven et al. |
| 2010/0254115 | A1 * | 10/2010 | Wegh ....................... F21K 9/135 362/84 |
| 2010/0290222 | A1 | 11/2010 | Pickard et al. |
| 2011/0182056 | A1 | 7/2011 | Trottier et al. |
| 2013/0215599 | A1 | 8/2013 | Davis et al. |

FOREIGN PATENT DOCUMENTS

| | | |
|---|---|---|
| WO | 2007130536 A2 | 11/2007 |
| WO | WO2007130536 A2 | 11/2007 |
| WO | WO2009032378 A2 | 3/2009 |
| WO | WO2009151515 A1 | 12/2009 |
| WO | WO2010120900 A1 | 10/2010 |
| WO | WO2011068682 A1 | 6/2011 |

OTHER PUBLICATIONS

International Search Report dated Feb. 13, 2012 for PCT/US2011/048415.
International Preliminary Report on Patentability dated Mar. 7, 2013 for PCT/US2011/048429.
International Search Report dated Dec. 27, 2011 for PCT/US2011/048429.
International Preliminary Report on Patentability dated Mar. 7, 2013 for PCT/US2011/048440.
International Search Report dated Aug. 14, 2012 for PCT/US2011/048440.
International Preliminary Report on Patentability dated Mar. 7, 2013 for PCT/US2011/048456.
International Search Report dated Feb. 15, 2012 for PCT/US2011/048456.
Bowers et al. Journal of the American Chemical Society vol. 127 (2005) pp. 15378-15379.
Quantum Dots Lend New Approach to Solid-State Lighting, Sandia National Laboratory press release Jul. 24, 2003.
Non-final Rejection regarding related U.S. Appl. No. 13/817,896, dated Dec. 3, 2014.
Reply and Amendment regarding related U.S. Appl. No. 13/817,896, dated Mar. 16, 2015.
Non-final Rejection regarding related U.S. Appl. No. 13/817,900, dated Mar. 31, 2014.
Reply and Amendment regarding related U.S. Appl. No. 13/817,900, dated Dec. 15, 2014.
Final Rejection regarding related U.S. Appl. No. 13/817,900, dated Feb. 10, 2015.
Non-final Rejection regarding related U.S. Appl. No. 13/817,903 dated Oct. 23, 2015.
PCT Search Report regarding related PCT Application No. PCT/US2011/048456 dated Feb. 15, 2012.

* cited by examiner

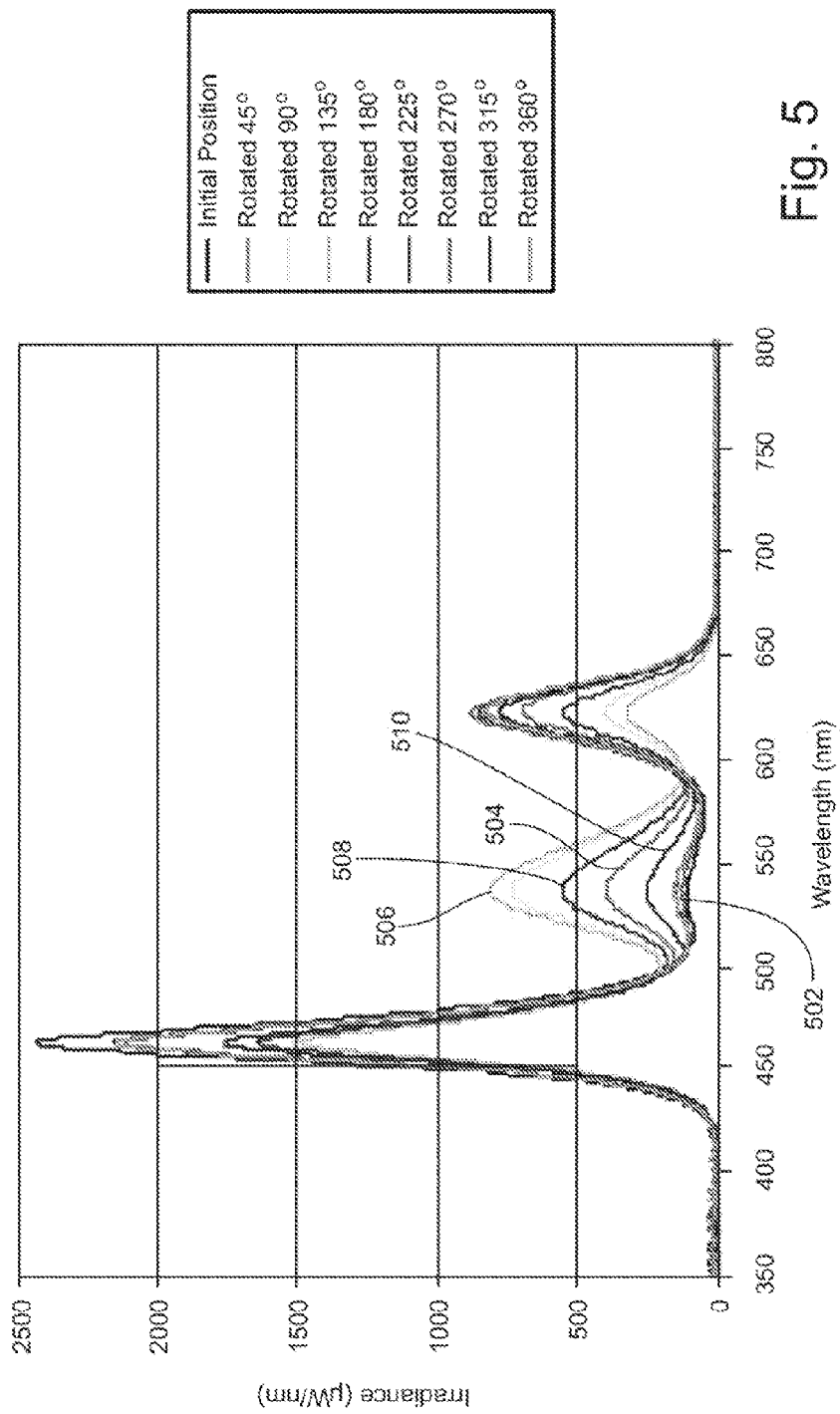

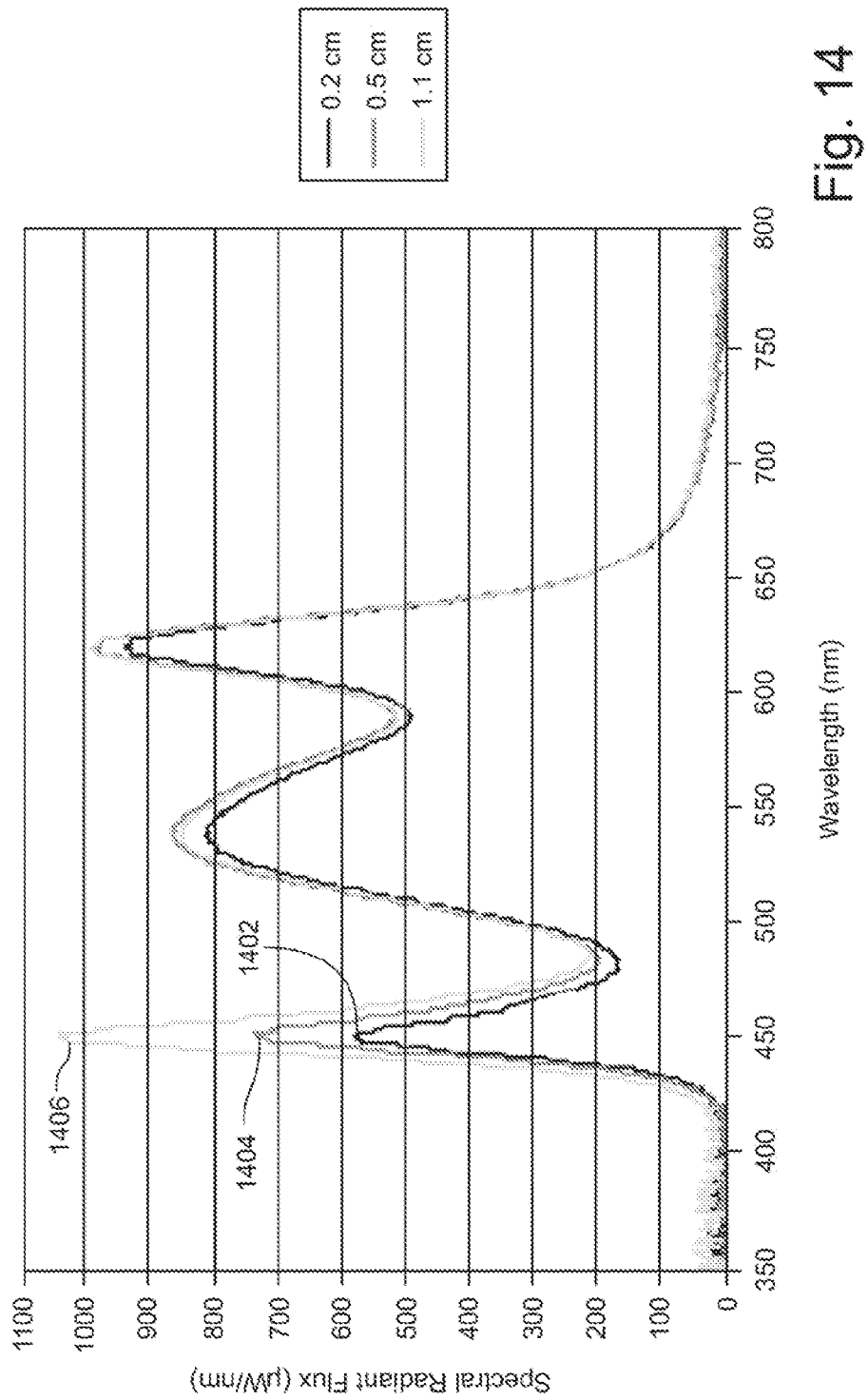

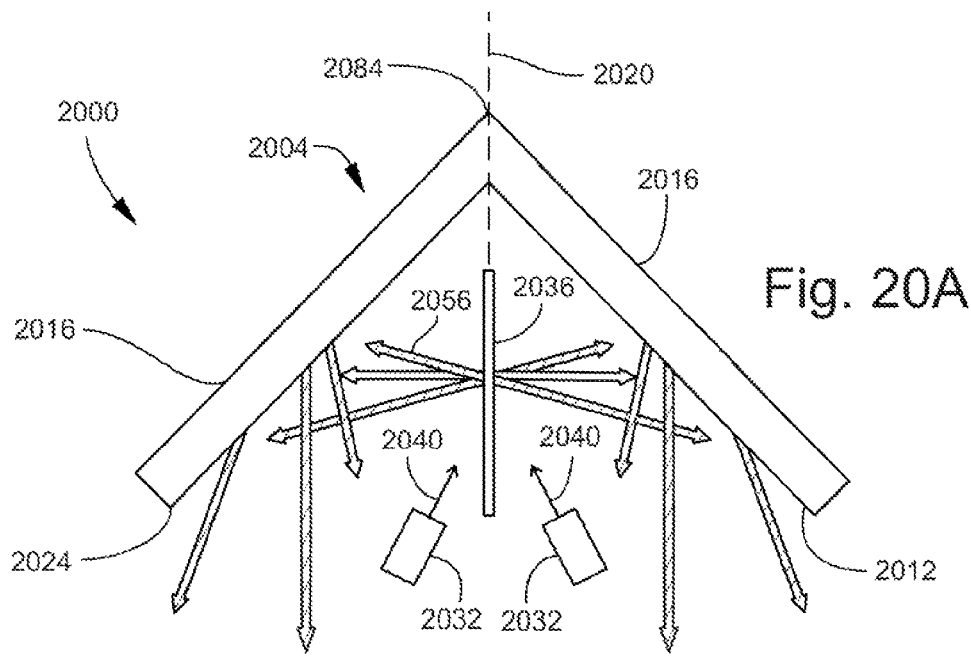
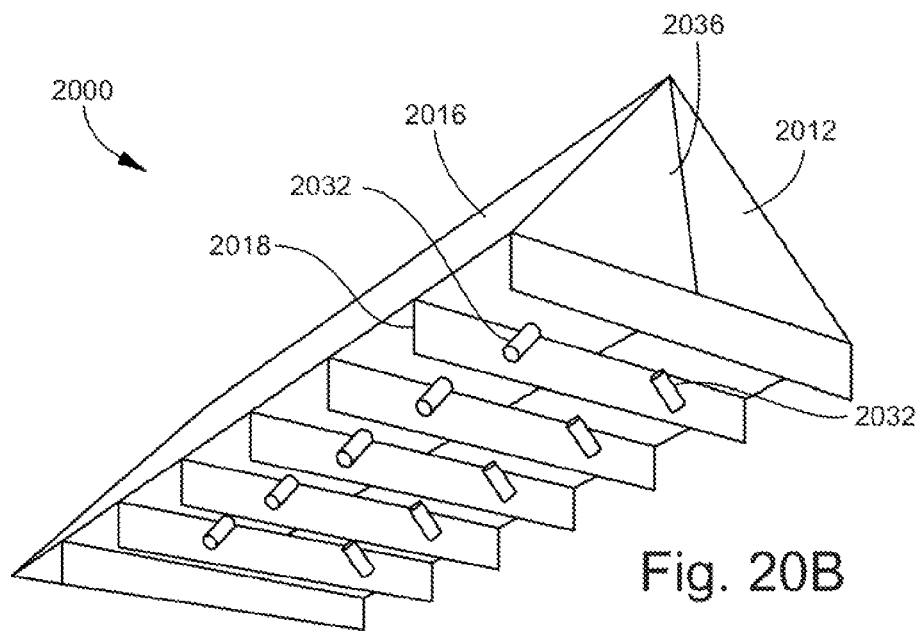

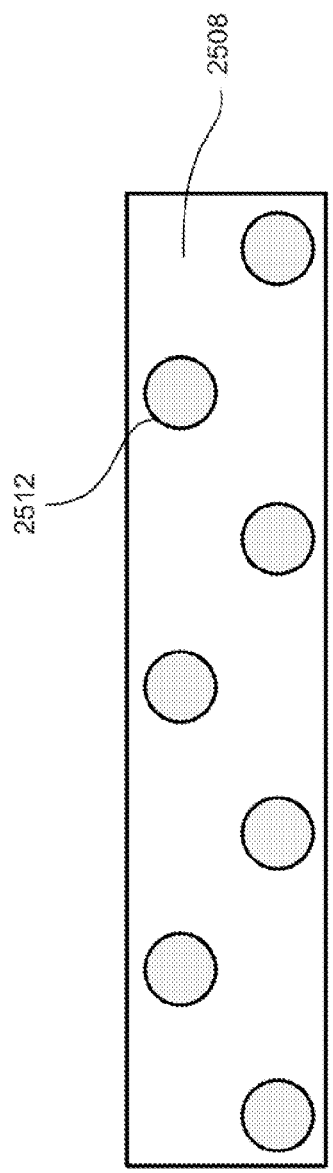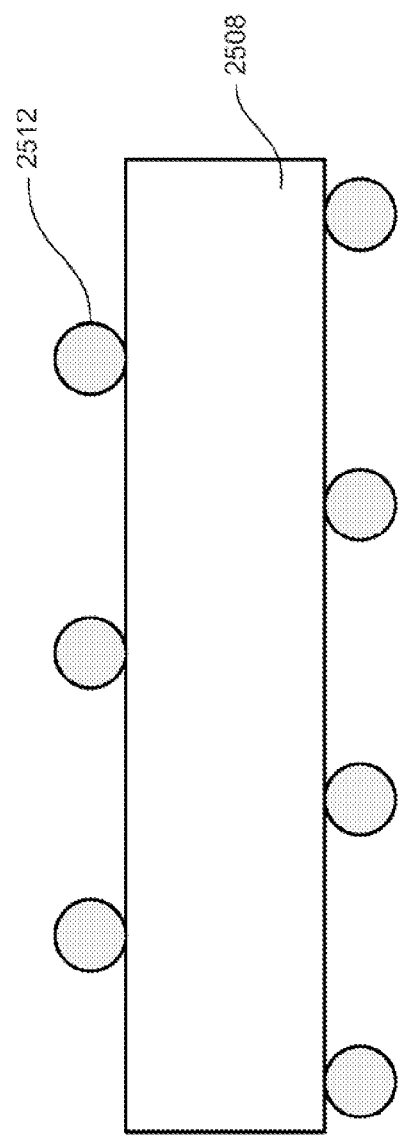

COLOR-TUNABLE LIGHTING DEVICES AND METHODS OF USE

RELATED APPLICATIONS

This application is the national stage of International Patent Application No. PCT/US2011/048415, filed Aug. 19, 2011, titled "COLOR-TUNABLE LIGHTING DEVICES AND METHODS FOR TUNING COLOR OUTPUT OF LIGHTING DEVICES", which claims the benefit of U.S. Provisional Patent Application Ser. No. 61/375,449, filed Aug. 20, 2010, titled "COLOR-TUNABLE LIGHTING DEVICES AND METHODS FOR TUNING COLOR OUTPUT OF LIGHTING DEVICES;" the content of which is incorporated by reference herein in its entirety.

FEDERALLY SPONSORED SUPPORT

This invention was made with government support under Award No. DE-FC26-06NT42861 by the U.S. Department of Energy. The United States Government may have certain rights in the invention.

TECHNICAL FIELD

The present invention relates generally to lighting devices. In particular, the invention relates to adjusting the color of light produced by a lighting device.

BACKGROUND

For general purpose illumination requiring white light, solid-state lighting (SSL) devices are being investigated as alternatives to conventional lighting devices such as incandescent and fluorescent lighting devices. Incandescent lighting devices (IL) emit white light by thermal radiation from a hot, electrically resistive filament. The spectral quality and color-rendering accuracy of incandescent light is high, approaching the performance of an ideal black-body radiator. However, incandescent lighting suffers from very low energy efficiency and operating lifetimes, with most of the energy input being converted to heat rather than useful emission of visible light. Fluorescent lighting (FL) devices emit white light from phosphor-coated surfaces in response to irradiation of those surfaces by ultraviolet (UV) light generated from energized mercury vapor. Fluorescent lighting is more energy efficient and has higher operating lifetimes, but typically has poor spectral quality. Moreover, incandescent and fluorescent lighting require light bulbs that must remain sealed to maintain a vacuum or contain a gas, respectively, and are prone to breaking.

On the other hand, SSL devices do not require sealed bulbs, have robust designs that do not require flexible or fragile components, and are highly energy efficient. SSL devices typically utilize LED lamps that produce light in narrow ranges of wavelengths (e.g., red, green or blue). White light-emitting SSL devices have been provided in two different configurations. In one configuration, the white light-emitting SSL device utilizes a closely-spaced cluster of red, green and blue LEDs to produce white light from the spectral composite of emissions from the LEDs. This "RGB LED" configuration enables the color of the white light to be adjusted if the associated electronic circuitry is configured to enable adjustment of drive currents provided to (and thus adjustment of the intensities of) the individual LEDs. However, a high cost is associated with the provision of multiple LEDs and complex drive circuitry. In another configuration, the SSL device utilizes a blue or UV LED packaged with one or more phosphors for converting the short-wavelength emission from the LED to longer-wavelength emissions, whereby white light is produced from the mixture of emissions in a manner similar to fluorescent lighting. Compared to RGB LED devices, the phosphor-converted LED approach is lower in cost but does not provide any means for adjusting the color of the white light. Consequently, color rendering index (CRI) values are low for phosphor-converted LED-based lighting devices. Generally, conventional SSL lighting devices of any type typically exhibit CRI values of less than 80.

Because the human eye is very sensitive to small variations in color, the end user can sometimes detect variations in correlated color temperature (CCT) as small as 10-20 K. Hence, lighting devices must be held to tight specifications to avoid noticeable color variation in large installations. Variations in CCT and CRI typically arise in SSL lamps due to manufacturing variability and are manifested as visible color variations in lighting devices equipped with SSL lamps. Currently, there is no economical way to manufacture a large number of white lighting devices that output the same character (e.g., tone, hue, etc.) of white color. There is also no practical way to adjust output color of a lighting device once it has been manufactured. Consequently, a batch of manufactured SSL devices must be screened at the end of the manufacturing line (end of line, or EOL) and sorted into bins according to CCT, CRI and other properties. This process is known as "binning" and results in all lighting devices of a given bin having approximately the same color. Different bins may then be provided to different customers or for different lighting installation projects. Binning is disadvantageous because it adds time, effort and cost to the manufacturing process. Moreover, binning is an imperfect solution to the problem of color variation. Binning does not correct color variation but rather separates lighting devices with similar colors into different groups. Moreover, the variation in color among the lighting devices of a given bin may still be noticeable. For instance, a bin of lighting devices may be provided to a customer who then installs them as lighting fixtures in the ceiling of a large meeting room. Different persons in different areas of the room may notice non-uniformities in the light provided by the lighting fixtures due to the inadequacy of the binning process.

In addition, an end user may wish to adjust the tone or hue of the color provided by a lighting device. For example, in the case of a white lighting device the user may desire to adjust whether white light is warm (yellowish or reddish, e.g., CCT=2,600-3,700 K), neutral (e.g., CCT=3,700-5,000 K), or cool (bluish, e.g., CCT=5,000-10,000 K) for specific purposes such as general lighting in a relaxing environment, general lighting in an office environment, lighting for reading, etc. Also, the end user may be using a lighting device containing multiple lighting device units with respective SSL sources and light exits, or multiple lighting devices installed in the same location. In these latter cases, the end user may wish to adjust one or more lighting device units of a single lighting device, or one or more lighting devices grouped in close proximity, so that the light outputted by all lighting devices or lighting device units is uniform.

In view of the foregoing, there is a need for adjusting the color (or one or more color properties) of light produced by a lighting device. As noted above, the need for adjusting color may arise in the field by an end user or at the EOL by a manufacturer.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one implementation, a lighting device includes a housing enclosing a housing interior, a light source, a light converter, and a color tuning device. The light source is configured for emitting a primary light beam of a primary wavelength through the housing interior. The light converter includes a luminescent material facing the housing interior and configured for emitting secondary light of one or more wavelengths different from the primary wavelength, in response to excitation by the primary light beam. The housing includes a light exit for outputting a combination of primary light and secondary light. The color tuning device is configured for adjusting a position of the primary light beam relative to the luminescent material.

In various implementations, the color tuning device may be configured for manual adjusting, power-assisted adjusting in response to user input, or power-assisted adjusting in response to feedback from a light-measuring device.

In various implementations, the color tuning device may be configured for moving the luminescent material relative to the light source, moving the light source relative to the luminescent material, or both.

In one implementation, the luminescent material includes at least a first luminescent component and a second luminescent component configured for respectively emitting secondary light of a first wavelength and a second wavelength, and at least one of the luminescent components is movable into overlapping relation with the other luminescent component.

In some implementations, an optical element is disposed in the housing interior and interposed in at least a portion of the primary light beam between the light source and the luminescent material. In some implementations, the color tuning device is configured for moving the optical element.

In one implementation, the optical element includes a prism. The prism may include a bore extending from the input surface to the output surface and optically aligned with a nominal output axis of the light source. A higher intensity portion of the primary light beam may pass through the bore along the nominal output axis and a lower intensity portion of the primary light beam may be outputted from the prism at an angle relative to the higher intensity portion.

In one implementation, the optical element may be a specularly reflective surface configured to receive the portion of the primary light beam at an incident direction and reflect the portion of the primary light beam at an angle relative to the incident direction.

In some implementations, the lighting device includes a reflective surface facing the housing interior. The reflective surface may be or include a diffusively reflective surface, a Lambertian surface, and/or a specularly reflective surface. The reflective surface may be or include a reflective paint, a metal, a metal-inclusive compound, a metal-inclusive alloy, a ceramic, a glass, or a plurality of reflective nanofibers.

In some implementations, the light converter includes a reflective substrate and the luminescent material is supported by the substrate. The substrate may have a reflectivity of greater than 80% for light of wavelengths ranging from about 380 to 760 nm. Alternatively, the substrate may have a reflectivity of 80% or less for light of wavelengths in this range.

In various implementations, the luminescent material includes a red emitter, an orange emitter, a yellow emitter, a green emitter, a blue emitter, or combinations of two or more of the foregoing.

In various implementations, the light source may be a blue light source, a violet light source, an ultraviolet light source, or a white light source.

According to another implementation, a method is provided for tuning a color of light outputted from a lighting device. A primary light beam of a primary wavelength is emitted through a housing interior of a housing of the lighting device such that at least a portion of the primary light beam is incident on a luminescent material. A secondary light is emitted from the luminescent material through the housing interior, in response to excitation by the primary light beam, wherein the secondary light is emitted at one or more wavelengths different from the primary wavelength. An output light is outputted from a light exit of the housing, wherein the output light comprises a combination of primary light and emitted secondary light. A position of the primary light beam relative to the luminescent material is adjusted to tune the output light to a desired color.

In some implementations, the output light is outputted at a color rendering index of 50 or greater. In some implementations, the primary light beam is emitted from a white light source, and the output light is outputted at a color rendering index higher than the color rendering index of the white light source. In some implementations, the output light has a correlated color temperature ranging from 2,500 to 5,500 K. In some implementations, the emitted primary light is white light and the output light is white light having a correlated color temperature different from the emitted primary light.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

FIG. 5 is a set of data indicating spectral radiant flux as a function of wavelength for several different orientations of two luminescent materials of a prototype lighting device.

FIG. 14 is a set of plots of spectral radiant flux as a function of wavelength for three different axial distances between a light source and a luminescent material.

FIG. 20A is a side view of another example of a lighting device according to the present teachings.

FIG. 20B is a perspective view of an elongated version of the lighting device illustrated in FIG. 20A.

FIG. 25A is a schematic view of an example of a luminescent fiber according to the present teachings.

FIG. 25B is a schematic view of another example of a luminescent fiber according to the present teachings.

DETAILED DESCRIPTION

Figure 1A:
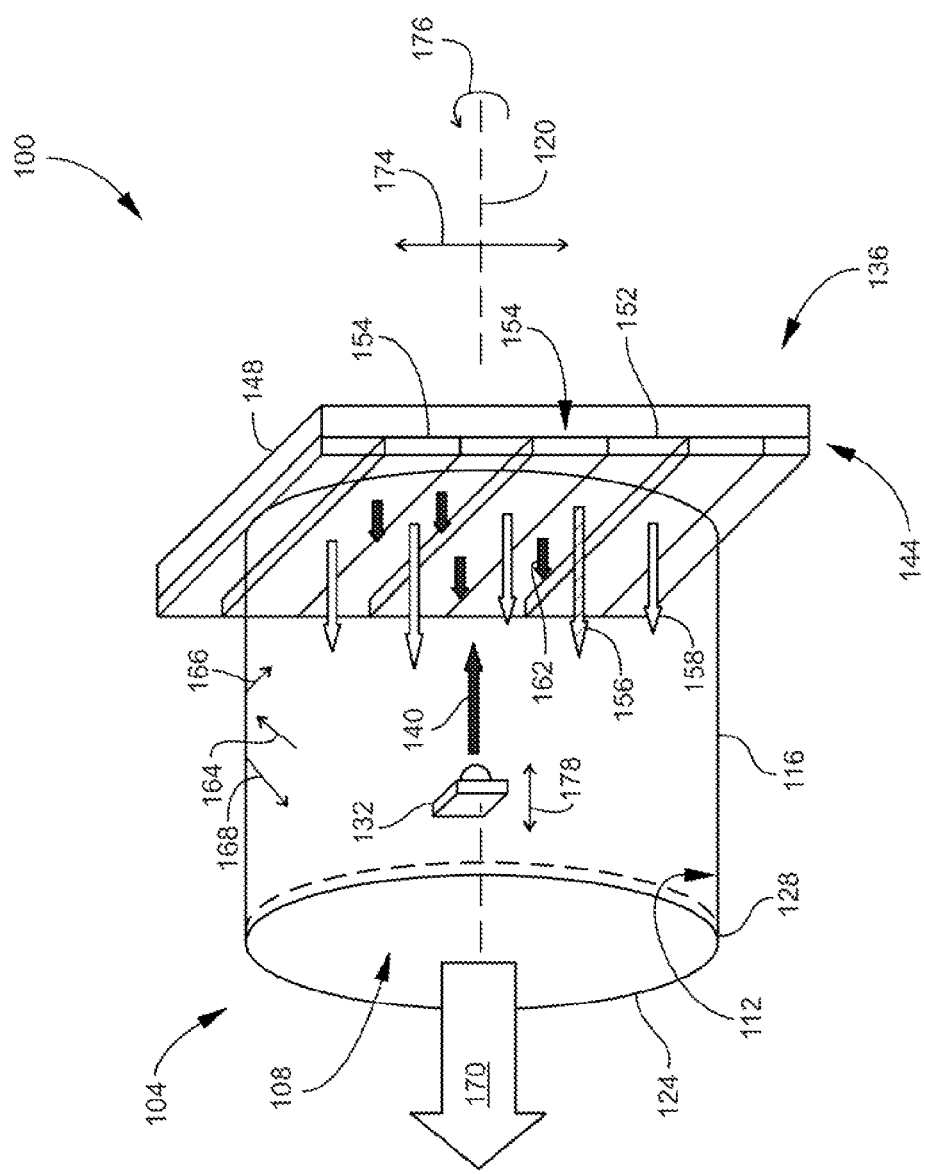
FIG. 1A is a perspective view of an example of a lighting device according to the present teachings.

As used herein, the term "nanofiber" refers to a typically solid structure that has one dimension (e.g., diameter) in the 10-2000 nm range, while the other dimension (e.g., length) may be quite long such as on the order of meters. Nanofibers may be made from a variety of materials, including polymers, ceramics, glasses, and sol gels, and blends of materials may also be readily fabricated. One feature of nanofibers is their small diameter relative to their length and consequently high surface area and aspect ratio (length:diameter). Nanofiber diameters on the order of visible light (about 380-760 nm) or even smaller may be readily produced, thereby creating very large surface areas.

As used herein, the term "luminescent particle" or "light-stimulable particle" refers generally to any photoluminescent (PL) particle. In typical implementations, the luminescent particles are capable of forming a composite with a suitable substrate, which may be amorphous, (poly)crystalline, or fibrous. As examples, the luminescent particles may be provided as one or more layers or regions on the substrate, as a distribution embedded in the substrate, as an interpenetrating network in the substrate, or as a distribution supported on or in fibers of the substrate. Examples of luminescent particles include quantum dots, phosphors, nano-phosphors, and organic dyes. While some luminescent particles may exhibit luminescent behavior by other mechanisms (e.g., electroluminescence), typical implementations taught herein rely principally on the photoluminescent response of particles. Accordingly, for convenience the terms "luminescent" and "PL" will be used interchangeably in the present disclosure in the context of particles or related materials that exhibit photoluminescence, without intending to exclude other types of luminescent activity.

As used herein, the term "quantum confined semiconductor particle" or "quantum dot" (QD) refers to a semiconductor nanocrystal-based material in which excitons are confined in all three spatial dimensions, as distinguished from quantum wires (quantum confinement in only two dimensions), quantum wells (quantum confinement in only one dimension), and bulk semiconductors (unconfined). A quantum dot may generally be characterized as a particle, the shape of which may be spherical, cylindrical, ellipsoidal, polygonal, or other shape. The "size" or "particle size" of the quantum dot may refer to a dimension characteristic of its shape or an approximation of its shape, and thus may be a diameter, a major axis, a predominant length, etc. The size of a quantum dot is on the order of nanometers, generally ranging from 1-1000 nm, but more typically ranging from 1-100 nm, 1-50 nm, 1-20 nm, or 1-10 nm. In a plurality or ensemble of quantum dots, the quantum dots may be characterized as having an average size. The size distribution of a plurality of quantum dots may or may not be monodisperse, but in some implementations may preferably be monodisperse through controlled synthesis so as to provide consistent light emission. The quantum dot may have a core-shell configuration, in which the nanocrystalline core and surrounding shell may have distinct compositions. The shell is typically an inorganic compound with a higher band gap than the core material. The shell may serve a function such as, for example, chemically stabilizing the core, isolating the core from the environment, etc. The optical properties of core-shell quantum dots are typically determined by their core. The quantum dot may also be capped with ligands attached to its outer surface (core or shell) or may otherwise be functionalized with certain chemical moieties for a specific purpose, such as providing compatibility with a solvent, serving as a surfactant to promote solution and prevent agglomeration, etc. Agglomeration may be disadvantageous for a number of reasons, including altering the emission characteristics to a degree noticeable by the human eye.

Quantum dots are advantageous because they function at temperatures that do not require an associated lighting device to provide temperature controlling means. Moreover, quantum dots may be produced utilizing relatively low-cost and easily implemented processing techniques, as known examples of solution-processed colloidal quantum dots. Furthermore, the quantum confinement results in many optical, electrical and chemical properties of the quantum dot (e.g., band gap) being strongly dependent on its size, and hence such properties may be modified or tuned by controlling the size of the quantum dot during synthesis. For example, two quantum dots having the same composition but different sizes may respectively emit photons at different wavelengths in response to the same stimulus. Generally, for many quantum dot compositions smaller sizes emit radiation at shorter wavelengths and larger sizes emit radiation at longer wavelengths. Some properties may also depend on the shape of the quantum dot. Accordingly, a combination of different quantum dots (different as to composition, size and/or shape) may be provided in a PL material to provide secondary light emission at two or more different wavelengths. Different quantum dots may be distributed as a mixture or may be partitioned into separate regions or zones on or in a substrate. Partitioning may be preferable for preventing absorption by one type of quantum dot of a photon emitted by another type of quantum dot, and/or for facilitating the color tuning techniques described below.

As used herein, the term "phosphor" refers to a luminescent particle typically composed of an inorganic host material (e.g., aluminum garnet, metal oxides, metal nitrides, metal oxynitrides, metal sulfides, metal selenides, metal halides, or metal silicates) that includes an activator (e.g., copper, silver, europium, cerium or other rare earth metals). Typically, the activator is added as a dopant. Within the host material, the activators function as centers of luminescent emission. Typically, the size of a phosphor particle is 1 μm or greater. The term "nano-phosphor" refers to a phosphor having a particle size of 100 nm or less. Nano-phosphors often have similar chemistries as the larger-size phosphors but scatter light to a lesser degree due to their smaller size. As nano-particles, nano-phosphors may have various attributes similar to those of quantum dots.

As used herein, the term "reflective" means that a given material (whether a surface or a bulk region of the material) reflects greater than 80% of incident light of a given wavelength or wavelengths. The term "transparent" or "light-transmitting" means that a given material is able to efficiently pass greater than 50% of incident light of a given wavelength or wavelengths. Unless specified otherwise, the term "transparent" or "light-transmitting" encompasses the terms "partially transparent" and "translucent."

For purposes of the present disclosure, the spectral ranges or bands of electromagnetic radiation are generally taken as follows, with the understanding that adjacent spectral ranges or bands may be considered to overlap with each other to some degree: Ultraviolet (UV) radiation spans the range of about 10-400 nm, although in practical applications (above vacuum) the range is about 200-400 nm. Visible radiation spans the range of about 380-760 nm. Violet radiation spans the range of about 400-450 nm. Blue radiation spans the range of about 450-490 nm. Green radiation spans the range of about 490-560 nm. Yellow radiation spans the range of about 560-590 nm. Orange radiation spans the range of about 590-635 nm. Red radiation spans the range of about 635-700 nm.

In the present context, the term "color" refers to the appearance of emitted light as perceived by the human eye. Color may be described by a measurable property (or "color parameter") of the light such as, for example, color rendering index (CRI), correlated color temperature (CCT), chromaticity coordinates (x, y), (u, v) or (u', v'), and distance from Planckian locus ($D_{uv}$), as may be defined by CIE (International Commission on Illumination) standards. The CRI is a measure of the ability of a white light source to faithfully reproduce the color appearance of objects in comparison to a reference light source such as a black-body radiator or daylight. The general color rendering index adopted by CIE, designated $R_a$, is typically utilized. The CRI of an ideal reference source having a balanced spectral power distribution (SPD) is defined as 100. Hence, high CRI values are desirable for actual light sources, for example greater than 80 for interior lighting. The color temperature of a light source emitting light of a given hue corresponds to the temperature (in degrees Kelvin) of an ideal black-body radiator emitting light of a comparable hue. However, black-body radiators emit light by thermal radiation while light sources such as SSL lamps primarily emit light by non-thermal mechanisms. Therefore, for these types of light sources a correlated value (CCT) is utilized as an approximation. Higher color temperatures (5,000K and above) are termed "cool" colors and appear bluish, while lower color temperatures (2,700-3,000K) are termed "warm" colors and appear yellowish to reddish. Intermediate color temperatures may be termed "neutral" colors. Warmer colors are often utilized for illuminating public areas to promote relaxation, while cooler colors are often utilized in office areas to promote concentration. All color temperatures visible to the average human eye (i.e., the gamut of human vision) may be shown, in color, in the color space of the CIE 1931 (x, y) chromaticity diagram (see, e.g., FIG. 19), the CIE 1960 (u, v) uniform chromaticity space (UCS) diagram, or the CIE 1976 (u', v') uniform chromaticity scale (UCS) diagram. Except for brightness, a color may be described by its chromaticity, i.e., its x-y or u-v coordinate position on a chromaticity diagram. A chromaticity diagram may also show the Planckian locus, which is the path taken through the color space by a black-body radiator as its temperature changes. In a direction from lower to higher color temperature, the Planckian locus runs from deep red through orange, yellowish white and white, to bluish white. The distance of a color's coordinate position from the Planckian locus may be utilized to calculate CRI and CCT. The CIE (u, v) or (u', v') diagram is typically utilized to calculate distance from the Planckian locus. CIE (x, y) coordinates may be converted to CIE (u, v) or (u', v'), coordinates utilizing known transformations.

As described by way of examples below, lighting devices (i.e., luminaires or light fixtures) are provided that are capable of adjusting or tuning the color of the light they produce. In addition, devices and methods are provided for adjusting or tuning the color of light outputted from a lighting device. A color tuning device may also be referred to as a "light adjusting device." Light outputted from a lighting device will be referred to as "output light." The color tuning techniques disclosed herein may be utilized to adjust the color of the output light by adjusting values of one or more color parameters such as, for example, spectral power distribution (SPD), CRI, CCT, chromaticity coordinates, and distance from Plankian locus. Color tuning may be done for any purpose. As examples, an end user may desire to adjust the output of a single lighting device (e.g., to render white light warmer, cooler, or more neutral) or, in the case of a set of lighting devices, to adjust the output of one or more of the lighting devices to achieve a consistent appearance from the lighting devices. As another example, a manufacturer may desire to adjust one or more lighting devices at the end of the manufacturing line (EOL) to reduce or eliminate any variability in light output from a batch of manufactured lighting devices.

In some implementations taught in the present disclosure, a lighting device includes one or more primary light sources, one or more light converters (or "secondary converters"), a housing, and one or more devices or means for tuning the color of the output light. The color tuning device may include a mechanical attribute that causes movement of one or more components of the lighting device. Examples of color tuning devices are described below. The lighting device may also include one or more reflective materials (or reflectors).

The primary light source may be any suitable light source for generating a beam of primary light (or excitation light, or pump light) and directing the beam through an interior of the housing toward the light converter. In this context, primary light is electromagnetic radiation propagating at any desired wavelength (visible or non-visible) that is sufficient to induce emission from the light converter of electromagnetic radiation at one or more wavelengths different from the primary (or excitation, or pump) wavelength and within the visible spectrum. This type of emission will be referred to as secondary light or secondary emission. In typical implementations, the primary light source is configured for emitting radiation of relatively short wavelengths such as UV, violet or blue. No specific limitation is placed on the type of primary light source, although in typical examples the primary light source is an electroluminescent (EL) device such as a laser diode (LD) or more typically a light-emitting diode (LED). In the context of lighting applications, an EL device may be referred to as a solid-state lighting (SSL) lamp or SSL device. An LED (or other EL device) may be based on a conventional system of inorganic semiconductor materials such as Group III (In, Al, Ga) nitrides, or may be an organic LED (OLED), a polymer LED (PLED), or a hybrid design utilizing both inorganic and organic components.

The light converter may be any luminescent material, or any structure that includes a luminescent material, capable of emitting secondary light in response to excitation by the incident primary light beam. As noted above, the luminescent material is typically a photoluminescent (PL) material. Typically, emission of secondary light from a PL material occurs through the mechanism of fluorescence. Depending on the type of PL material utilized, the secondary wavelength may be shorter or longer than the primary wavelength. Typically, the PL material is configured to emit a longer wavelength as short-wavelength light sources are readily available and shorter-to-longer wavelength conversions tend to be more efficient. The PL material may include two or more different types of PL materials configured to emit secondary light at two or more respective wavelengths in response to excitation by the incident primary light beam. For example, the PL material may include both red-emitting and green-emitting PL materials, which in some implementations may be utilized in conjunction with a blue, violet or UV light source to produce white light. In some implementations, the PL material includes a plurality of luminescent (or light-stimulable) particles supported by a substrate. In this context, "supported by" means that the luminescent particles are encapsulated or embedded in the substrate and/or disposed on the substrate in a stable manner. The luminescent particles may be QDs, phosphors, nano-phosphors, organic dyes, or a combination of two of more of the foregoing. Color parameters such as CCT may be controlled by controlling the quantity of luminescent particles over a unit area of the PL material (i.e., density), the thickness of a layer of luminescent particles, the composition of the luminescent particles, etc. Different types of luminescent particles may be utilized simultaneously. As one example, a PL material may include one or more sections of green-emitting phosphors and one or more sections of red-emitting QDs. Different sections of different PL materials may be spatially separated from each other to limit secondary absorption. Additionally, the light converter may include a reflective material, examples of which are described below.

In various implementations, the light converter may be positioned remotely from the light source. By this configuration, luminescence occurs over a large surface area resulting in improved uniformity in color, and thermal degradation by heat generated from the light source is reduced or eliminated. The light converter may be rigid or flexible.

The substrate of the PL material may be selected based on its light-transmission and/or light-reflection properties. Examples of substrates include, but are not limited to, various polymers, ceramics, glasses, and natural and synthetic papers such as PolyArt® papers or other types of cellulosic materials. Light reflection may be imparted to certain types of substrates by introducing features with dimensions on the order to the wavelength of light. Such features, typically 100 nm to 800 nm in size, promote scattering of a light beam thereby increasing the reflection coefficient. Examples include etched glasses and polymers. In some implementations, the PL material is a photoluminescent nanofiber (PLN) structure that includes one or more types of luminescent particles supported on a substrate formed from nanofibers (e.g., a nonwoven mat), as described in more detail below.

The housing generally may be any structure suitable for containing visible electromagnetic radiation during optical processing of the radiation by the lighting device and prior to output of the radiation from the lighting device. In particular, the housing may be any structure that provides an interior or cavity suitable for mixing (or combining) primary light components and secondary light components, and a light exit or aperture through which the mixed (or composite) light emanates to the ambient environment outside the lighting device. Additionally, the housing may serve as a structure for mounting or supporting one or more other components of the lighting device. The light exit may be an uncovered opening or may include a light-transmitting structure that spans the opening. The light-transmitting structure may serve to protect components residing in the housing interior from the ambient environment. Additionally, the light-transmitting structure may be or include an optical component configured to perform an optical processing function on the output light, such as promoting the mixing or diffusion of the primary and second light components, focusing the output light as a beam (e.g., a lens). It will be noted that lighting devices as taught herein do not require color filters.

A reflective material may be mounted in a suitable location in the housing interior or may be integrated with the housing. For example, the reflective material may line an inside surface of the housing that bounds all or a portion of the housing interior. The reflective material may be a structure that is inherently reflective throughout its bulk, or may be a reflective surface or outer region of a structure, or may be a reflective coating applied to a structure. The reflective material may be a specular reflector such as, for example, a layer or silver (Ag) or aluminum (Al). The reflective material may alternatively be a diffuse reflector such as, for example, a white paint or ink, a non-woven fabric, or a non-woven fabric to which a white paint or ink has been applied. In some implementations, the reflective material is a non-woven mat or substrate formed from a plurality of nanofibers and is highly diffusive. The nanofiber substrate may be the same type of structure as the above-noted substrate utilized to create a PL material. A nanofiber substrate or other type of diffuse reflector may perform as a Lambertian reflector, whereby the brightness of the light scattered from the surface appears to an observer to be the same regardless of the observer's angle of view relative to the surface.

The color of the output light produced by the lighting device depends on the composition of the wavelengths at which the output light is emitted from the light exit of the lighting device. The wavelength composition in turn depends on the wavelengths of light respectively emitted by the light source and the light converter as well as on how the various paths of light components are manipulated or processed (e.g., modulated, reflected, steered, combined, etc.) within the housing interior. The output light may fall primarily within a wavelength band associated with a particular color, or may be a broad-spectrum white light. The lighting device in some implementations produces white light having a CRI of greater than 70, while in other implementations produces white light having a CRI of greater than 80 or greater than 90. These high CRI values may be achieved with the use of either a short-wavelength light source (e.g., UV, violet, or blue) or a white light source (e.g., a white LED) in combination with PL materials emitting secondary light of selected wavelengths. When a white LED is utilized as the light source, the lighting device is able to significantly improve the CRI of the white LED, in some implementations by as much as 35%. In one example, the CRI value of a white LED is raised from 67 to 90, representing a significant improvement in color rendering properties of the light source. In various implementations, the output light has a CCT ranging from 2,500 to 5,500 K, and the output light of the lighting device may be tunable over this range.

FIG. 1A is a perspective view of an example of a lighting device 100 according to the present teachings. The lighting device 100 includes a housing 104 surrounding a housing interior 108 and a reflective surface 112 disposed in the housing interior 108. In the present example, the housing 104 includes a substrate 116 and the reflective surface 112 is disposed on the substrate 116 whereby the housing interior 108 serves as a reflective cavity. The housing substrate 116 may have any suitable composition. In the present example, the housing substrate 116 is a polymer such as polyvinyl chloride (PVC). Also in the present example, the reflective surface 112 is a diffusive reflective surface and may perform as a Lambertian reflector for the wavelengths at which light components propagate in the housing interior 108. In one specific example, the reflective surface 112 is implemented as one or more layers of highly diffusive nanofibers as described further below. Alternatively, the reflective surface 112 may be substantially specular. Generally, the housing 104 (or at least its inside surface) and the reflective surface 112 may have any shape, but advantageously have a shape that promotes distribution and reflection of light components. In the present example, the housing 104 has an axial configuration by which at least the inside surface of the housing 104 is coaxial and symmetrical with a central axis 120. For instance, the housing 104 or its inside surface may be cylindrical. As one example, this type of configuration may be useful when implementing the lighting device 100 as a downlight device that is recessed into a ceiling structure or other structure. The housing 104 includes a light exit 124 at one axial end. The housing 104 includes a light exit 124 at one axial end. The light exit 124 may be covered with a light-transmitting structure 128 as noted above.

The lighting device 100 further includes a primary light source 132 and a light converter 136. In FIG. 1A, the primary light source 132 also schematically represents circuitry or means provided for powering and controlling the type of light source 132 utilized. For simplicity, the source of electrical power (e.g., a line voltage connection) and associated wiring to the light source 132 are not shown. In some implementations, the light source 132 is an LED. For example, the light source 132 may be a high-brightness LED such as one from the XLamp® XR-E series commercially available from Cree, Inc., Durham, N.C. The light source 132 is configured to generate and emit a primary light beam at a primary wavelength $\lambda_{em}$ which in FIG. 1A is schematically represented by an arrow 140. The lighting device circuitry may be configured to enable adjustment of the drive current to the light source 132 and thus adjustment of the intensity of the primary light beam 140. However, as will become evident below the lighting device 100 is able to effect color tuning without the need for varying drive current. For purposes of description, the light source 132 and its light beam 140 may be characterized as lying on a nominal output axis of the light source 132. The nominal output axis is generally an axis projecting from the optical output side of the light source 132 directly to the light converter 136 in a straight line, and depicts the general or resultant direction in which the primary light beam 140 is aimed toward the light converter 136. This output axis is "nominal" in the sense that the primary light beam 140 is not necessarily so coherent as to be constrained to the immediate vicinity of the output axis. Instead, in typical implementations the primary light beam 140 has a relatively wide angle of divergence (e.g., cone-shaped). Depending on the scale of the lighting device 100 and the axial distance between the light source 132 and the light converter 136, a portion of the primary light beam 140 may be directly incident on the reflective surface 112 instead of the light converter 136.

Hence, the angular emission of the light source 132 may play a significant role in the performance of the lighting device 100.

Figure 2:
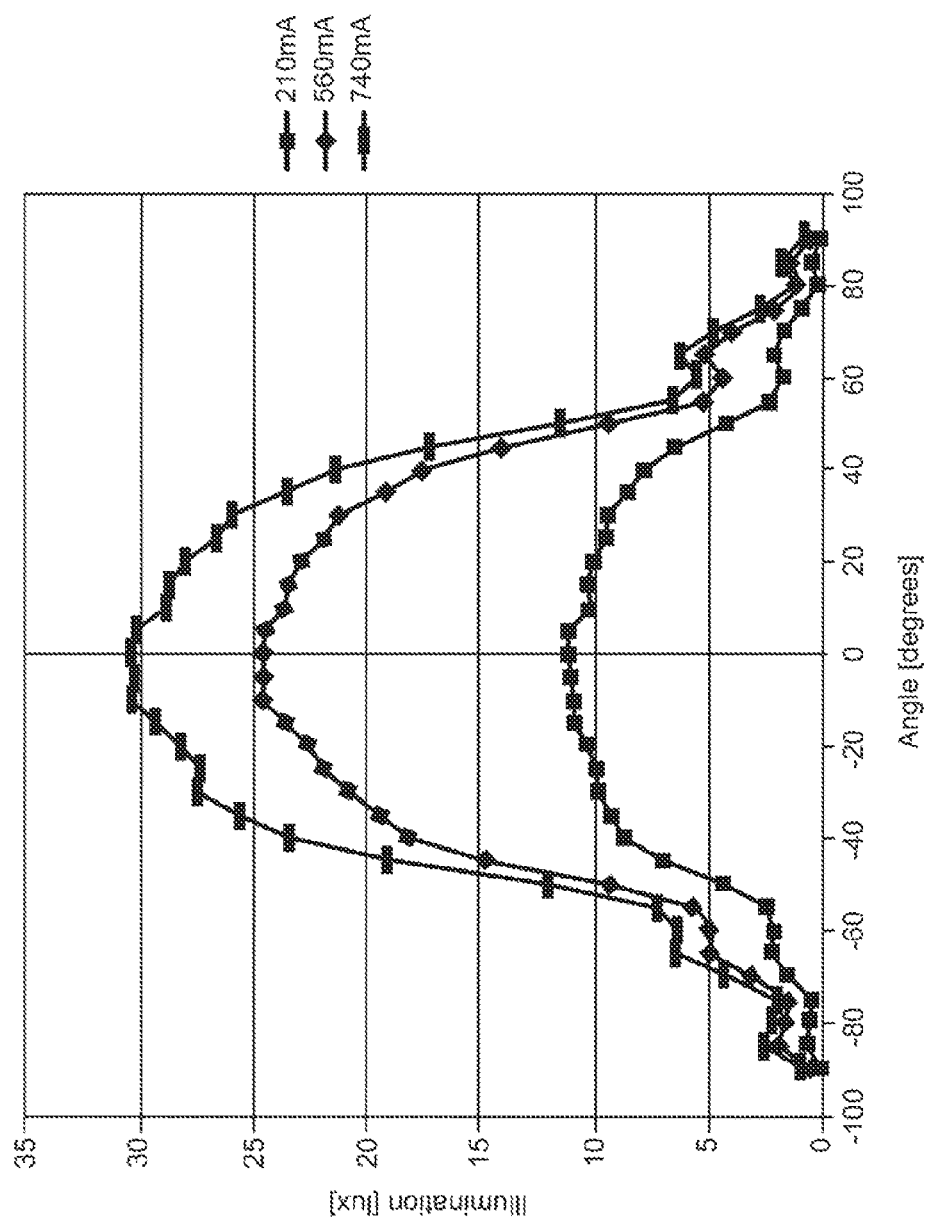
FIG. 2 is a set of angular emission profiles produced by an LED in which illumination intensity is plotted as a function of angle from the nominal output axis, for three different LED drive currents.

FIG. 2 is a set of angular emission profiles produced by an LED in which illumination intensity (measured in units of lux, or lumens per square meter where 1 lx=1 lm/m$^2$) is plotted as a function of angle (degrees) from the nominal output axis, for three different LED drive currents (210 mA, 560 mA, and 740 mA). The LED in this example is an XREROY model available from Cree, Inc. that emits royal blue light. FIG. 2 shows that an LED may have significant emissions at large angles. Wide-angle emission may result, for example, from surface roughening techniques utilized to increase the light extraction efficiency of the LED.

While in FIG. 1A the nominal output axis is collinear with the central axis 120 of the housing interior 108, this configuration is illustrated by example only. The light source 132 may be mounted such that the nominal output axis is offset from the central axis 120 by a radial distance (orthogonal to the nominal output axis). Moreover, the nominal output axis may not be parallel with the central axis 120 and instead may be at an angle to the central axis 120. The light source 132 may be mounted or suspended in the housing interior 108 and aimed at the light converter 136 by any suitable means. In the present example, the light source 132 is axially interposed between the light exit 124 and the light converter 136. Alternatively, the light source 132 may be axially located at the light exit 124. In implementations where a light-transmitting structure 128 is provided at the light exit 124, the light source 132 may be supported by the light-transmitting structure 128. In other alternatives, the light source 132 may be located outside the housing interior 108 or mounted to the housing substrate 116. More generally, the light source 132 is located so as to direct the primary light beam 140 through the housing interior 108 and toward the light converter 136.

In the illustrated example, the light converter 136 is mounted at the opposite axial end of the housing 104. Alternatively, the light converter 136 may be mounted within the housing interior 108, in which case the opposite axial end may be covered by a reflective surface. The light converter 136 includes a PL material 144 facing the housing interior 108. Depending on its design, the PL material 144 may be supported on or embedded in a suitable substrate to form one or more layers of PL material 144. The light converter 136 may also include an additional substrate or structure 148 on which the PL material 144 is disposed or mounted. The structure 148 may serve as a base or frame for the PL material 144, and may be configured to render the light converter 136 removable from the lighting device 100 such that the light converter 136 can be replaced with another light converter of the same or different configuration of PL materials 144. The structure 148 may also be part of a color tuning device (described below) that supports movement of the PL material 144 relative to the light source 132. The substrate of the PL material 144 and/or the structure 148 (if provided) may be reflective. In advantageous implementations, the substrate of the PL material 144 and/or the structure 148 may be diffusively reflective to an appreciable degree so as to promote distribution and mixing of primary light and secondary light in the housing interior 108. Alternatively, particularly in implementations in which the light converter 136 is mounted within the housing interior 108, the substrate of the PL material 144 and/or the structure 148 may be at least partially light-transmitting, in which case some components of primary light and secondary light may be emitted from the back side of the light converter 136 and reflected by a reflector (not shown) located at the axial end. Moreover, the PL material 144 may span the entire cross-section of the axial end of the housing 104 as shown in FIG. 1A, or alternatively may span only a portion of the cross-section, in which case some of the primary light emitted from the light source 132 may bypass the PL material 144 and be reflected from a reflective surface in the housing interior 108.

In the illustrated example, the light converter 136 includes a combination of two different types of PL materials 144, i.e., a first PL material 152 and a second PL material 154, which emit secondary light at two respective wavelengths $\lambda_1$ and $\lambda_2$ as schematically represented by respective arrows 156, 158 in FIG. 1A. The different PL materials 152, 154 may be arranged in a desired pattern. FIG. 1A illustrates one alternative in which the respective PL materials 152, 154 are arranged in an alternating series of horizontally oriented stripes (the horizontal orientation being merely an example, and merely a consequence of the perspective of FIG. 1A). Some of the primary light incident on the PL materials 152, 154 may not excite a fluorescent or wavelength-shifting response (i.e., not cause re-emission at a different wavelength) and instead is reflected back from the light converter 136. This "unconverted" primary light is schematically represented by other arrows 162 in FIG. 1A.

In operation, activation of the lighting device 100 entails providing power to the light source 132 to energize its light-emitting components. In response, the light source 132 generates the primary light beam 140, which is directed generally toward the light converter 136. A portion of the primary light beam 140 is directly incident on the PL materials 152, 154, i.e., reaches the PL materials 152, 154 without first encountering any other component in the housing interior 108. Another portion of the primary light beam 140 may be directly incident on the reflective surface 112, as schematically represented by an arrow 164 in FIG. 1A. Depending on the diffusivity of the reflective surface 112, some of the primary light striking the reflective surface 112 may then be reflected toward the PL materials 152, 154 as schematically represented by an arrow 166, while another portion of the primary light striking the reflective surface 112 may be reflected toward the light exit 124 as schematically represented by another arrow 168. As regards the primary light striking the PL materials 152, 154, whether directly from the light source 132 (e.g., arrow 140) or as a result of reflection from the reflective surface 112 (e.g., arrow 166), a portion of this incident primary light (140, 166) is converted to secondary light 156, 158 while another portion remains unconverted (162). Components of the unconverted primary light 162 reflected from the PL materials 152, 154, the primary light 166, 168 reflected from the reflective surface 112 without having first struck the PL materials 152, 154, and the secondary light 156, 158 generated by photoluminescence may propagate in different directions through the housing interior 108 and may be reflected one or more times by the reflective surface 112. A mixture of these components passes through the light exit 124 as output light, as schematically represented by a large arrow 170. The output light 170 comprises an ensemble of the primary and secondary wavelengths of electromagnetic radiation ($\lambda_{em}+\lambda_1+\lambda_2$), and this composition of wavelengths determines the perceived color of the output light 170. The lighting device 100 is structured such that the optical mixing of the different light components ($\lambda_{em}+\lambda_1+\lambda_2$) is sufficient to produce output light 170 of a desired color having a highly uniform appearance.

As one non-limiting example, the light source 132 may be a short-wavelength emitter such as a blue emitter (e.g., $\lambda_{em}$~450 nm), the first PL material 152 may be an intermediate-wavelength emitter such as a green emitter, and the second PL material 154 may be a longer-wavelength emitter such as a red (or red-orange, or orange) emitter. This configuration results in the output light 170 being white (i.e., broadband visible light). In another example, the light source 132 may be a cool white emitter (typically a phosphor-converted "white" LED) and the PL material 144 may be a red emitter. This configuration results in the output light 170 being warm white. In other implementations, the light converter 136 may include more than two different types of PL materials 144 (e.g., red, orange and green emitters). The light converter 136 may also include regions in which the PL materials 144 are absent but which reflect the incident primary light—in effect, the reflective regions add another emitter corresponding to the primary light wavelength (e.g., a blue emitter in the case where a blue light source 132 is utilized). As another example, the light source 132 may be a UV emitter (e.g., $\lambda_{em}$~350-370 nm) or a violet emitter (e.g., $\lambda_{em}$~408 nm), the first PL material 152 may be a green or yellow emitter, the second PL material 154 may be a red or orange emitter, and a third PL material (not shown) may be a blue emitter, resulting in white output light 170.

The provision of more than one type of PL material 144 is useful in conjunction with a number of the color tuning modes described below. However, the provision of only one type of PL material 144 may be useful for certain color tuning modes, such as for example adjusting the axial distance between the light source 132 and the PL material 144. For instance, the light source 132 may be a blue emitter and the PL material 144 may be a yellow emitter. In this case, the PL material 144 shifts the blue light to yellow light and results in white output light 170, and the blueness of the white color may be tuned by adjusting this axial distance, as described further below. In other examples, a blue or cool white emitter may be utilized in conjunction with a single type of long-wavelength emitting (e.g., red) PL material 144.

Testing of prototypes of the lighting device 100 illustrated in FIG. 1A with a two-inch diameter light exit 124 has demonstrated a fixture efficiency of typically 0.74 when either white or blue LED sources were utilized. Fixture efficiency is defined as the luminous output of the device divided by the luminous output of the LED lamp by itself. The efficiency is expected to increase upon further refinement of the design, such as by eliminating light leakages at the junction of the light converter 136 and the housing 104. More generally, the design of the lighting device 100 enables a great amount of flexibility in the selection of the light source 132, the PL materials 144, and other fabrication parameters.

In some implementations, the PL materials 144 are added to a surface (such as a substrate, or the structure 148 shown in FIG. 1A) as a solution or ink that includes luminescent and/or reflective particles and one or more appropriate solvents. In the present context, for convenience the term "deposited" represents any technique for adding particles, whether by material transport (e.g., printing, coating via an an applicator or dispenser instrument, etc.), immersion, self-assembly, etc. Depending on the types of particles to be deposited, the solvents may be organic or inorganic and may be polar or non-polar. The solution may also include any additives deemed appropriate or necessary, such as particle dispersants, surfactants, viscosifiers, agents that inhibit agglomeration or slumping, agents that control solution rheology, agents that promote adhesion to the target surface receiving the solution, agents that control wetting properties, agents that control the resolution of the pattern of the particles applied to the target surface, agents that facilitate the use of a particular dispensing device utilized to apply the solution to the target surface, and/or agents that control any other property of the solution deemed important. As a few specific but non-limiting examples, the additive BYK®-411 commercially available from BYK-Chemie GmbH, Germany may be added as a surfactant, and the alkyd Beckosol® 11-035 commercially available from Riechhold Inc., Durham, N.C. may be added as a dispersant. After deposition, the solution may be cured to form a stable, permanent layer of particles. Curing may be carried out in any manner suitable for the composition of the particles being deposited, such as, for example, air drying, heating, UV-curing, etc. Curing may entail the evaporation of excess volatile components, which may be assisted by vacuum.

Any dispensing technique suitable for the type of luminescent or reflective material, and which is non-destructive of the underlying component, may be utilized. Preferably, the dispensing technique is one that deposits particles uniformly on the underlying component. One or more of the additives noted above may also ensure uniform deposition. Examples of dispensing techniques include, but are not limited to, printing techniques, wet coating techniques, and dry coating techniques. Examples of printing techniques include, but are not limited to, ink-jet printing, digital printing, screen printing, thermal printing, transfer printing, etc. Examples of wet coating techniques include, but are not limited to, spray coating, dip coating, drop coating, spin coating, electrospray coating, doctor blading, deposition of Langmuir-Blodgett film, self-assembly of monolayers (SAMs) from liquid or vapor phase, etc. Examples of dry coating techniques include, but are not limited to, aerosol dry coating. Non-immersion techniques may utilize a suitable solution or ink dispensing apparatus (i.e., a dispenser or applicator) that may be manipulated manually or in an automated manner. Examples of dispensers include, but are not limited to, a syringe, a capillary, a printing pen, a printing pad or stamp, an ink jet printing head, a spray nozzle, an electrospray needle, devices utilized in microfluidics, micro-total analysis, labs-on-a-chip, etc.

In some implementations, a coating that is or includes a surface treatment (or surface modifier) chemistry (a "surface treatment coating") may be applied to the target surface before depositing one or more layers of luminescent or reflective materials. The surface treatment coating may have a composition selected to control and improve adhesion, control wetting properties, and/or control pattern resolution (i.e., the pattern in which the particles are deposited on the underlying surface, as opposed to a pattern of sections of different types of particles). Examples of suitable surface treatment coatings include, but are not limited to, polyacrylates and polymers that can be deposited via chemical vapor deposition (CVD). In the case of a photoluminescent nanofiber (PLN) substrate, coatings that are optically transparent and do not expose the nanofibers to aggressive solvents that degrade the polymer fibers are acceptable. In more specific examples, poly(methyl methacrylate) (PMMA) and poly (lauryl methacrylate) (PLMA) have been found to be particularly suitable. The surface treatment coating may be deposited by any suitable technique. One or more of the deposition techniques noted above in conjunction with particle deposition may be suitable. The surface treatment coating may be deposited as a solution containing the component possessing the surface treating or modifying function (e.g., polyacrylates) and one or more suitable solvents such as, for example, toluene, hexane, etc. Non-fluorescent filler particles such as $TiO_2$, $SiO_2$, $Al_2O_3$ $CaCO_3$, bentonite and other clays may be utilized to increase the light reflectance and overall intensity of the PLN and control the degree of hide of the phosphor coating.

In some implementations, an ink jet printer is utilized to deposit a solution of luminescent or reflective material on a target substrate or other component. One example of a suitable ink jet printer is the Dimatix Materials Printer DMP-2800 commercially available from FUJIFILM Dimatix, Inc., Santa Clara, Calif. The ink-jet printer may include a frame at which the target substrate is mounted, a piezoelectric-driven ink jet printhead, and an assembly of mechanical and motorized components configured to move the printhead in a controlled manner along one, two or three axes. The target substrate may be mounted on a platen (not shown) of the frame that is rotatable in a controlled manner. Either the frame or the printhead may allow adjustment of the vertical distance between the printhead and the target substrate. The printhead may include a reservoir for the particle solution and a bank of nozzles. The printhead is configured to form a layer or section of luminescent or reflective material of an accurately controlled size and shape. If desired, two or more sections of luminescent or reflective materials may be formed in any desired pattern. The particle solution may have a desired concentration of particles in the solvent (e.g., in the mg/ml range, such as 40 or 80 mg/ml). Various deposition (printing) parameters may be controlled such as number of jets firing, drop firing velocity (e.g., in the m/s range, such as 7 or 9 m/s, drop firing waveform (e.g., in the Hz range, such as 5 Hz), drop space (e.g., in the micron range, such as 25 μm), and drop size (e.g., in the picoliter range), etc.

In addition, the resolution at which the particle solution is printed and the deposition (printing) pattern may be controlled. Generally, particle solutions may be deposited in precisely metered aliquots or volumes, which may be characterized as deposition units. Each deposition unit may have a characteristic dimension (e.g., diameter, length, width, etc.) on the order of millimeters, microns, or fractions of an inch, and thus may contain a large quantity of particles. Moreover, the periodicity of or spacing between neighboring deposition units may also be controlled by controlling one or more of the above-noted deposition parameters, and may also be on the order of millimeters, microns, or fractions of an inch. The deposition units may have any shape such as, for example, stripes, lines, circles, dots, ellipses, diamonds, other polygons, etc. As an example, the diameter or other characteristic dimension of the deposition unit may be 0.05 or 0.10 inch and the spacing between adjacent deposition units along a row or column may also be about 0.05 or 0.10 inch. A computer software program executed by hardware provided with or communicating with the ink-jet printer may be utilized to control resolution and various other deposition parameters.

In some implementations, the PL materials 144 or the entire light converter 136 may be partially or fully encapsulated by any transparent encapsulant suitable for providing a protective barrier. Preferably, the encapsulant is UV-insensitive and not prone to thermal degradation. Examples of encapsulants include, but are not limited to, parylene, silicone (such as those available from Dow Corning of Midland, Mich.), and epoxies (such as those available from Norland Products of Cranbury, N.J.). The encapsulant may be deposited by any suitable technique. One or more of the deposition techniques noted below in conjunction with particle deposition may be suitable.

As described by examples below, the lighting device 100 further includes a color tuning device (not specifically shown in FIG. 1A). The color tuning device may be configured for moving the PL material 144 (typically by moving the entire light converter 136) relative to the light source 132, moving the light source 132 relative to the PL material 144, moving both the PL material 144 and the light source 132, and/or moving or altering the path of the primary light beam 140 or a portion of the primary light beam 140. All such implementations may be characterized in effect as adjusting the position of the primary light beam 140 relative to the PL material 144, and each implementation results in changing the color of the output light 170. It will be appreciated that when two or more different PL materials 152, 154 are utilized as in the example of FIG. 1A, the pattern of the PL materials 152, 154 will be arranged in a manner optimal for the specific mode implemented for adjusting the position of the primary light beam 140 relative to the PL materials 152, 154. It will also be appreciated that the change in the color of the output light 170 is not limited to large chromatic shifts, such as from green to yellow or yellow to orange. In more typical implementations, the change in color is more in the nature of fine tuning, such as adjusting the amount of blue or red in the output light 170. As an example contemplated for many lighting applications, the lighting device 100 may be configured to produce white output light 170. In this case, the color tuning device may be utilized to adjust the relative amount(s) of blue, green and/or red in the white output light 170, thereby changing the whiteness (e.g., coolness, neutrality or warmth) of the output light 170.

FIG. 1A schematically illustrates an example of moving the PL material 144, in which the PL material 144 is linearly translated in the plane normal to the nominal output axis of the light source 132 (i.e., in a radial direction relative to the light source 132), as indicated by an arrow 174. In the illustrated example, this linear translation occurs in a vertical direction (from the perspective of FIG. 1A). Alternatively, the linear translation could be effected along a horizontal direction transverse to the nominal output axis (into or out from the drawing sheet of FIG. 1A) or in any other radial direction. FIG. 1A schematically illustrates another example of moving the PL material 144, in which the PL material 144 is rotated about an axis in the plane normal to the nominal output axis, as indicated by an arrow 176. Depending on the configuration of the lighting device 100, other ways of moving the PL material 144 may be feasible such as rotating the PL material 144 about a vertical axis (e.g., yaw), rotating the PL material 144 about a horizontal transverse axis (e.g., pitch), or axially translating the PL material 144 toward or away from the light source 132. FIG. 1A also schematically illustrates an example of moving the light source 132, in which the light source 132 is axially translated toward or away from the PL material 144 as indicated by an arrow 178. Alternatively, the light source 132 may be rotated about a vertical axis (yaw) or a horizontal transverse axis (pitch).

Figure 1B:
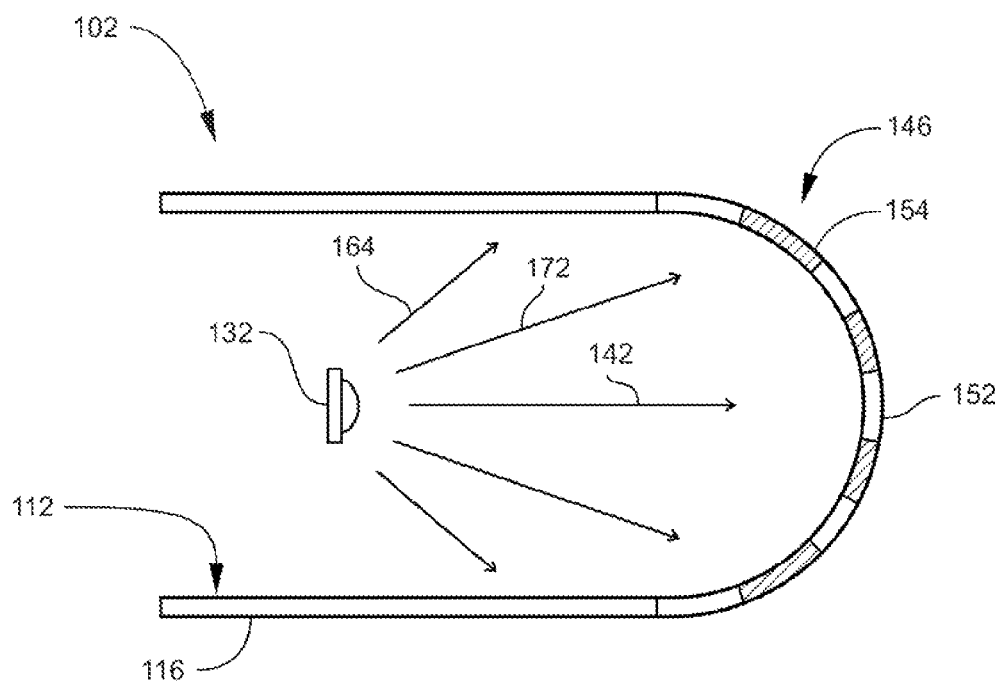
FIG. 1B is a cross-sectional view of another example of a lighting device according to the present teachings.

The PL material 144 described above has been schematically depicted as being planar. It will be understood, however, that the PL materials utilized in the lighting devices encompassed by the present disclosure are not limited to any particular geometry. The PL materials may have a curved profile or a complex geometry. As an example, FIG. 1B is a cross-sectional view of a lighting device 102 similar to that illustrated in FIG. 1A, but with the planar PL material 144 replaced with a curved PL material 146. The curved PL material 146 may be hemispherical, or conform to or approximate another type of conical section (e.g., ellipsoid, paraboloid, hyperboloid, etc.), or may follow another type of curvature. The curvature may be such that the radiant flux of the primary light beam incident on the PL material 146 is approximately constant over most or all of the side of the PL material 146 facing the light source 132. For example, in FIG. 1B the radiant flux of a portion 142 of the primary light beam directed along the nominal output axis may be equal or proximate to the radial flux of some or all portions 172 of the primary light beam directed at angles to the nominal output axis.

Figure 3A:
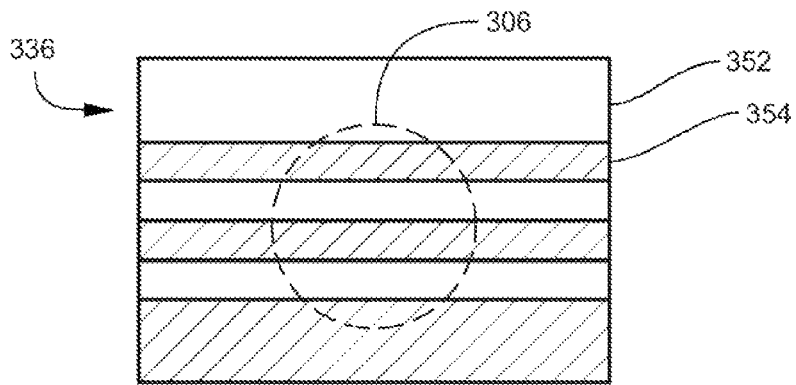
FIGS. 3A-3C are respective plan views of an example of a light converter that includes a pattern of two different luminescent materials according to the present teaching, illustrating the light converter at three different linear positions relative to an incident primary light beam, and which may be utilized in one or more of the lighting devices described herein.
Figure 3B:
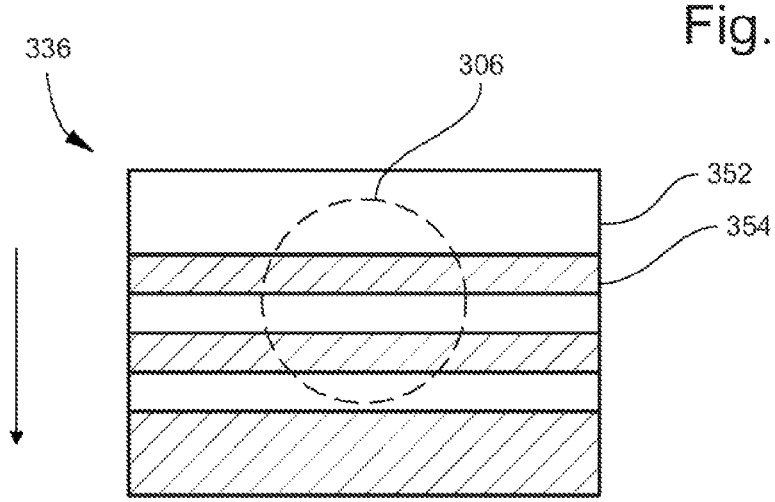
Figure 3C:
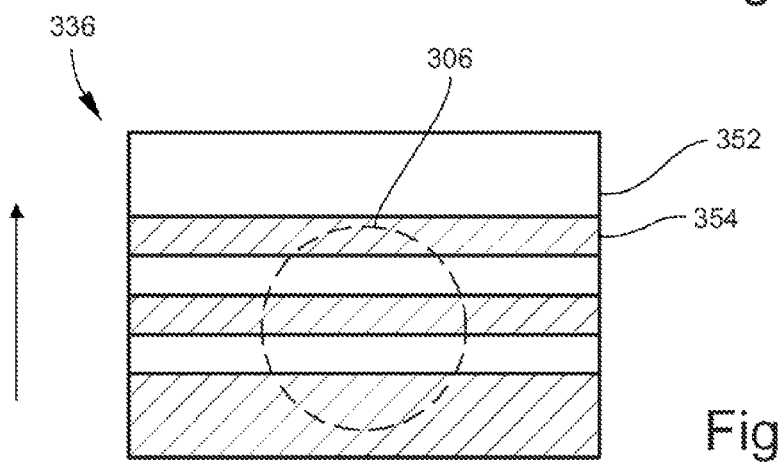

FIGS. 3A-3C illustrate an example of a light converter 336 that may be utilized in conjunction with one or more color tuning modalities, such as movement of the light converter 336 (or least the PL materials provided by the light converter 336) relative to the primary light source. Specifically, each of FIGS. 3A-3C is a plan view of the light converter 336 that includes a pattern of two different PL materials, which for purposes of illustration will be referred to as green emitters 352 and red emitters 354. Similar to FIG. 1A, the pattern shown in FIG. 3 is an alternating series of horizontally-oriented stripes of green emitters 352 and red emitters 354. A dashed circle in FIG. 3 depicts a central portion 306 of the primary light beam. The size of the area of the central portion 306 depicted in FIG. 3 is arbitrary. The central portion 306 merely corresponds to the brightest area of illumination by the primary light beam. This is a result of the planar projection of geometry of lighting devices such as shown in FIG. 1A. Moreover, the radiant flux is typically highest in the vicinity of the nominal output axis along which the light source is directly aimed at the PL materials, decreases with radial distance from the nominal output axis due to the fall-off in emission intensity of a typical primary light source. Therefore, fluorescent interactions between the primary light beam and the PL material are likely to be more concentrated within the area of the central portion 306.

In some implementations, the horizontally striped pattern of PL materials illustrated in FIGS. 3A-3C may be utilized in conjunction with a color tuning device that moves the PL materials linearly along the direction 174 shown in FIG. 1A. Specifically in the case of FIG. 3A, and considering the central portion 306 as a datum representative of the primary light beam, the primary light beam is centered on the PL materials such that the primary light beam strikes the respective PL materials in equal proportions, i.e., half of this portion 306 of the primary light beam illuminates the green emitters 352 and the other half illuminates the red emitters 354. In theory or approximation, the PL materials as positioned in FIG. 3A will produce equal amounts of green radiation and red radiation. By comparison, FIG. 3B is a plan view of the same light converter 336 illustrated in FIG. 3A, but the color tuning device has moved the PL materials downward relative to the primary light beam while the primary light beam remains fixed in position and orientation. In this case, the central portion 306 illuminates a greater area of the green emitters 352 than the red emitters 354, thereby causing the light converter 336 to emit a greater proportion of secondary light at the green wavelength. This adjustment results in the lighting device producing output light that has an increased proportion of green color as compared to the case of FIG. 3A. By further comparison, FIG. 3C illustrates movement of the PL materials in the opposite direction. That is, the color tuning device has moved the PL materials upward relative to the primary light beam. In this case, the central portion 306 illuminates a greater area of the red emitters 354 than the green emitters 352, thereby causing the light converter 336 to emit a greater proportion of secondary light at the red wavelength. This adjustment results in the lighting device producing output light that has an increased proportion of red color as compared to the cases of FIGS. 3A and 3B.

As evident in FIGS. 3A-3C, the stripes or bands of PL materials do not all need to have the same cross-sectional areas. That is, the areas of one or more of the stripes may vary, with some stripes being larger than other stripes, which may facilitate this particular mode of linearly moving the PL materials relative to the light source. However, in the illustrated example the cross-sectional areas of all stripes are constant in at least one direction, which is the same direction for all stripes. Specifically, the widths (vertical dimension) of the stripes do not change as one moves along their lengths (horizontal dimension). Hence, in this case movement of the PL materials in the horizontal direction would not effect a tuning of color in the output light. If the color tuning device were configured for laterally moving the PL materials, a vertically striped pattern of PL materials would be effective for color adjustment.

Figure 4A:
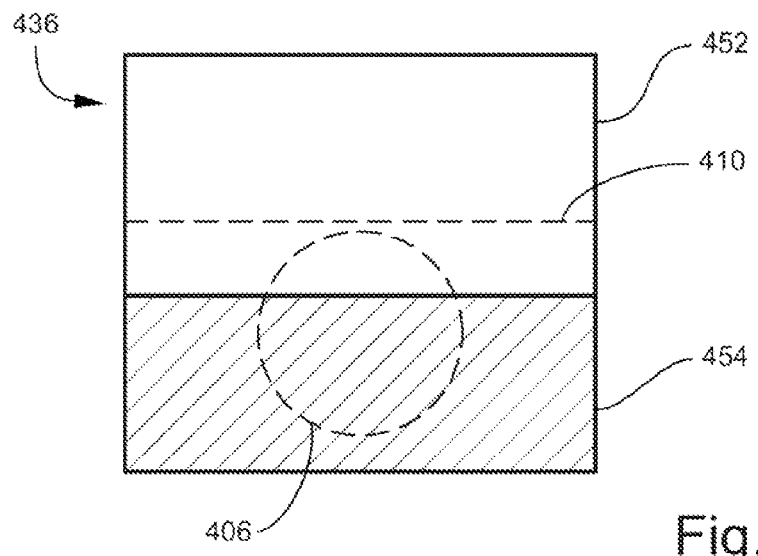
FIGS. 4A and 4B are respective plan views of another example of a light converter that may be utilized in one or more of the lighting devices described herein, illustrating the light converter at two different linear positions relative to an incident primary light beam.
Figure 4B:
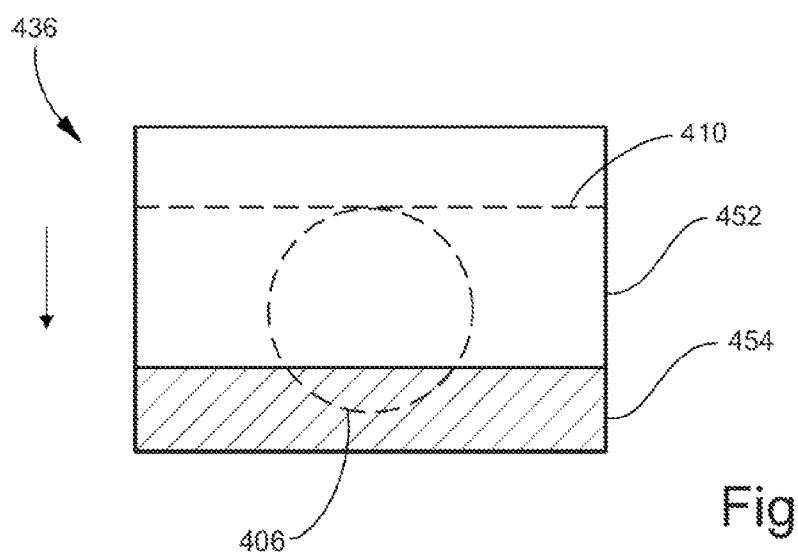

FIGS. 4A and 4B illustrate another example of a light converter 436 that may be utilized in conjunction a color tuning device configured for moving the light converter 436 (or at least the PL materials provided by the light converter 436) relative to the light source. In this implementation, the light converter 436 includes at least two physically separate sections (or segments, tiles, etc.) that respectively provide two different PL materials, which for purposes of illustration will be referred to as a green emitter 452 and a red emitter 454. At least one of the green and red emitters 452, 454 is movable by the color tuning device relative to the other, although in other implementations both the green emitter 452 and the red emitter 454 may be movable. In the illustrated example, the green emitter 452 is positioned axially closer to the light source relative to the red emitter 454 and is linearly translatable along the vertical direction while the red emitter 454 is stationary. In FIG. 4A, the green emitter 452 is in an upward position and overlaps a portion of the cross-sectional area of the red emitter 454. The overlapping relation is evident from a dashed line in FIG. 4A that designates an upper edge 410 of the red emitter 454. The light source is aimed such that the primary light beam, again represented by a central portion 406 as described above, illuminates a greater fraction of the red emitter 454 than the green emitter 452. As a result, a greater proportion of secondary light is emitted at the red wavelength and, consequently, the output light of the lighting device exhibits a greater proportion of red color and has a lower CCT. By comparison, in FIG. 4B the green emitter 452 has been translated downward such that a greater portion of the green emitter 452 overlaps the red emitter 454 and a greater fraction of the green emitter 452 is illuminated by the primary light beam. As a result, a greater proportion of secondary light is emitted at the green wavelength and, consequently, the output light of the lighting device exhibits a greater proportion of green color and has a higher luminous efficacy.

It will be appreciated that positions intermediate to those shown in FIGS. 4A and 4B are possible, including a position at which equal areas of green emitters 452 and red emitters 454 are illuminated by the primary light beam. Moreover, in other implementations one or more sections of PL materials may be rotated relative to the others in order to obtain different degrees of overlap. In addition, while in the illustrated example the light converter 436 includes only two sections 452, 454 of different PL materials, in other implementations more sections may be provided. For instance, the light converter 436 may include an array of tiles, with each tile presenting a green emitter 452 or a red emitter 454 and some of the tiles being movable together or individually relative to the other tiles.

FIG. 5 is a set of data indicating spectral radiant flux, specifically irradiance (μW/nm) as a function of wavelength (nm) for several different orientations of two photoluminescent nanofiber substrates (PLNs) of a prototype lighting device. One PLN contained green phosphors and the other PLN contained red (specifically, maple red-orange) QDs. These two PLNs were mounted side-by-side on a flange that could be rotated about an axis perpendicular to the surface of the PLNs. As examples, curve 502 corresponds to an initial position, and curves, 504, 506, 508 and 510 correspond to rotations of 45°, 90°, 180° and 225° from the initial position, respectively. FIG. 5 demonstrates that by changing the degree of overlap between the primary light source and the green and red PLNs, the amount of green and red light emission from the lighting device is changed. In the initial position, the primary light beam had a large overlap with the red PLN and minimal overlap with the green PLN. As a result, a relatively large amount of red secondary emission and lesser amounts of green secondary emissions were produced. When rotated 135° about an axis normal to the PLNs, the overlap between the primary light source and the green PLN increased and the overlap between the primary light source and the red PLN decreased. This configuration produced a maximum in green secondary emissions and a minimum in red secondary emissions. By rotating the PLNs about an axis perpendicular to their surface, any color point between these two extremes can be accessed.

Figure 6:
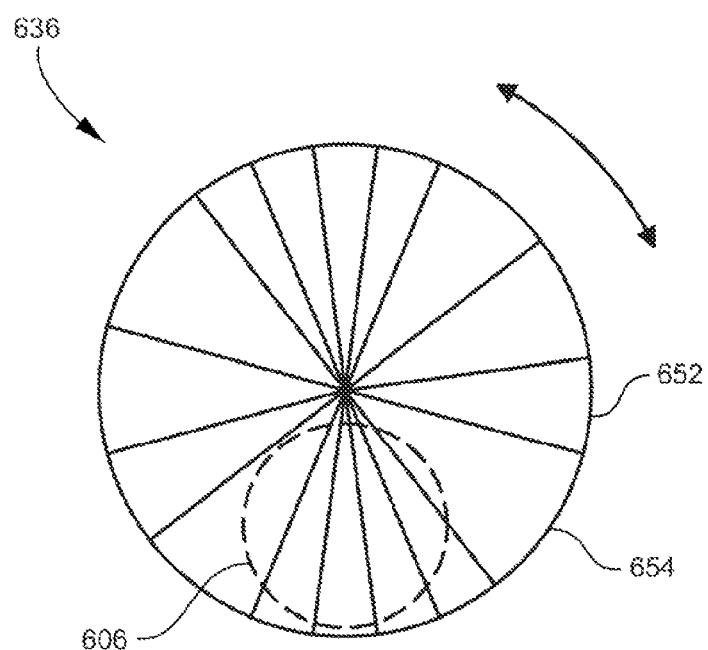
FIG. 6 is a plan view of another example of a light converter that includes a pattern of two different luminescent materials, and which may be utilized in one or more of the lighting devices described herein.

FIG. 6 illustrates another example of a light converter 636 that may be utilized in conjunction with one or more color tuning modalities, such as rotation of the light converter 636 (or least the PL materials provided by the light converter 636) relative to the light source. Specifically, FIG. 6 is a plan view of the light converter 636 that includes a pattern of two different PL materials, which for purposes of illustration will be referred to as green emitters 652 and red emitters 654. In this example, the pattern is an alternating array of circular sectors (i.e., pie-shaped segments), with each circular sector containing a green emitter 652 or a red emitter 654. The light converter 636 is rotatable about an axis at its center. Alternatively, the axis of rotation may be offset from the center to implement eccentric rotation. A central portion 606 of the primary light beam illuminates an area of the pattern covering a plurality of adjacent sectors. Depending on how the pattern is designed, the primary light beam may be aimed at the center of the light converter 636 or, as illustrated, at a point offset from the center. Clockwise or counterclockwise rotation of the light converter 636 adjusts the proportions of green emitting areas and red emitting areas illuminated by the primary light beam, resulting in color tuning in a manner analogous to the descriptions above. For this purpose, the circular sectors may all have the same area or, as illustrated, some circular sectors may have different areas than others. In other implementations, the light converter 636 may be shaped as a semicircle or an arcuate plate instead of a full circle.

Figure 7A:
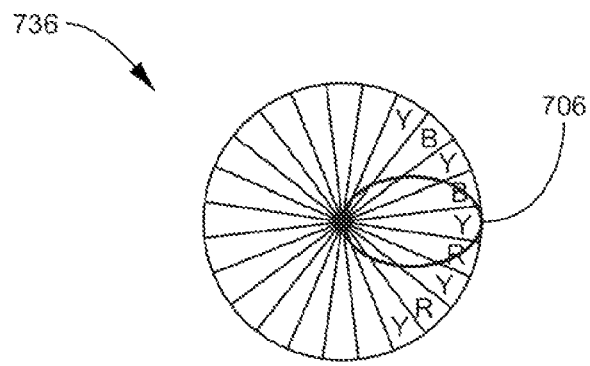
FIGS. 7A-7C are respective plan views of another example of a light converter at three different angular positions relative to an incident primary light beam, and which may be utilized in one or more of the lighting devices described herein.
Figure 7B:
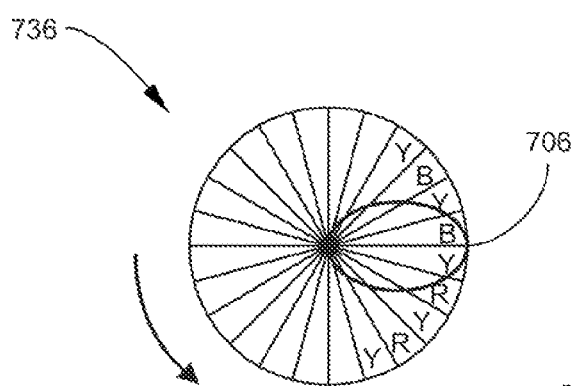
Figure 7C:
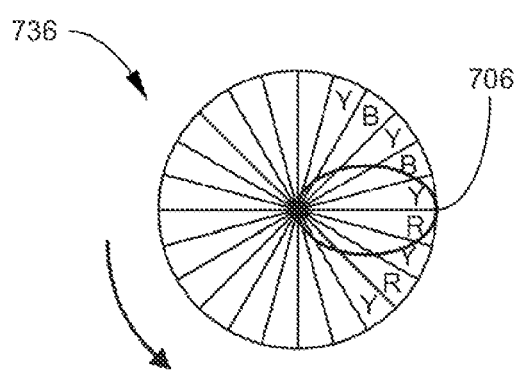

FIGS. 7A-7C are plan views of another example of a rotary light converter 736. The light converter 736 includes a pattern of three different PL materials. The pattern is an alternating array of circular sectors, with each circular sector containing a different PL material. The sequence of PL materials may depend on a number of factors, such as the range of rotation of the light converter 736, the intensity or irradiance of a central portion 706 of the primary light beam on the PL materials, etc. In the illustrated example, the PL materials are designated "Y", "R" and "B". In a case where the lighting device 100 is intended to produce white output light 170, Y may represent a PL material providing the majority of secondary light utilized to balance the color of the primary light beam 140, R may represent a PL material providing secondary light in the long-wavelength part of the visible spectrum, and B may represent a PL material providing secondary light in the short-wavelength part of the visible spectrum. In the case of a blue light source 132, the Y material may be a yellow or green emitter, the R material may be a red, red-orange or orange emitter, and the B material may be a surface that reflects the blue excitation light (e.g., bare nanofibers or other type of reflective surface). For instance, the B material may be a white reflective material. The white reflective material may be a particulate material, examples of which include, but are not limited to, barium sulfate ($BaSO_4$), titanium (IV) oxide ($TiO_2$), alumina ($Al_2O_3$), zinc oxide (ZnO), Teflon® (polytetrafluoroethylene, or PTFE), and combinations of two or more of the foregoing. Alternatively, the B material may be another PL material. As examples, in the case of a UV light source 132 (e.g., $\lambda_{em}$~350-370 nm) the B material may be a blue or violet emitter, and in the case of a violet emitter the B material may be a blue emitter. As another example, the light source 132 may be a UV emitter or a violet emitter (e.g., $\lambda_{em}$~408 nm), the Y material may be a green or yellow emitter, the R material may be a red or orange emitter, and a B material may be a blue emitter. In any of these cases, the light converter 736 may be rotated to adjust the composition of the secondary light emitted from the light converter 736 in a manner analogous to that described earlier. In one example in which white light is being produced, the position shown in FIG. 7A produces a neutral tone, the position shown in FIG. 7B produces a cool tone (more blue is reflected or emitted), and the position shown in FIG. 7C produces a warm tone (more red or other long-wavelength radiation is emitted).

Figure 8:
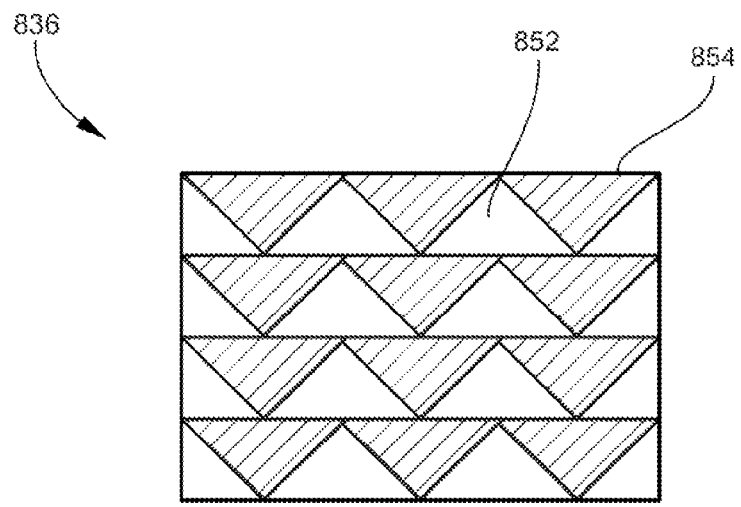
FIG. 8 is a plan view of another example of a light converter that may be utilized in one or more of the lighting devices described herein.

FIG. 8 is a plan view of another example of a light converter 836 that may be utilized in conjunction with one or more color tuning modalities. In this example, the light converter 836 includes an alternating pattern of two different PL materials 852, 854, (e.g., green emitters and red emitters). The shape of each section of PL material 852 or 854 is such that the amount of its area illuminated by an incident light beam will vary upon linear movement of the light converter 836 in more than one direction and/or upon rotation of the light converter 836. Thus, the light converter 836 may be utilized in conjunction with a color tuning device configured for linearly translating the light converter in a selected direction or rotating the light converter about a selected axis. FIG. 8 illustrates one non-limiting example in which the pattern comprises alternating stacks of triangles of first PL materials 852 and second PL materials 854. It will be appreciated that other polygonal shapes may also be utilized (e.g., squares, rectangles, hexagons, trapezoids, diamonds, etc.), as well as rounded shapes (e.g., ellipses, circles, dots, etc.). Other examples include spirals and irregularly-shaped polygons as well as a pattern of dots or circles. Moreover, the pattern may include more than one type of shape. As examples, all first PL materials 852 may have one shape while all second PL materials 854 have a different shape, or some PL materials 852 and/or 854 may have one shape while other PL materials 852 and/or 854 have a different shape.

It will also be appreciated that a striped pattern such as illustrated in FIGS. 3A-3C or an overlapping pattern such as illustrated in FIGS. 4A and 4B may be configured as appropriate for use in conjunction with rotation by the color tuning device. Likewise, a circular pattern such as illustrated in FIGS. 6 and 7A-7C may be configured as appropriate for use in conjunction with linear translation by the color tuning device. Moreover, in still other implementations the pattern need not be a uniform arrangement of first-wavelength emitters and second-wavelength emitters. As one example, the first-wavelength emitter may cover a majority of the area of the light converter while the second-wavelength (e.g., a longer wavelength) emitter covers only a small section. In such case, the second-wavelength emitter may be positioned on the light converter, and may be shaped, as appropriate for the mode of movement implemented by the color tuning device.

FIGS. 9-12 illustrate various non-limiting examples of color tuning devices communicating with a light converter. Generally, the color tuning device may include an actuator and a support structure. The support structure may be or include a mechanical linkage that interconnects the actuator to the light converter. The mechanical linkage may be any component or combination of components that transfers or converts movement or activation of the actuator into movement of the light converter in a desired linear or rotational direction. Alternatively, the support structure may be a guide or frame that supports either the light converter or the actuator during movement. The actuator may be any component or combination of components that enables a user or an electronic controller to effect a desired movement of the light converter. The actuator may be configured for manual actuation by a user such as, for example, a knob, a screw, or a linearly sliding button. A manual actuator may be configured for coupling to a tool that the user employs to effect movement of the light converter. For instance, the actuator may include a head with a receptacle adapted to receive a screwdriver, hex wrench or the like. A portion of the actuator may reside outside the lighting device for convenient access by the user. In other implementations, the manual actuator may be a surface of the light converter that is accessed by the user. Alternatively the actuator may be configured for power-assisted actuation such as, for example, a motor or a solenoid. Additionally, the color tuning device may be configured for automated color tuning. For instance, a powered actuator may be in signal communication with electronic circuitry that also interfaces with a color measuring device such as a colorimeter, in which case the electronic circuitry may control the actuator based on feedback signals received from the color measuring device. Alternatively, a user may operate a manual actuator in conjunction with separately operating and monitoring a color measuring device. Moreover, the color tuning device may be configured for continuously variable movement or for indexed movement (e.g., using a stepper motor or an indexed support structure or mechanical linkage). If desired, the extent of linear or rotary travel of the light converter may be limited by any suitable means, such as mechanical stop mechanisms, limit switches, optical encoders, etc.

Figure 9:
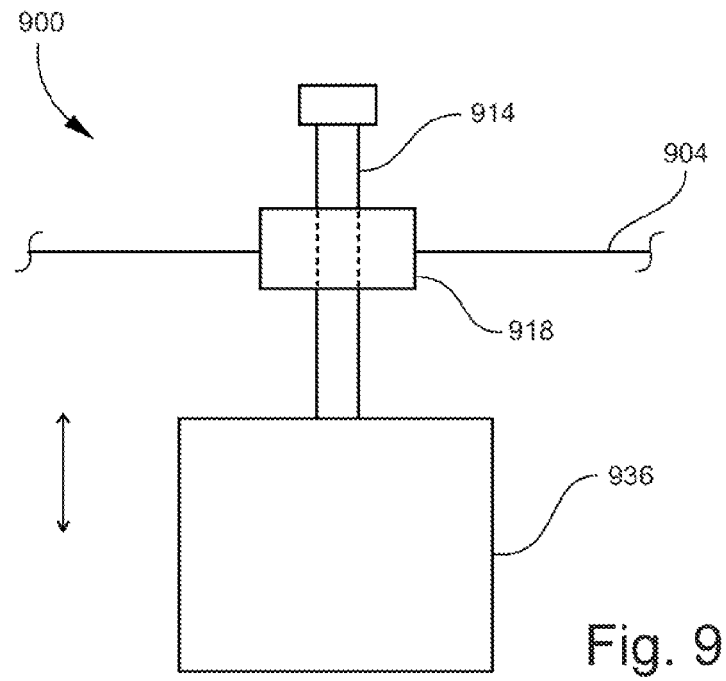
FIG. 9 is a plan view of one example of a color tuning device configured for linearly translating a light converter according to the present teachings.

FIG. 9 is a plan view of one example of a color tuning device 900 configured for linearly translating a light converter 936. The color tuning device 900 may include an actuator 914 and a support structure 918. In this example, the actuator 914 may be a rod connected directly to the light converter 936. The actuator 914 may support the light converter 936 in fixed positions as well as during movement of the light converter 936. The support structure 918 may support the actuator 914, for example as a bearing. The support structure 918 may hold the actuator 914 by friction while permitting translation of the actuator 914 through the support structure 918 when the actuator 914 is pushed or pulled by a user or a motor, or alternatively may hold the actuator 914 at indexed positions by means of a suitable locking structure (e.g., a pawl or a spring-loaded detent). The support structure 918 may, for example, be mounted at a housing 904 of the lighting device or be a part of the housing 904. Alternatively or additionally, the support structure 918 may include a linear guide or frame (not shown) that supports one or both vertical edges of the light converter 936 during movement thereof. In this case, as a further alternative, the actuator 914 may be a part of the light converter 936 that the user contacts to effect movement. For example, the top edge of the light converter 936 may serve as the actuator—that is, the user may push or pull the top edge to move the light converter 936 while the light converter 936 slides along a laterally positioned support structure.

Figure 10:
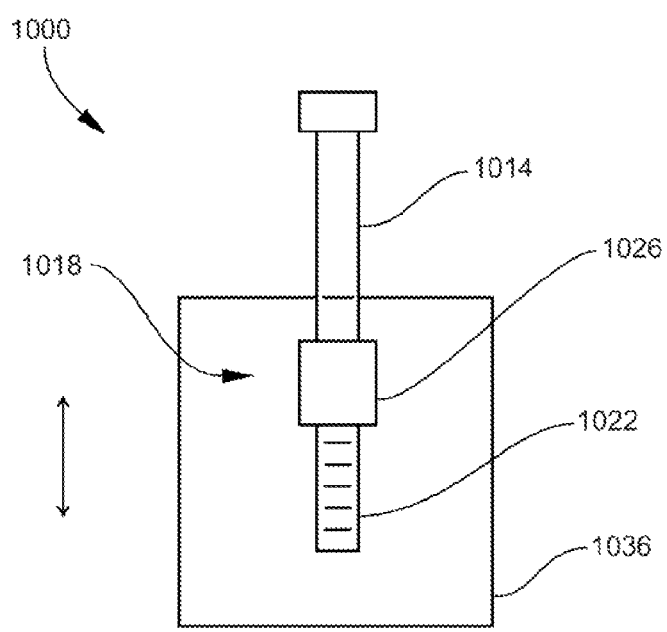
FIG. 10 is a plan view of another example of a color tuning device configured for linearly translating a light converter.

FIG. 10 is a plan view of another example of a color tuning device 1000 configured for linearly translating a light converter 1036. The color tuning device 1000 may include an actuator 1014 and a support structure 1018. In this example, the support structure 1018 includes a linear guide or a toothed rack 1022 mounted to the back of the light converter 1036 (the side opposite to the light source) or to an edge of the light converter 1036. The support structure 1018 may also include a transmission component or assembly (or mechanical linkage) 1026. Depending on the design of the actuator 1014 and the transmission component 1026, the transmission component 1026 may move with the light converter 1036 (and with the rack 1022 mounted thereto) or may be stationary. The transmission component 1026 may include one or more gears that mesh with teeth of the rack 1022, in which case the actuator 1014 may be a shaft (powered by the user or a motor) that rotates the gears. Alternatively, the actuator 1014 may be a screw or a worm, in which case the transmission component 1026 may be a structure containing threads that mate with the screw or may include a worm gear that meshes with the worm.

Figure 11:
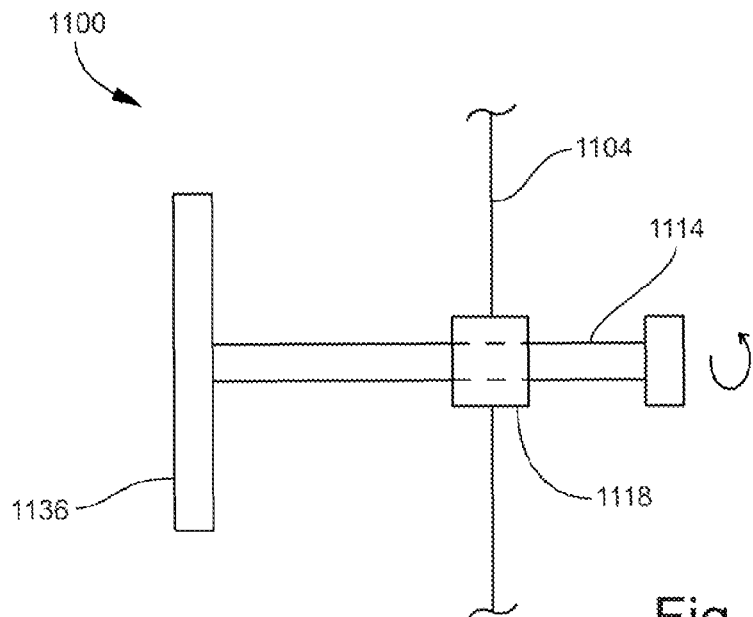
FIG. 11 is a side view of another example of a color tuning device configured for rotating a light converter according to the present teachings.

FIG. 11 is a side view of another example of a color tuning device 1100 communicating with a light converter 1136. Specifically, FIG. 11 illustrates one example of a color tuning device 1100 configured for rotating the light converter 1136 about an axis. The color tuning device 1100 may include an actuator 1114 and a support structure 1118. In this example, the actuator 1114 may be a shaft collinear with the axis of rotation and directly coupled to the light converter 1136 and rotated by the user or a motor, in which case the support structure 1118 may be a structure that supports the shaft in a fixed position while allowing rotation (e.g., a bearing). The support structure may, for example, be mounted to a housing 1104 of the lighting device or be a part of the housing 1104.

Figure 12:
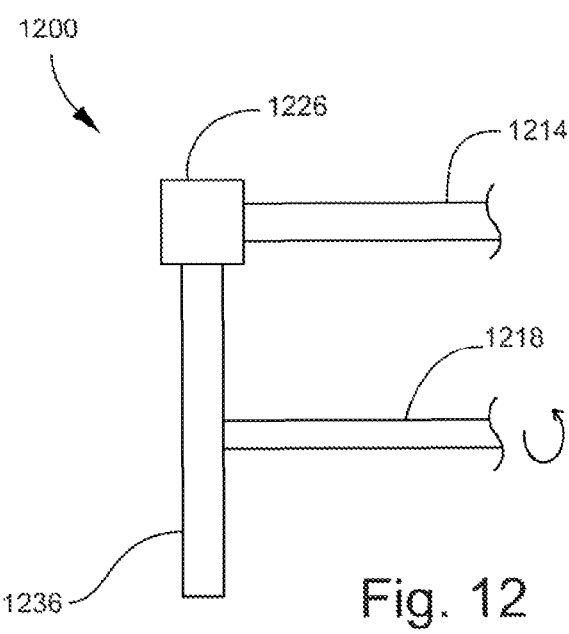
FIG. 12 is a side view of another example of a color tuning device configured for rotating a light converter.

FIG. 12 is a side view of another example of a color tuning device 1200 communicating with a light converter 1236 and configured for rotating the light converter 1236 about an axis. The color tuning device 1200 may include an actuator 1214 and a support structure 1218. In this example, the support structure 1218 may be or include a passive axle collinear with the axis of rotation for supporting rotation of the light converter 1236 about the axis. The axle may be supported by a suitable component of the housing of the lighting device such as a bearing (not shown). The color tuning device 1200 may further include a transmission or linkage 1226 interconnecting the actuator 1214 and the light converter 1236. For example, the light converter 1236 may be formed as a toothed wheel, in which case the transmission 1226 is a gear meshing with the teeth and the actuator 1214 is a shaft driven manually or by a motor. In other implementations, the actuator may simply be the peripheral edge of the light converter 1236, in which case the user contacts the edge to rotate the light converter 1236.

In other implementations of a light converter such as illustrated in FIGS. 9-12, the light converter may include teeth extending from (or grooves formed in) an edge or side thereof. A spring-loaded detent may be biased to extend between an adjacent pair of teeth or into a groove to hold the light converter in place after an adjusting movement has been performed (i.e., after the color of the output light has been tuned by an end user or at the end of a manufacturing process). Means could also be provided for locking the light converter in place in a more permanent manner, particularly in the context of a manufacturing process. For example, after the output light of the lighting device has been adjusted to a desired setting, a pin mechanically referenced to the housing or other fixed structure of the lighting device could be inserted into a bore or recess of the light converter and secured in place by friction fit, welding, adhesion, etc.

It will be noted that the choice between configuring the color tuning device for linear movement or rotational movement may depend on various design factors, and each configuration may have respective advantages and disadvantages. For instance, a rotary PL material would not need to cover the entire illuminated area of the primary light beam but instead just the area most brightly illuminated by the light source. Also, certain configurations for rotating a light converter may be easier to implement than configurations for linearly translating the light converter.

In other implementations, the color tuning device may be configured for moving the light source. The color tuning device may include an actuator and a support structure that interact with the light source for this purpose. The actuator and support structure may be configured in a manner analogous to the descriptions above relating to FIGS. 9-12. For this mode of color tuning, a single PL material or a pattern of two or more PL materials may be utilized, including but not limited to those illustrated in FIGS. 1A, 1B, 3A-4B and 6-8. In a typical implementation, the color tuning device moves the light source axially toward or away from the PL material of the light converter, thus changing the axial distance between the light source and the PL material. As one effect, changing this axial distance changes the "spot size" of the primary light beam on the PL material. Referring for example to FIG. 3A, the spot size may be envisioned by considering the central portion 306 of the primary light beam, described above. If the central portion 306 is considered to be a quantitative measure of incident light per unit area (e.g., irradiance or illuminance), then changing the spot size may be associated with changing the diameter of the central portion 306. With an appropriate pattern of first and second PL materials 352, 354, for example sections of green emitters and red emitters, changing the spot size changes the relative amounts of primary light striking the green portions and red portions. Changing the spot size may also change the amount of blue light reflected back from the light converter 336.

FIGS. 13A-15 illustrate another effect of changing the axial distance between the light source and the PL material. For a light source that emits a wide-angle primary light beam of a selected wavelength (e.g., blue), moving the light source closer to the PL material increases the amount of blue light directly striking the PL material and thus decreases the amount of blue light bypassing the PL material or directly striking a reflective surface positioned separately from the PL material. In an appropriately designed lighting device, this results in more conversion (e.g., red-shifting) of the blue light by the PL material, and consequently a relatively smaller proportion of blue light contributing to the output light of the lighting device. On the other hand, moving the light source farther from the PL material decreases the amount of blue light directly striking the PL material and thus increases the amount of blue light bypassing the PL material or directly striking a reflective surface positioned separately from the PL material. For the same lighting device, and assuming the power driving the light source remains constant for all axial positions, this results in less conversion of the blue light by the PL material, and consequently a relatively larger proportion of blue light contributing to the output light of the lighting device.

Figure 13A:
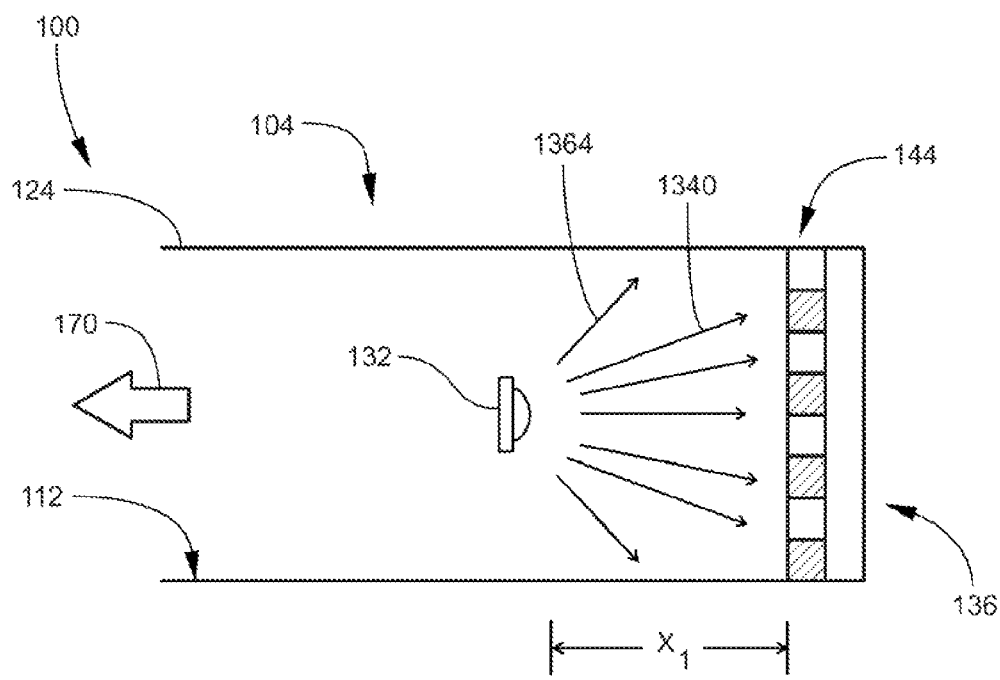
FIG. 13A is a side view of the lighting device illustrated in FIG. 1A.
Figure 13B:
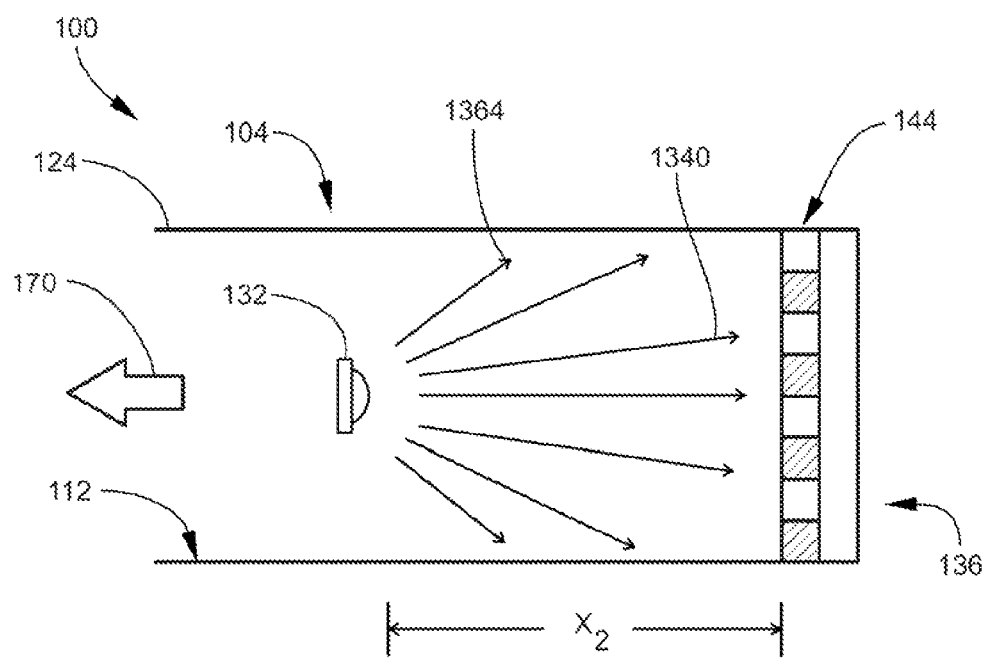
FIG. 13B is the same side view as FIG. 13A wherein the axial distance between a light source and a luminescent material is changed.

The foregoing effect may be visualized by referring to FIGS. 13A and 13B. Specifically, FIG. 13A is a side view of the lighting device 100 illustrated in FIG. 1A. The light source 132 is positioned at an axial distance of $x_1$ from the PL material 144. Solely for purposes of illustration, the wide-angle primary light beam outputted by the light source 132 is schematically depicted as being quantized into seven rays. At the illustrated position, five of the rays 1340 directly strike the PL material 144 while only two of the rays 1364 directly strike the reflective material 112 lining the housing 104. Due to the diffuse reflectance of the reflective materials 112, some of the components of the blue radiation represented by the two rays 1364 striking the reflective material 112 will remain unconverted and propagate through the light exit 124 as part of the output light 170. By comparison, FIG. 13B is the same side view as FIG. 13A but the light source 132 has been moved away from the PL material 144 to an axial distance of $x_2 > x_1$. At this new position, only three of the rays 1340 directly strike the PL material 144 while the other four rays 1364 now directly strike the reflective material 112. Thus, in comparison to the color tuning setting illustrated in FIG. 13A, a greater proportion of blue radiation (represented by the four rays 1364) will remain unconverted and propagate through the light exit 124 as part of the output light 170 and the color of the output light 170 will be bluer.

FIG. 14 is a set of plots of spectral radiant flux (μW/nm) as a function of wavelength (nm), for three different axial distances between the light source and the PL material (0.2 cm, 0.5 cm, and 1.1 cm). Curves 1402, 1406 and 1408 correspond to the axial distances 0.2 cm, 0.5 cm, and 1.1 cm, respectively. The prototype lighting device tested had a configuration as represented in FIGS. 1, 13A and 13B with a two-inch diameter light exit. The light source was an LED that emits royal blue light, available from Cree, Inc. under the model designation XREROY-L1-0000-00801. The PL material was formed from red and green PLNs. The reflective surface lining the inside wall of the housing was a diffuse reflecting nanofiber substrate described elsewhere in the present disclosure. FIG. 14 demonstrates that as the distance between the light source and the PLN increases, more blue light emanates from the lighting device. Correspondingly, the beam spot size on the PLN increases as the distance between the PLN and the light source is increased, and a greater fraction of the primary light strikes the reflective nanofiber lining of the lighting device.

Figure 15:
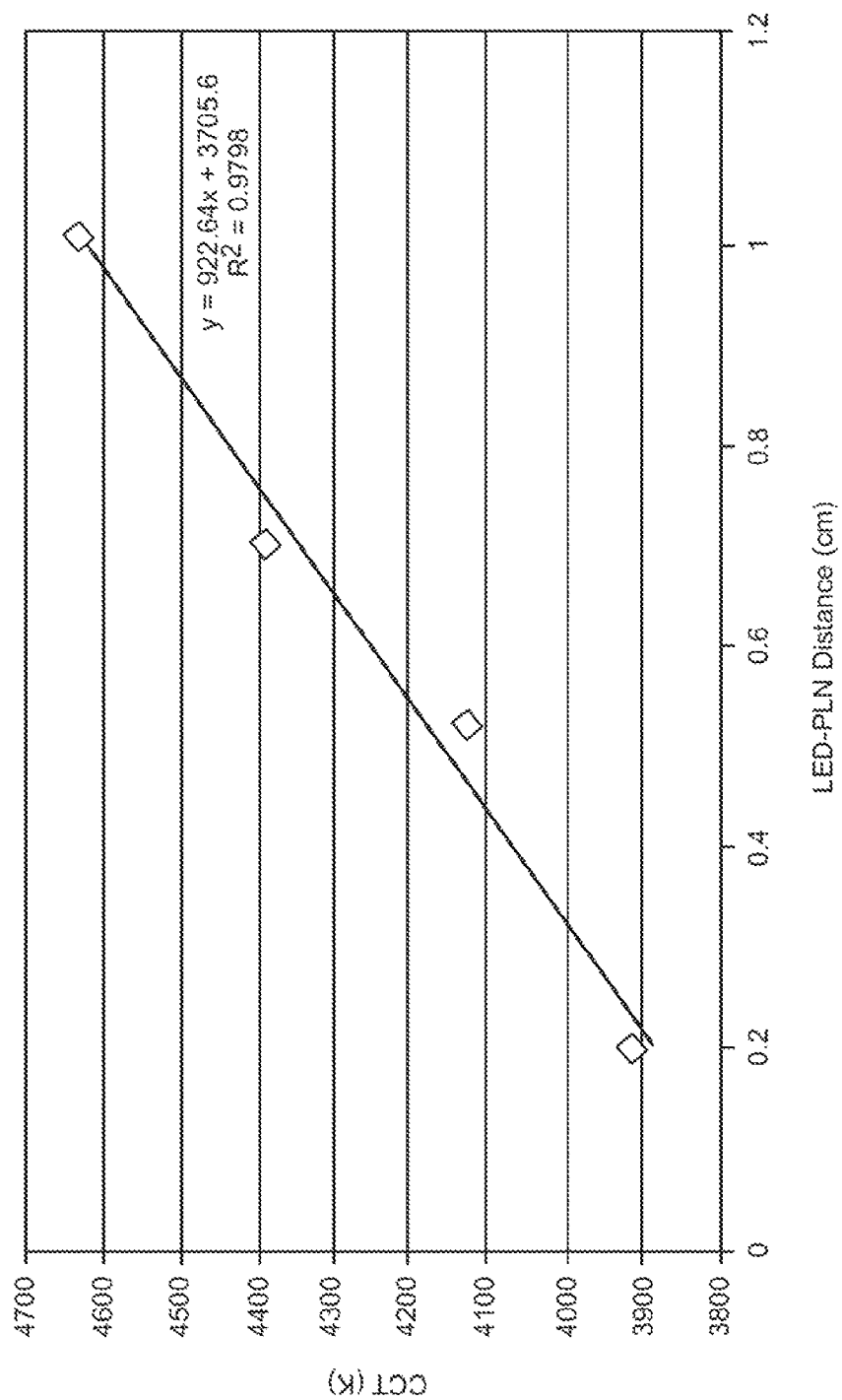
FIG. 15 is a plot of measured CCT values for various distances between a light source and a luminescent material.

FIG. 15 is a plot of measured CCT values (degrees K) for various distances (cm) between the LED and the PLN of the above-referenced prototype lighting device. FIG. 15 demonstrates that the CCT increases with increasing distance. This data is consistent with the observation that a shorter LED-PLN distance results in more of the primary blue emissions from the LED striking the PLN first while a longer LED-PLN distance increases the percentage of primary blue emissions striking the high-reflectance nanofibers. It will be noted that at least for this particular luminaire design (e.g., FIGS. 1, 13A and 13B), the increase in CCT in response to increasing distance is quite linear, which may facilitate or simplify the design of the color tuning device. Table 1 below contains some of the CCT-distance data from FIG. 15 as well as corresponding CRI values. A small variation in CRI values was observed, with shorter distances favoring lower CRI values.

TABLE 1

CCT and CRI values for a red and green PLN at the end of a 2" downlight prototype as the distance between the PLN and primary light source is increased.

| Primary Source to PLN Distance (cm) | CCT (K) | CRI |
| --- | --- | --- |
| 0.2 | 4048 | 85 |
| 0.5 | 4156 | 86 |
| 1.1 | 4415 | 88 |

As previously noted, in other implementations both the PL material and the light source may be movable relative to each other.

It will be noted that the choice between configuring the color tuning device for moving the PL material relative to the light source or the light source relative to the PL material may depend on various design factors, and each configuration may have respective advantages and disadvantages. Although the lighting device may be configured such that moving the light source gives rise to optical effects equivalent to moving the PL material, for many implementations moving the PL material may be considered to be more favorable. A typical light source such as an LED must be connected to a power supply and a heat sink. Moving an LED would require moving all of these components unless flexible electrical connections are provided to enable the LED unit to move separately from the other hardware relating to power supply and thermal energy management. Flexible connections are generally more prone to failure than fixed connections and may detract from the robustness typically attributed to LED packages.

As also previously noted, in a further alternative the axial distance may be changed by moving the PL material toward and away from the light source while keeping the light source stationary. In one implementation facilitating this color tuning modality, leakage of visible electromagnetic radiation from the lighting device may be minimized by partitioning the housing into two sections of slightly different cross-sectional areas such that one section fits into the other section and one of the sections is axially movable by an appropriately configured color tuning device. By this configuration, two housing sections are in a telescoping or overlapping relation, and the light source is mounted in a fixed relation to the stationary housing section while the PL material is mounted in a fixed relation to the movable housing section. Both housing sections may be lined with the reflective material, and the optical discontinuity presented by the overlapping interface between the two housing sections may have a negligible effect on the color-mixing performance of the lighting device.

FIGS. 16A-18 illustrate examples of a further alternative to physically moving the light source. Specifically, FIGS. 16A-18 illustrate examples of utilizing a color tuning device to move, alter or modulate the path of all or a portion of the primary light beam emitted from the light source. As in the other implementations described above, this may be accomplished solely by optical conditioning, i.e. without requiring the drive current to the light source to be changed. In various implementations, an optical waveguide is optically interposed between the light source and the PL material. The optical waveguide may be configured to efficiently collect and steer photons of the entire primary light beam or just a portion of it (e.g., the most intense central portion or a less intense peripheral portion). Various types of optical waveguides may be utilized, including but not limited to light pipes (including optical fibers and photonic-crystal fibers), slabs, and prismatic structures configured for bending the path of incident light without dispersing the light into constituent spectral components. A photonic-crystal fiber is typically constructed of a glass such as silica glass, and may include a solid or hollow core surrounded by a microstructured or nano-structured cladding having a periodicity of high- and low-dielectric constant materials scaled appropriately for transmission of the primary wavelength of interest.

Figure 16A:
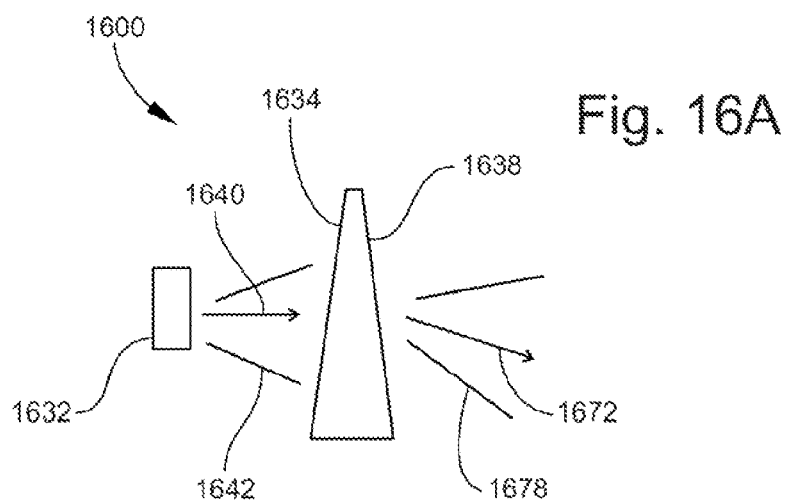
FIG. 16A is a side view of an example of a prismatic optical waveguide according to the present teachings.
Figure 16B:
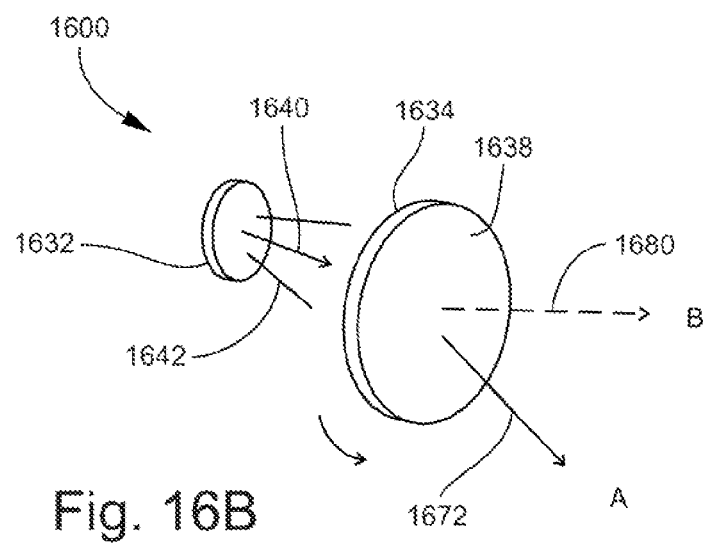
FIG. 16B is a perspective view of the prismatic optical waveguide illustrated in FIG. 16A.

FIGS. 16A and 16B are respective side and perspective views of a prismatic optical waveguide 1600. In this example, the prismatic waveguide 1600 is a wedge of transparent material mounted by any suitable means at a distance from the output side of a light source 1632. The prismatic waveguide 1600 includes an input surface 1634, an output surface 1638, and a wedge-shaped body between the input surface 1634 and output surface 1638. Due to the wedge shape, the thickness (and optical path length) through the solid material from the input surface 1634 to the output surface 1638 varies along a direction from a thicker edge to a thinner edge of the prismatic waveguide 1600. In FIG. 16A, a primary light beam from the light source 1632 is depicted by a central component 1640 along the nominal output axis representing the general direction of the primary light beam and peripheral components 1642 representing the extent of divergence of the primary light beam. The prismatic waveguide 1600 bends the primary light beam such that the nominal direction of the primary light beam emanating from the output surface 1638 is at an angle to the primary light beam incident on the input surface, as indicated by an emitted central component 1672 and peripheral components 1678. In FIG. 16B, the prismatic waveguide 1600 has been rotated about an axis from a first position "A" to a second position "B". At the first position, the primary light beam emanating from the output surface 1638 is depicted by the initial central component 1672 that propagates at the original angle shown in FIG. 16A. At the second position, the primary light beam emanating from the output surface 1638 is depicted by a new central component 1680 that propagates at a different angle. Thus, the prismatic waveguide 1600 may be moved to direct the primary light beam to different regions of the PL material, or to cause a portion of the primary light beam to bypass the PL material.

The color tuning device utilized in conjunction with the prismatic waveguide 1600 or other optical waveguide may be configured according to the general principles described above in conjunction with FIGS. 9-12. The prismatic waveguide 1600 may be rotated about a central axis of its solid material, or alternatively about an axis offset from the central axis to implement eccentric rotation. The prismatic waveguide 1600 may be rotatably supported by any suitable support structure provided with the color tuning device. Preferably, the support structure is configured to minimize optical effects on the primary light beam. As one example, the support structure may be a transparent material bonded to the prismatic waveguide 1600 by an optical adhesive.

Alternatively or additionally, the support structure may be a track, bearing or the like on which the prismatic waveguide 1600 is rotatably supported. In this case, the input surface 1634 and output surface 1638 of the prismatic waveguide 1600 may be clamped between spring-biased rollers to accommodate the changing thickness of the prismatic waveguide 1600 during rotation. The prismatic waveguide 1600 may be rotated by hand, or by a powered device connected to or integrated with a support structure in a manner analogous to the description above relating to FIGS. 9-12. As another alternative, the color tuning device may be configured for linearly translating the prismatic waveguide 1600 instead of rotating it, which may modify the beam path in a similar manner.

Figure 17:
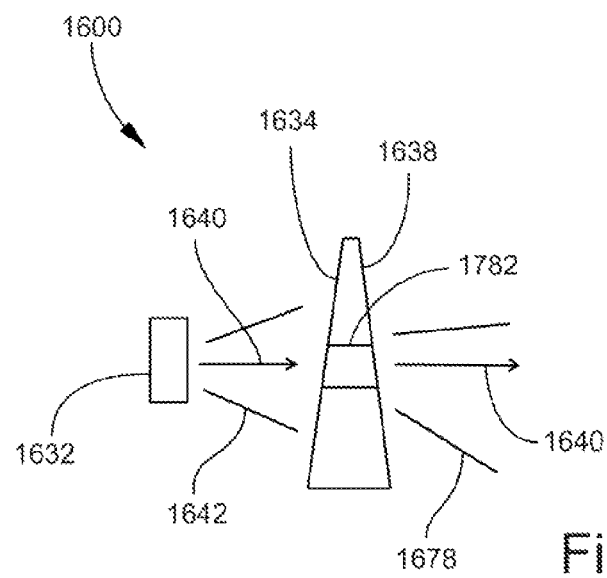
FIG. 17 is a side view of another example of the prismatic waveguide illustrated in FIGS. 16A and 16B.

An anti-reflective coating may be applied to the input surface of the prismatic waveguide 1600. Still, some photons of the primary light beam may be lost due to reflection from the input surface 1634. FIG. 17 is a side view of another example of the prismatic waveguide 1600 illustrated in FIGS. 16A and 16B, which has been modified to minimize the effects of reflection. In this example, a hole 1782 is bored through the center of the prismatic waveguide 1600. As a result, the central portion 1640 of the primary light beam is not affected by rotary adjustments to the position of the prismatic waveguide 1600; only the more peripheral portions 1642 are affected. This configuration results in less photons being reflected from the input surface 1634 but also lessens the effect that moving the prismatic waveguide 1600 has on color tuning. The lesser impact of the color tuning, however, may be sufficient for various configurations of the PL material.

Figure 18:
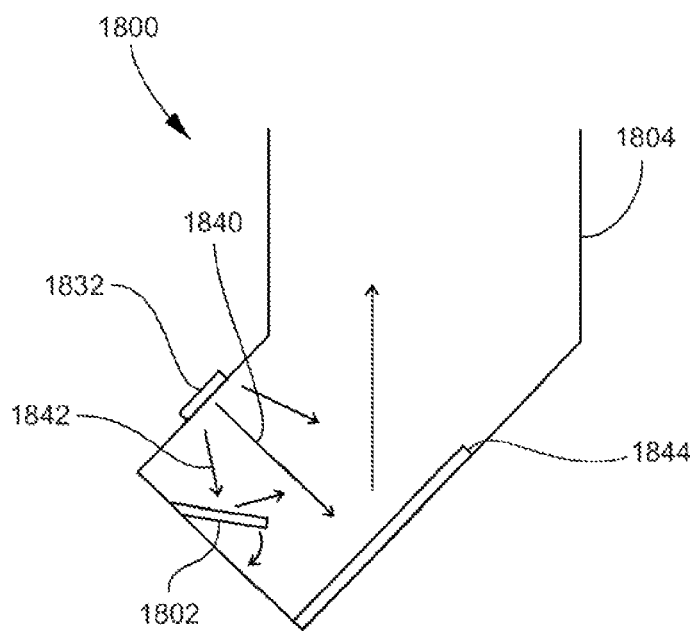
FIG. 18 is a cross-sectional view of another example of a lighting device or portion of the lighting device that includes an optical waveguide.

FIG. 18 is a cross-sectional view of another example of a lighting device 1800 or portion of the lighting device 1800. FIG. 18 illustrates another example of utilizing a color tuning device to modify the path of the primary light beam emitted from the light source. The lighting device 1800 includes a housing 1804, a light source 1832, and a PL material 1844. All or part of an inside surface of the housing 1804 may be lined with a reflective material and the PL material 1844 may be patterned or otherwise configured as described elsewhere in the present disclosure. The primary light beam is depicted by a central portion 1840 and peripheral portions 1842 as described above. In this example, the color tuning device includes a movable mirror 1802. The mirror 1802 may, for instance, be actuated to pivot about an appropriate pivot axis. The mirror 1802 is offset from the main output direction of the light source 1832 such that the central portion 1840 of the primary light beam does not encounter the mirror 1802 at any angular position of the mirror 1802. Only a more peripheral portion 1842 of the primary light beam directly strikes the mirror 1802. By this configuration, movement of the mirror 1802 changes the direction of a portion 1842 of the primary light beam in any desired manner relative to the PL material 1844 without affecting the central portion 1840. As examples, the mirror 1802 may direct the peripheral portion 1842 of the primary light beam to different regions of the PL material 1844, or may cause the peripheral portion 1842 to bypass the PL material 1844.

Figure 19:
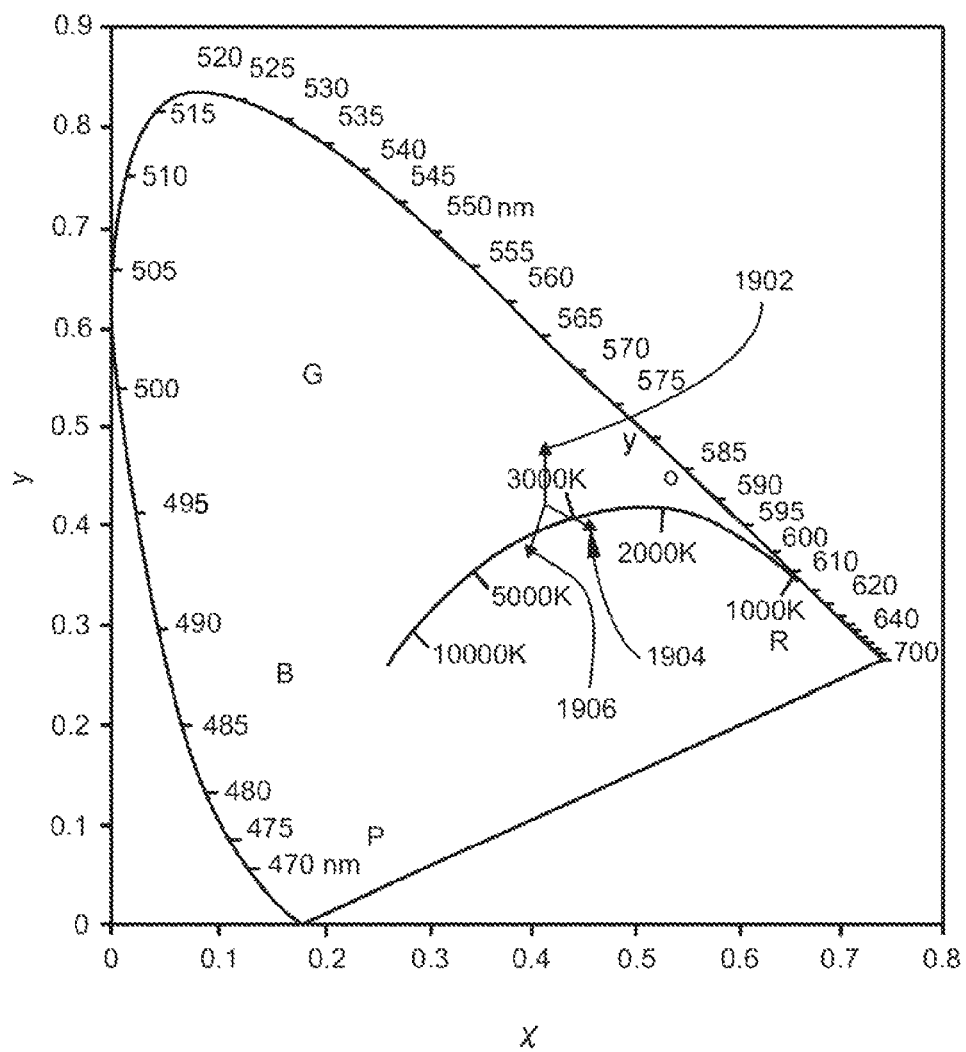
FIG. 19 is a representation of a CIE 1931 (x, y) chromaticity diagram illustrating the effects of color tuning a lighting device according to the present teachings.

FIG. 19 is a representation of a CIE 1931 (x, y) chromaticity diagram illustrating how color tuning according to implementations disclosed herein can affect the color of the output light produced by a lighting device. As appreciated by persons skilled in the art, the color space is bounded by the curved spectral locus shown in FIG. 19, which is indexed by wavelengths given in nanometers, and by the straight line that interconnects the two ends of the spectral locus. Red, green, blue, yellow, orange and purple regions of the color space are generally designated R, G, B, Y, O and P, respectively. The curved line in the color space is the Plankian locus, which is indexed by CCT values. For simplicity, isotherms (or lines of constant CCT) crossing the Plankian locus are not shown.

An arrow 1902 in FIG. 19 illustrates the impact of making an adjustment that increases the proportion of secondary emission from a green-emitting material targeted by an excitation light beam relative to other emissions and/or reflections of other wavelengths. Increasing green emission typically results in increasing the y chromaticity coordinate of the resultant output light of the lighting device. Another arrow 1904 illustrates the impact of making an adjustment that increases the relative proportion of secondary emission from a red-emitting material. Increasing red emission decreases CCT and increases the x chromaticity coordinate. Another arrow 1906 illustrates the impact of making an adjustment that increases the relative proportion of excitation light reflected from a reflective material such as a white material in a case where the light source is a blue emitter. Equivalently, the arrow 1906 illustrates the impact of making an adjustment that increases the relative proportion of secondary emission from a blue-emitting material responsive to a short-wavelength (UV or violet) light source. Either case increases blue emission, which increases CCT and decreases the x chromaticity coordinate. Various configurations entailing the use of two or more different modes of color tuning, and light converters having different patterns of luminescent and reflective materials, may be implemented to produce various other color tuning effects intermediate to the three examples just described. For a given configuration of a lighting device and associated color tuning device, a color tuning strategy may be selected so as to move the properties of the output light toward the Plankian locus, which allows greater control over CCT, CRI, and (x, y) values. Movement of the chromaticity toward the Plankian locus may entail increasing or decreasing the x chromaticity coordinate and/or increasing or decreasing the y chromaticity coordinate.

When evaluating the impact of a given configuration of the light converter and color tuning hardware and modality, SPD data may be acquired and utilized to calculate CRI, CCT, chromaticity coordinates, and/or distance from Plankian locus. Spectral measurements may be acquired by utilizing, for example, a spectroradiometer or a tristimulus colorimeter. The calculations may be done according to predefined standards or guidelines such as those promulgated by CIE or other entities, or according to a manufacturer's specifications, a customer's requirements, or a user's preference. Some or all calculations may be done by executing one or more different types of computer software programs. Moreover, the color tuning device may be configured so as enable a user to attain a specific, desired value of one or more color parameters. The desired value may fall within a range of values deemed acceptable for the color sought for the output light of a lighting device being manufactured. For example, the range may be a range of error or tolerance about a single desired value of a given color parameter (e.g., ±1%).

FIG. 20A is a side view of another example of a lighting device 2000 according to the present teachings. The lighting device 2000 includes a housing 2004 defining a housing interior and a reflective surface 2012 disposed in the housing interior. In the present example, the reflective surface 2012 is disposed on an inside surface of the housing 2004 whereby the housing interior serves as a reflective cavity.

The reflective surface 2012 may be diffusive such as by including one or more layers of nanofibers as described further below, or specular such as by including one or more mirrors. In the present example, the housing 2004 includes two housing sections 2016 adjoined at a common junction 2084 and generally oriented at an angle from each other on either side of a central axis or plane 2020. The housing sections 2016 may comprise a monolithic structure or may be separate structures joined together by any suitable means. The housing sections 2016 may be oriented symmetrically relative to the central axis 2020. In the illustrated example, the housing sections 2016 are planar structures oriented at a right angle. In other implementations the angle may be greater or less than ninety degrees. In still other implementations the housing sections 2016 may be curved. From the common junction 2084, the housing sections 2016 generally extend away from each other and terminate at a light exit 2024, which may or may not include an optical structure as noted previously. Depending on the shape of the housing sections 2016 at the light exit 2024, the cross-section of the light exit 2024 (in the plane orthogonally directed into the drawing sheet of FIG. 20A) may be polygonal (e.g., rectilinear) or rounded (e.g., oval or circular).

The lighting device 2000 further includes one or more primary light sources 2032 and light converters 2036. In the present example, the light converter 2036 is positioned by any suitable means along the central axis 2020. The light converter 2036 may extend up to the common junction 2084 or, as illustrated, may be separated from the common junction 2084 by a gap. The light converter 2036 may include a PL material or any suitable combination of different PL materials as described elsewhere in the present disclosure. Depending on the configuration, a layer of PL material(s) may be applied to each face of the light converter 2036, or the PL material(s) may be distributed throughout the bulk of the light converter 2036. In the illustrated example, two light sources 2032 are positioned by any suitable means on either side of the light converter 2036, and are oriented to direct respective primary light beams 2040 at the light converter 2036 at angles to the central axis 2020. By this configuration, primary light (solid arrows) strikes both sides of the light converter 2036 and from multiple angles or directions. As illustrated, some of the primary light is reflected from the light converter 2036 and passes through the light exit 2024 either directly or after being further reflected from the reflective surface 2012. Another portion of the primary light is shifted by the light converter 2036 to secondary light 2056. The secondary light (dashed arrows) emitted from the light converter 2036 passes through the light exit 2024 either directly or after being further reflected from the reflective surface 2012. The mixture of primary light and secondary light constitutes the output light produced by the lighting device 2000.

The lighting device 2000 further includes a color tuning device (not shown) that may be configured consistently with any of the implementations described herein. As examples, the color tuning device may be configured to move the light converter 2036 linearly along the central axis 2020, move the light converter 2036 rotationally in the plane of the central axis 2020, move the light sources 2032 toward or away from the light converter 2036, or modify the paths of the primary light beams 2040. Any of the color tuning modalities described herein may, for example, be utilized to change the relative areas of different PL materials irradiated by the primary light beams 2040, and/or to move a portion of the light converter 2036 out of the primary light beam path or cause a portion of the primary light beam 2040 to bypass the light converter 2036.

In some implementations the lighting device 2000, including the light converter 2036, may be elongated along a longitudinal axis as shown in the perspective view of FIG. 20B. In this case, multiple pairs of light sources 2032 may be provided along the longitudinal axis to irradiate adjacent regions of a common light converter 2036. The light sources 2032 may, for example, be supported by brackets 2018. A single color tuning device may be utilized to linearly translate the common light converter 2036. Alternatively, the light converter 2036 may include a series of light converter units arranged along the longitudinal axis, with each light converter unit irradiated by one or more pairs of light sources 2032. Multiple color tuning devices may be utilized to linearly translate or rotate respective light converter units.

Figure 21A:
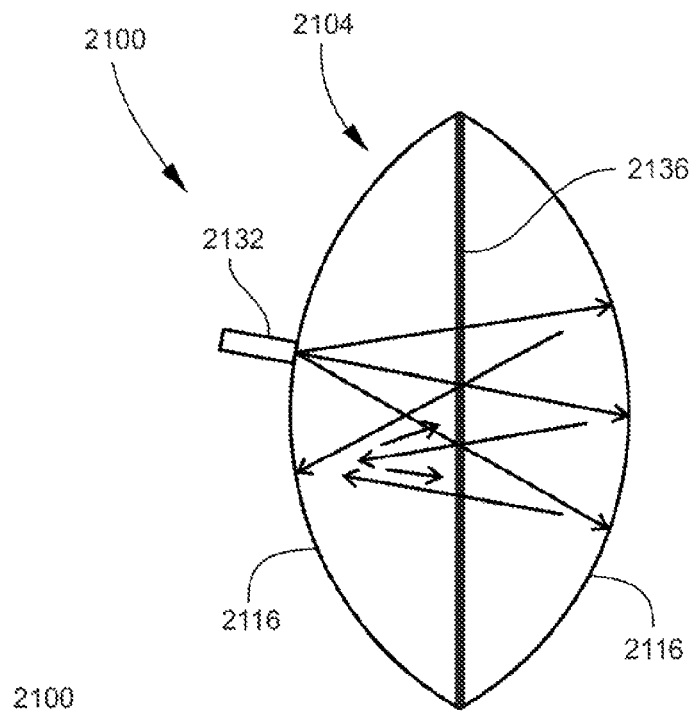
FIG. 21A is a top view of another example of a lighting device according to the present teachings.
Figure 21B:
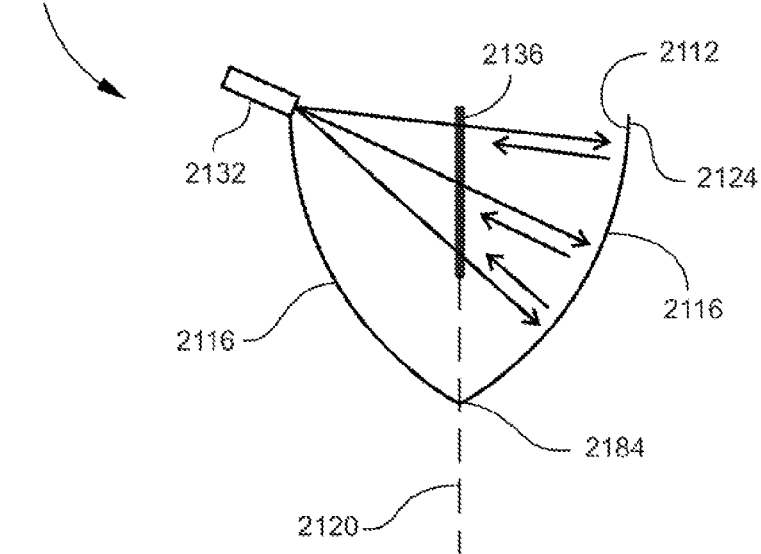
FIG. 21B is a side view of the lighting device illustrated in FIG. 21A.

FIGS. 21A and 21B are respective top and side views of another example of a lighting device 2100 according to the present teachings. The lighting device 2100 includes a housing 2104 defining a housing interior and a reflective surface 2112 disposed in the housing interior. In the present example, the reflective surface 2112 is disposed on an inside surface of the housing 2104 whereby the housing interior serves as a reflective cavity. The reflective surface 2112 may be diffusive such as by including one or more layers of nanofibers as described further below, or specular such as by including one or more mirrors. In the present example, the housing 2104 includes two housing sections 2116 adjoined at a common junction 2184 and generally oriented at an angle from each other on either side of a central axis or plane 2120. The housing sections 2116 may comprise a monolithic structure or may be separate structures joined together by any suitable means. The housing sections 2116 may be oriented symmetrically relative to the central axis 2120. In the illustrated example, the housing sections 2116 or at least their inside surfaces are curved structures. The curvature may be such that portions of the inside surface of each housing section 2116 face portions of the other housing section 2116 across the central axis 2120. The curvature of each housing section 2116, or of both housing sections 2116 collectively, may conform to or approximate a conic section (i.e., may be circular, elliptical, parabolic, or hyperbolic) or may have any other suitable curved profile. From the common junction 2184, the housing sections 2116 generally extend away from each other and terminate at a light exit 2124, which may or may not include an optical structure. Depending on the shape of the housing sections 2116 at the light exit 2124, the cross-section of the light exit 2124 may be oval as shown in FIG. 21A or may be more circular.

The lighting device 2100 further includes one or more primary light sources 2132 and light converters 2136. In the present example, a single light source 2132 is positioned by any suitable means at an angle to the central axis 2120, relative to both the plane of FIG. 21A as well as the plane of FIG. 21B. Also in this example, the light converter 2136 is positioned by any suitable means along the central axis 2120. Hence, the light source 2132 is not aimed normal to the light converter 2136, which may minimize absorption of back-reflected light into the light source 2132. The light source 2132 may be mounted to the housing 2104 as shown, or alternatively may be mounted in the housing interior or outside of the housing 2104. The light converter 2136 may extend up to the common junction 2184 or, as illustrated, may be separated from the common junction 2184 by a gap. The light converter 2136 may include a PL material or any suitable combination of different PL materials as described elsewhere in the present disclosure. In this example, the light converter 2136 is partially transparent to the primary light and to secondary light emitted by the PL material. Depending on the composition of the light converter 2136, the partial transparency may be the result of making the light converter 2136 optically thin. For example, a light converter 2136 constructed from nanofibers as described herein having a thickness ranging from 0.5 μm-20 μm may provide suitable transparency. By this configuration, most or all of the PL material has an opportunity to interact with incident primary light to produce secondary emissions. Moreover, the light converter 2136 emits secondary light from both sides even though only one side is irradiated by the primary light. Additionally, as shown in FIGS. 21A and 21B some of the primary light (solid arrows) may pass through the light converter 2136 without interacting and be reflected back to the light converter 2136 by the reflective surface 2112 lining the housing 2104, thereby having multiple opportunities to interact with the PL material or otherwise be scattered through the housing interior. For clarity, secondary emissions are not illustrated in FIGS. 21A and 21B.

Figure 21C:
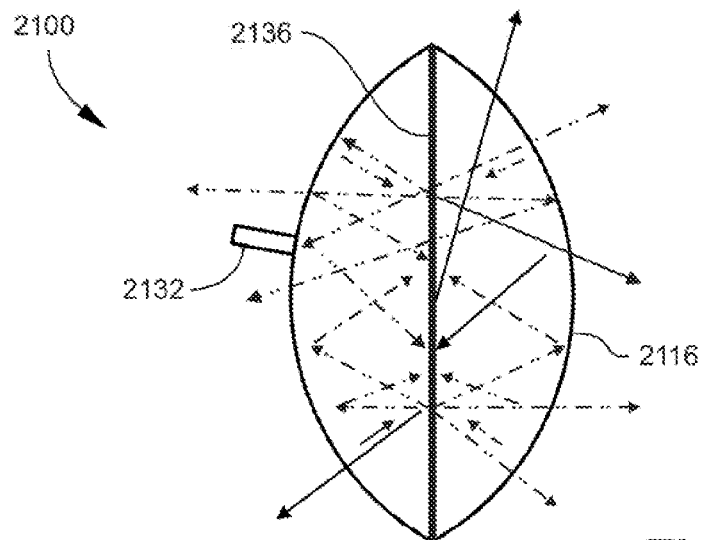
FIG. 21C is another top view of the lighting device similar to FIG. 21A, illustrating secondary light emitted from a light converter.
Figure 21D:
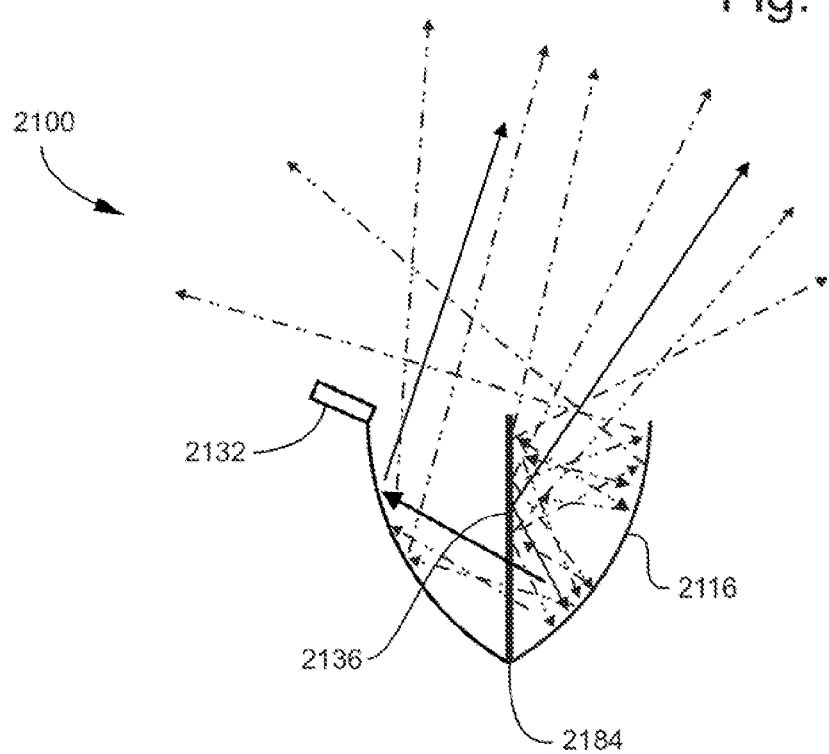
FIG. 21D is another side view of the lighting device similar to FIG. 21B, illustrating secondary light emitted from a light converter.

FIGS. 21C and 21D are respective top and side views of the lighting device 2100 similar to FIGS. 21A and 21B. FIGS. 21C and 21D do not show the primary light emitted from the light source 2132 that is directly incident on the light converter 2136. Instead, FIGS. 21C and 21D show primary light (solid arrows) passing through and scattered from the light converter 2136 without a change in wavelength, primary light (solid arrows) reflected from the reflective surface 2112, secondary light (dashed arrows) emitted from the light converter 2136, and secondary light (dashed arrows) reflected from the reflective surface 2112. Only secondary light emitted from the right side of the light converter 2136 is shown in FIGS. 21C and 21D so that light paths between the light converter 2136 and the junction 2184 of the housing sections 2116 are more clearly shown. In operation, some of the primary light may be reflected from the reflective surface 2112 and then pass through the light exit 2124 without encountering the light converter 2136. Unconverted primary light reflected from the light converter 2136 may pass through the light exit 2124 either directly from the light converter 2136 or after being further reflected from the reflective surface 2112. The secondary light emitted from the light converter 2136 passes through the light exit 2124 either directly or after being further reflected from the reflective surface 2112. The mixture of primary light and secondary light constitutes the output light produced by the lighting device 2100.

The lighting device of FIGS. 21A-21D further includes a color tuning device (not shown) that may be configured consistently with any of the implementations described herein. In implementations typical for this lighting device 2100, the color tuning device may be configured to move the light converter 2136 linearly along the central axis 2120 or move the light source 2132 toward or away from the light converter 2136, although other color tuning modalities described above may alternatively or additionally be utilized. Any of the color tuning modalities may be utilized to change the relative areas of different PL materials irradiated by the primary light beam, and/or to move a portion of the light converter 2136 out of the primary light beam path or cause a portion of the primary light beam to bypass the light converter 2136.

Figure 22A:
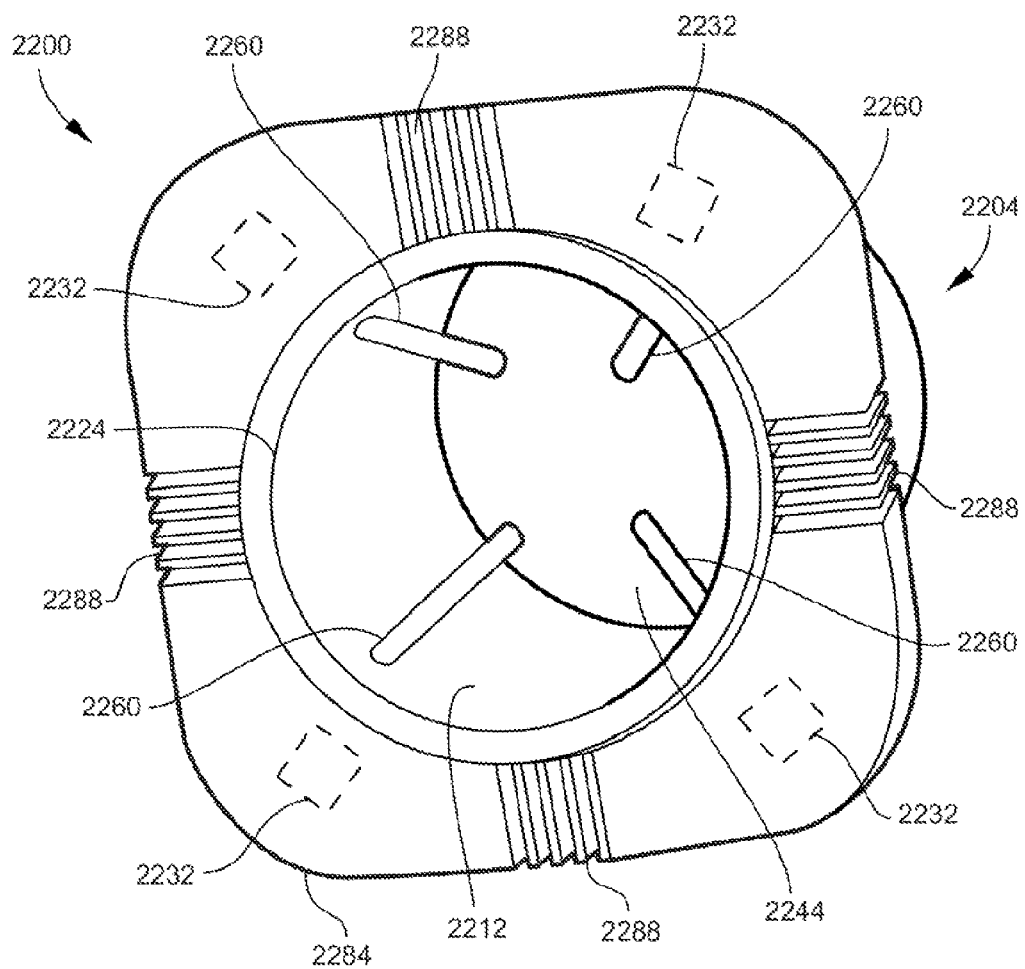
FIG. 22A is a perspective view of another example of a lighting device according to the present teachings.
Figure 22B:
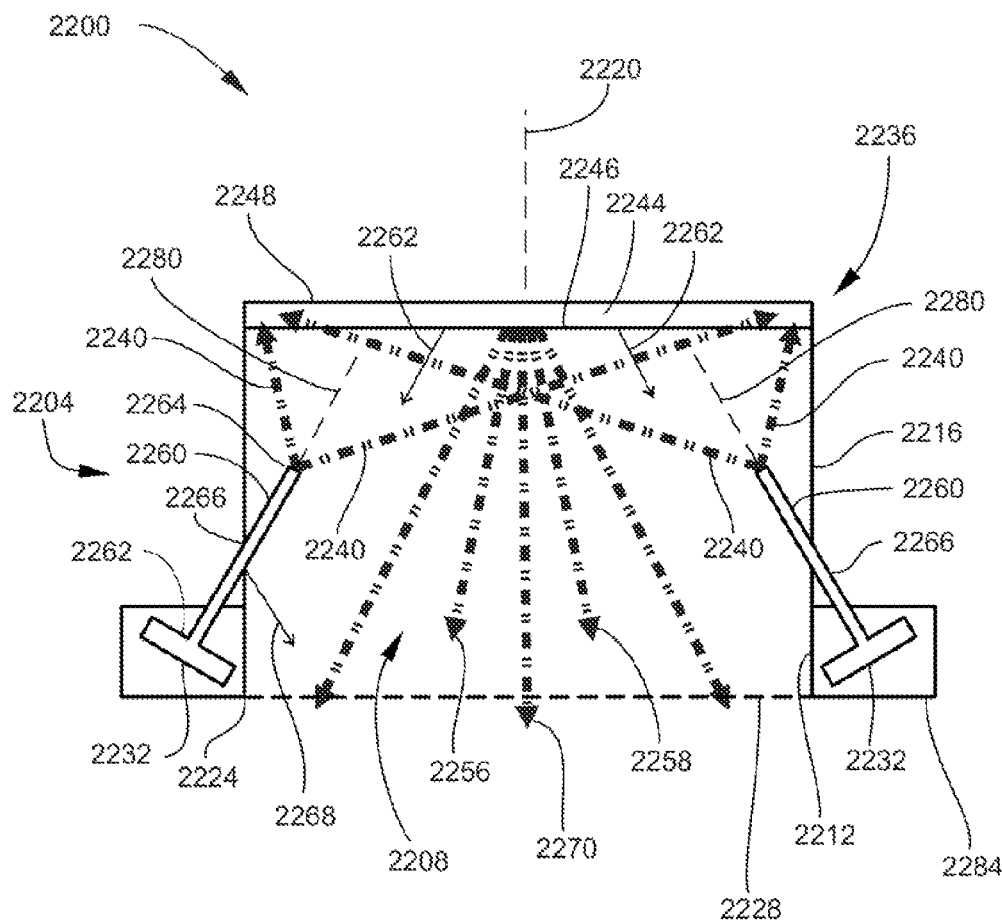
FIG. 22B is a cross-sectional view of the lighting device illustrated in FIG. 22A.

FIG. 22A is a perspective view of another example of a lighting device 2200 according to the present teachings, and FIG. 22B is a cross-section view of the lighting device 2200. The lighting device 2200 includes a housing 2204 surrounding a housing interior 2208, a light exit at one axial end (optionally with a light-transmitting structure), and a reflective surface 2212 disposed in the housing interior 2208. In some implementations, lighting device may be configured similar to that illustrated in FIG. 1A. Thus, the housing 2204 may include a substrate 2216 coaxial with a central axis 2220 passing through the housing interior 2208, and the reflective surface 2212 may be disposed on the substrate 2216. The reflective surface 2212 may be diffusive or specular. The reflective surface 2212 may be implemented as one or more layers of nanofibers as described further below. The lighting device 2200 further includes a primary light source 2232 (and associated electrical circuitry), a light converter 2236, and an optical waveguide 2260. The primary light beam emitted by the light source 2232 is schematically represented by arrows 2240. The light source circuitry may be configured to enable adjustment of the drive current to the light source 2232 and thus adjustment of the intensity of the primary light beam 2240. In the present implementation the primary light beam 2240 may have either a wide or narrow angle of divergence (e.g., cone-shape). In either case the photons of the primary light beam 2240 are collected by the optical waveguide 2260

Examples of optical waveguide structures and materials are described earlier in the present disclosure. The optical waveguide 2260 generally includes an input end 2262 and an output end 2264. The input end 2262 is optically coupled to the light source 2232 by any suitable means that minimizes or eliminates loss of electromagnetic energy. For example, the input end 2262 may be bonded to the light source 2232 by an optical adhesive, or fused to the light source 2232, and/or may be coated with a coating that matches the coating (e.g., silicone) of the light source 2232 to maximize transfer of light into the optical waveguide 2260. Depending on the angle of divergence of the light beam 2240 outputted from the light source 2232, a collimating lens (not shown) may be interposed between the light source 2232 and the input end 2262. In some implementations, the input end 2262 may surround the light source 2232 and may be shaped to collect emitted light effectively into the optical waveguide 2260. To facilitate collecting light from the lightsource 2232, the optical waveguide 2260 may include one or more reflective surfaces at the input end 2262. The body of the optical waveguide 2260 may be straight or may be bent or curved. The output end 2264 faces the housing interior 2208. By this configuration, the optical waveguide 2260 establishes a light path whereby the light beam 2240 generated by the light source 2232 is guided through the optical waveguide 2260, is emitted from the output end 2264, and propagates through the housing interior 2208 toward the light converter 2236. Depending on the design of the optical waveguide 2260, the optical waveguide 2260 may be flush with an interior surface of the housing 2204 (or with a reflective surface 2212 lining the interior surface), or may extend through a bore 2266 of the housing 2204 into the housing interior 2208 as best shown in FIG. 22B. The optical waveguide 2260 or at least its output end 2264 may be oriented at an angle to the central axis 2220, as also shown in FIG. 22B.

In the present example, the lighting device 2200 includes four light sources 2232 and corresponding optical waveguides 2260, only two of which are shown in FIG. 22B. The light sources 2232 and optical waveguides 2260 are circumferentially arranged about the central axis 2220, and may or may not be equally spaced from each other depending on the configuration of the light converter 2236. It will be appreciated that the number of light sources 2232 and optical waveguides 2260 may be less than or greater than four.

As analogously described above regarding the general direction of primary light emitted from light sources, each optical waveguide 2260 or at least its output end 2264 may be characterized as lying on a nominal output axis 2280 projecting from the output end 2264 directly to the light converter 2236 in a straight line. The angle of divergence of the primary light beam about this output axis 2280 may be either relatively wide or narrow. The optical waveguide 2260 may be configured such that the primary light beam 2240 diverges at a wide enough angle to irradiate all or substantially all of the side of the light converter 2236 facing the housing interior 2208 as illustrated in FIG. 22B, or alternatively only a desired portion of the light converter 2236. Depending on the scale of the lighting device 2200 and the axial distance between output end 2264 and the light converter 2236, a portion of the primary light beam 2240 from one or more of the optical waveguides 2260 may be directly incident on the reflective surface 2212 instead of on the light converter 2236.

In the present example, the light sources 2232 are located so as to direct the respective primary light beams 2240 into the optical waveguides 2260 without obstructing the propagation of light components through the housing interior 2208. For this purpose, the light sources 2232 may be mounted to a portion of the housing 2204 such as the housing substrate 2216, or may be suspended at positions outside the housing interior 2208 by any suitable means. In the specific example illustrated in FIGS. 22A and 22B, the light sources 2232 are mounted to an annular or flanged structure 2284 of the housing 2204 located outside the housing interior 2208. The annular structure 2284 may include individual heat sinks to which the respective light sources 2232 are mounted, or may be configured as a common heat sink for all light sources 2232 provided. In all such cases, the light sources 2232 do not obstruct any portion of the housing interior 2208. To facilitate the offset arrangement of the light sources 2232, the optical waveguides 2260 may be oriented such that their nominal output axes 2280 are at an angle to the central axis 2220. The light sources 2232 may be axially interposed between the light exit 2224 and the light converter 2236. Alternatively, the light sources 2232 may be axially located at or proximate to the light exit 2224. In the present example, the annular structure 2284 and thus the light sources 2232 are located at the light exit 2224. By this configuration, the annular structure 2284 may also be utilized as a mounting component for the lighting device 2200, particularly in recessed mounting applications. The annular structure 2284 may also include one or sets of cooling fins 2288 to provide additional heat transfer.

In the illustrated example, the light converter 2236 is mounted at the opposite axial end of the housing 2204. Alternatively, the light converter 2236 may be mounted within the housing interior 2208. The opposite axial end of the housing may include a structure 2248 that is (or is covered by) a reflective surface similar to the reflective surface 2212 located at the inside housing surface in this example. The light converter 2236 includes a PL material 2244. At least one luminescent surface or side 2246 of the PL material 2244 faces the housing interior 2208. Depending on its design, the PL material 2244 may be supported on or embedded in a suitable substrate to form one or more layers of PL material 2244, and/or specifically sized and shaped sections of PL material 2244, on the luminescent surface 2246. The light converter 2236 may be configured to be removable from the lighting device 2200 as noted earlier in the present disclosure. The substrate of the PL material 2244 may be reflective or at least partially light-transmitting. Moreover, the PL material 2244 may span the entire cross-section of the axial end of the housing 2204 as shown in FIG. 22B, or alternatively may span only a portion of the cross-section, in which case some of the primary light 2240 emitted from the optical waveguide(s) 2260 may bypass the PL material 2244 and be reflected from a reflective surface in the housing interior 2208.

The light converter 2236 may be configured in accordance with any of the implementations described herein. Thus, the light converter 2236 may include a combination of two or more different types of PL materials 2244, e.g., a first PL material and a second PL material, which emit secondary light at two respective wavelengths $\lambda_1$ and $\lambda_2$ as schematically represented by respective arrows 2256, 2258 in FIG. 22B. The different PL materials 2244 may be arranged in a desired pattern as described by examples elsewhere herein. Unconverted primary light reflected back from the light converter 2236 is schematically represented by other arrows 2262 in FIG. 22B.

The operation of the lighting device 2200 may be generally similar to that described above in conjunction with FIG. 1A. In implementations featuring multiple light sources 2232, each light source 2232 generates a respective primary light beam 2240 that is directed through the corresponding optical waveguide 2260 toward the light converter 2236. Depending on the configuration, all or a portion of each primary light beam 2240 is directly incident on the PL materials 2244, and/or another portion of the primary light beam 2240 may be directly incident on the reflective surface 2212. A portion of the primary light striking the reflective surface 2212 may be reflected toward the light exit 2224 as schematically represented by an arrow 2268. A mixture of the various light components emitted and/or reflected in the housing interior 2208 passes through the light exit 2224 as output light, as schematically represented by an arrow 2270. It will be understood that all arrows depicting light components in FIG. 22B have been arbitrarily positioned for illustrative purposes.

As noted above, one or more of the light sources 2232 may include circuitry or means for adjusting the intensity of the primary light beam 2240 emitted from one or more of the light sources 2232. It will be appreciated that when two or more different PL materials are provided with the light converter 2236, the pattern of the PL materials may be arranged in a manner optimal for this type of color tuning, in view of the position of the primary light beam 2240 relative to the PL materials. As an example in which the lighting device 2200 is configured to produce white output light 2270, the drive circuitry may be utilized to adjust the relative amount(s) of blue, green and/or red in the white output light 2270.

Alternatively or additionally, the lighting device 2200 may include a color tuning device (not shown) configured consistently with any of the implementations described herein. As examples, the color tuning device may be configured to move the light converter 2236 linearly along the central axis 2220, move the light converter 2236 rotationally in the plane of the central axis 2200, move the optical waveguides 2260 (or light sources 2232 and optical waveguides 2260) toward or away from the light converter 2236, or modify the paths of the primary light beams 2240 between the respective optical waveguides 2260 and the light converter 2236. Any of the color tuning modalities described herein may, for example, be utilized to change the relative areas of different PL materials irradiated by the primary light beams 2240, change the proportion of primary light reflected without conversion relative to primary light converted into secondary light, and/or to move a portion of the light converter 2236 out of the primary light beam path or cause a portion of the primary light beam 2240 to bypass the light converter 2236.

Figure 23:
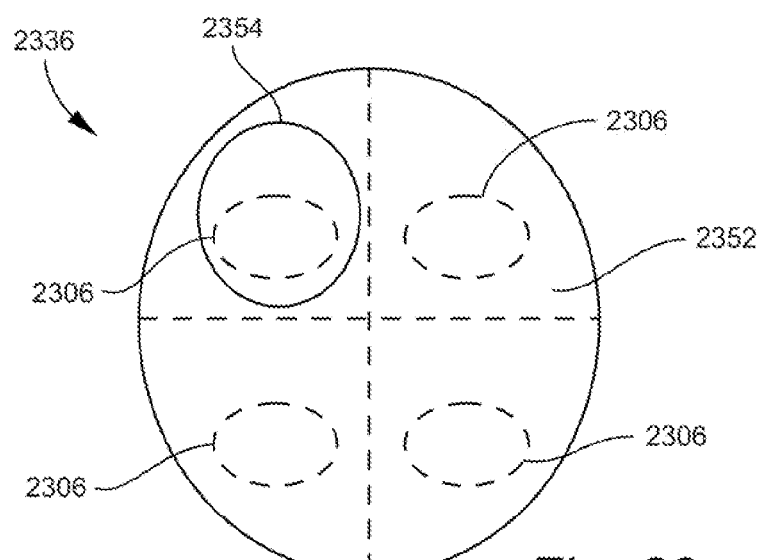
FIG. 23 is a plan view of another example of a light converter that may be utilized in one or more of the lighting devices described herein.

FIG. 23 is a plan view of another example of a light converter 2336 that may be utilized in conjunction with any of the lighting devices described herein. By way of example, the light converter will be described with reference to the lighting device illustrated in FIGS. 22A and 22B. The light converter 2336 includes a pattern of two different PL materials, i.e., a first PL material 2352 and a second PL material 2354. The pattern consists of a single section of the first PL material 2352 covering a large area of the light converter 2336 and a single section of the second PL material 2354 covering a smaller area of the light converter 2336. As one example, the first PL material 2352 may be applied to the entire area of the light converter 2336 and the second PL material 2354 may subsequently be applied as a layer on a desired portion of the first PL material 2352. When, for example, it is desired to produce white output light, the larger-area first PL material 2352 may be configured to provide intermediate-wavelength emissions that balance the majority of the short-wavelength light incident on the light converter 2336, while the smaller-area second PL material 2354 is configured to provide a longer-wavelength emission utilized for fine-tuning the color temperature of the output light. Accordingly, in one example the first PL material 2352 may be a green or yellow emitter and the second PL material 2354 may be a red or orange emitter.

A lighting device utilizing multiple light sources (and corresponding optical waveguides if provided) may be configured such that each primary light beam irradiates the entire area of the light converter 2336. The second PL material 2354 may be located and sized so as to obtain a desired amount of long-wavelength radiation in the output light. The amount of long-wavelength radiation may be adjusted by adjusting the output intensity of one or more of the light sources and/or by utilizing a color tuning device as described above.

In some implementations, the intensity of each primary light beam may be focused on a specific area of the light converter, such as by utilizing narrow-beam light sources or optical waveguides. FIG. 23 illustrates a configuration in which the area of the light converter 2336 is (at least conceptually) partitioned into four quadrants. Continuing with the example of FIGS. 22A and 22B where four primary light beams 2340 are directed toward the light converter 2336 at different angles, each of the four light sources 2332 (or corresponding optical waveguides 2360 if provided) may be aimed at a specific quadrant. Dashed ellipses in FIG. 23 depict central portions 2306 (as described above) of the respective primary light beams 2340 illuminating respective quadrants. In this example, the light source 2332 aimed at the second PL material 2354 may predominantly contribute to long-wavelength emissions from the light converter 2336, while the other three light sources 2332 aimed at different regions of the first PL material 2352 may predominantly contribute to intermediate-wavelength emissions from the light converter 2336. Hence, the primary light beam 2340 originating from the light source 2332 aimed at the second PL material 2354 will have a greater impact on the conversion of incident blue light into long-wavelength (e.g., red) light, and may be adjusted to adjust the amount of long-wavelength emissions relative to intermediate-wavelength emissions. In this case, the drive current fed to the light source 2332 generating the higher-impact primary light beam 2340 may be accurately adjusted so as to accurately adjust the amount of long-wavelength radiation in the output light 2370. Alternatively or additionally, a color tuning device may be utilized to adjust the distance between the light source 2232 (or associated optical waveguide 2260) and the second PL material 2354, or any other appropriate color tuning modality disclosed herein may be implemented. As a further alternative, one or more of the primary light beams 2240 aimed at the first PL material 2352 may be adjusted to adjust the amount of intermediate-wavelength emissions relative to long-wavelength emissions.

It will be appreciated that the light converter 2336 as patterned in FIG. 23 may also be utilized in conjunction with a single light source. Also, in FIG. 23 the shape of the section containing the second PL material 2354 is illustrated as being a circle. It will be appreciated, however, that this is one of many alternatives. The section of second PL material 2354 may have any rounded or polygonal shape, or may fill a part of or the entire quadrant as a circular sector. The second PL material 2354 may also extend into more than one quadrant.

Figure 24:
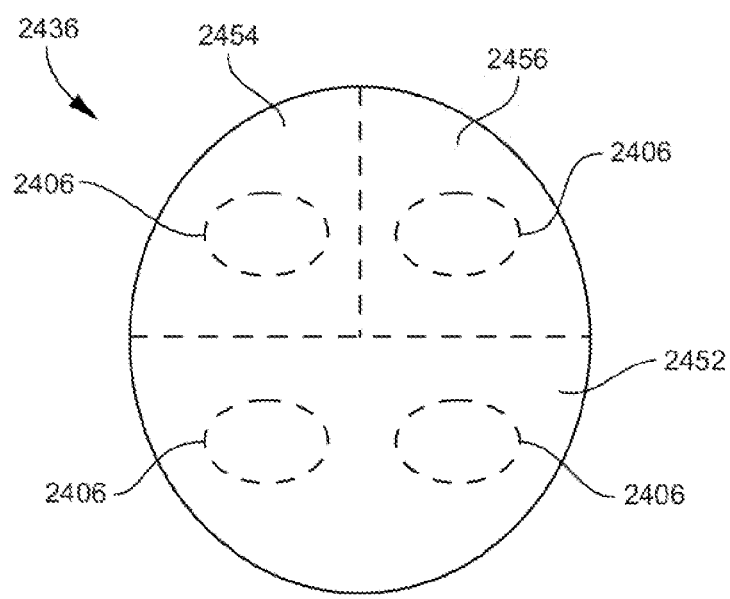
FIG. 24 is a plan view of another example of a light converter that may be utilized in one or more of the lighting devices described herein.

FIG. 24 is a plan view of another example of a light converter 2436 that may be utilized in conjunction with any of the lighting devices described herein. The light converter 2436 includes a pattern in which the lower half of the light converter 2436 is covered partially or entirely with a first material 2452, the upper left quadrant is covered partially or entirely with a second material 2454, and the upper right quadrant is covered partially or entirely with a third material 2456. The pattern in this implementation includes three different PL materials, or alternatively two different PL materials and a reflective material. Thus, in one example, a yellow- or green-emitting first material 2452 may be located at the lower half, a red-emitting second material 2454 may be located at the upper left quadrant, and a green- or yellow-emitting third material 2456 may be located at the upper right quadrant. In another example, the third material 2456 located in the upper right quadrant may be configured to emit short-wavelength radiation, whether by secondary conversion of a shorter-wavelength primary light beam incident thereon or by reflection of the primary light beam. For example, in the case of UV or violet light sources, the third material 2456 may be a blue-emitting PL material. In the case of blue light sources, the third material 2456 may be a reflective material. The reflective material may be an area of a reflective substrate on which no PL materials are provided, as in the example of a bare region of a nanofiber substrate. Alternatively, the reflective material may be a layer of white reflective material applied to the substrate, as described elsewhere in the present disclosure. FIG. 24 also illustrates central portions 2406 of primary light beams emitted directly from respective light sources or from respective optical waveguides (if provided), similar to the example of FIG. 23. One or more of the corresponding light sources may be adjusted to adjust the color of the output light and/or a color tuning device may be utilized, as described above. It will be appreciated that the light converter as patterned in FIG. 24 may also be utilized in conjunction with a single light source.

According to some implementations, the reflective materials and/or PL materials utilized in any of the lighting devices taught herein may be based on nanofiber substrates formed from a plurality of nanofibers. FIGS. 25A and 25B are schematic views of a nanofiber 2508 or portion thereof. A plurality of such nanofibers 2508 may be collected and formed into a nanofiber substrate. In some implementations, luminescent (or luminescent and reflective) particles may thereafter be applied to the nanofiber substrate in layers and/or sections as described above. Some particles 2512 may be supported directly on outer surfaces of the nanofibers 2508 as shown in FIG. 25B. In such implementations, these nanofibers 2508 may be located at the substrate surface or also in an upper region of the nanofiber substrate. In some implementations, the average diameter of the luminescent particles 2512 is smaller than the average diameter of the nanofiber 2508.

In alternative implementations, certain particles 2512 may be added to the nanofiber precursor and thus included with the as-formed nanofibers 2508 to form a base PLN composite. In these implementations, FIG. 25A illustrates a case in which particles 2512 are disposed in the bulk of the nanofiber 2508, and FIG. 25B illustrates a case in which particles 2512 are disposed on the nanofiber 2508. In the present context, an arrangement of particles 2512 "disposed on" the nanofiber 2508 encompasses particles 2512 disposed on an outer surface of the nanofiber 2508, and/or particles 2512 disposed at least partially in an outer region of the nanofiber 2508 and protruding from the outer surface. When the particles 2512 are luminescent and supported directly by nanofibers 2508 as illustrated in FIG. 25A or 25B, the resulting fibers may be referred to as luminescent fibers or light-stimulable fibers.

Figure 26:
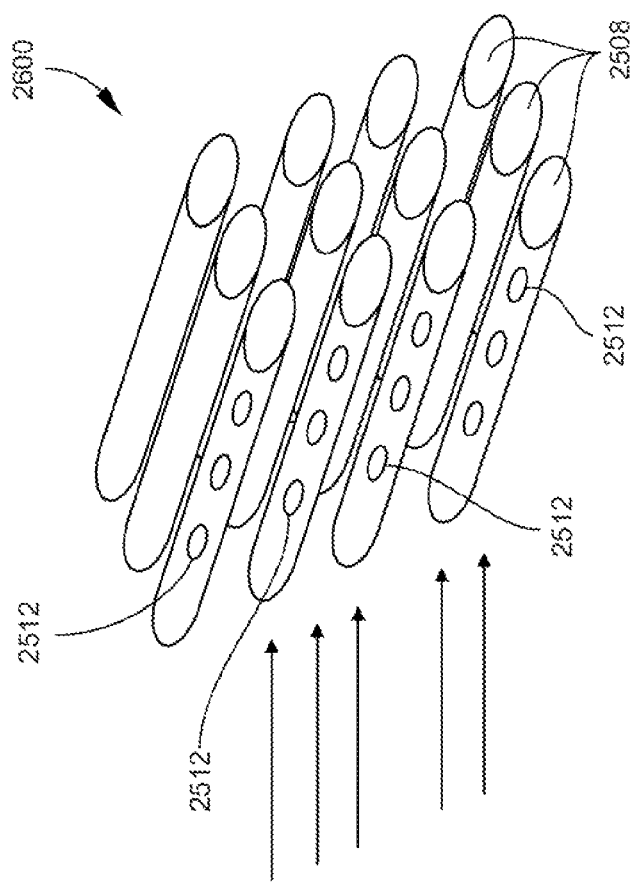
FIG. 26 is a schematic view of the nanofiber substrate formed with the fibers illustrated in FIG. 25A and/or FIG. 25B according to the present teachings.

FIG. 26 is a schematic view of an example of a nanofiber substrate 2600 (or portion of a nanofiber substrate 2600) formed from a plurality of nanofibers 2508. The nanofiber substrate 2600 may be structured as a nonwoven mat. In some implementations, the nanofiber substrate 2600 may be considered as including one or more layers of nanofibers 2508. When utilized as a PL material (a "PLN composite" or "PLN substrate"), the nanofiber substrate 2600 may support one or more layers of particles and/or may include luminescent fibers structured as shown in either FIG. 25A or FIG. 25B or a combination of both types of luminescent fibers shown in FIG. 25A and FIG. 25B.

As a bulk property, the nanofiber substrate 2600 may be considered to function as an optical scattering center for incident light. Light scattering from the nanofibers 2508 is believed to depend on the wavelength λ of the light, the diameter of the nanofibers 2508, the orientation of the nanofibers 2508 relative to the incident light, the surface morphology of the nanofibers 2508, and the refractive index of the nanofibers 2508. In some implementations, polymer nanofibers 2508 have refractive indices ranging from 1.3 to 1.6. Incident light may be scattered by the nanofibers 2508 and interact with particles 2512 supported by the nanofiber substrate 2600 or incorporated with the nanofibers 2508. Each nanofiber 2508 may provide an individual scattering site for light incident thereon. Moreover, the nanofiber substrate 2600 may serve as a medium for effectively (and temporarily) capturing, trapping or confining photons of the incident light. These attributes increase the probability of interaction between the particles 2512 and incident light. Hence, when utilized as a light converter or a color tuning material, the PLN substrates taught herein more efficiently capture excitation photons and re-radiate photons at visible wavelengths with higher intensities than would be possible with conventional, non-fibrous light converters. The superior performance of the nanofiber substrate 2600 over a comparative polymer solid film—both samples containing a uniform dispersion of the same type of luminescent QDs and an equal number of QDs—has been verified by testing as disclosed in U.S. Patent Application Pub. No. 2008/0113214.

In some examples, the nanofibers 2508 of the nanofiber substrate 2600 may have an average fiber diameter ranging from 10 to 5,000 nm; in other examples ranging from 100 to 2,000 nm; in other examples ranging from 300 to 2,000 nm; and in other examples ranging from 400 to 1,000 nm. The nanofibers 2508 may be fabricated such that their average fiber diameter is comparable to a wavelength λ of interest, such as that of the primary light emitted from a light source intended to irradiate the nanofiber substrate 2600. Sizing the nanofibers 2508 in this manner helps to provide scattering sites within the structure of the nanofiber substrate 2600 for the primary light or other wavelength λ of interest. For example, the wavelength λ of interest may range from 100 to 2,000 nm, or in a more specific example may range from 400 to 500 nm (e.g., a blue-emitting light source), or may fall within the shorter wavelength ranges corresponding to violet and UV light sources. The nanofiber substrate 2600 may be more effective in capturing photons having the shorter wavelengths typically utilized for excitation in that, on average, shorter-wavelength light may propagate through the nanofiber substrate 2600 over a longer optical path length (OPL).

For example, a typical excitation wavelength is blue light at 450 nm. To produce white light, the lighting device would need to emit radiation over a broad range of wavelengths, for example from 450 nm to 750 nm. By fabricating a nanofiber substrate 2600 in which the average diameter of the nanofibers 2508 is roughly the same as that of the excitation wavelength (e.g., 450 nm), the excitation light can be effectively trapped in the structure of the nanofiber substrate 2600 by light scattering (i.e., the OPL of the excitation light is long). This increases the likelihood that the excitation source will initiate fluorescence of the luminescent particles 2512 on or in the nanofiber substrate 2600 sufficient to cause the lighting device to produce white light that is uniform and has a balanced spectral power distribution. In contrast to the excitation light, the longer wavelength emissions produced by fluorescence may be scattered less effectively by the nanofibers 2508 and thus be more likely to emerge from the nanofiber substrate 2600 with minimal scattering. Under these conditions, the light scattering/photonic properties as a function of wavelength and fiber diameter are improved.

Figure 27:
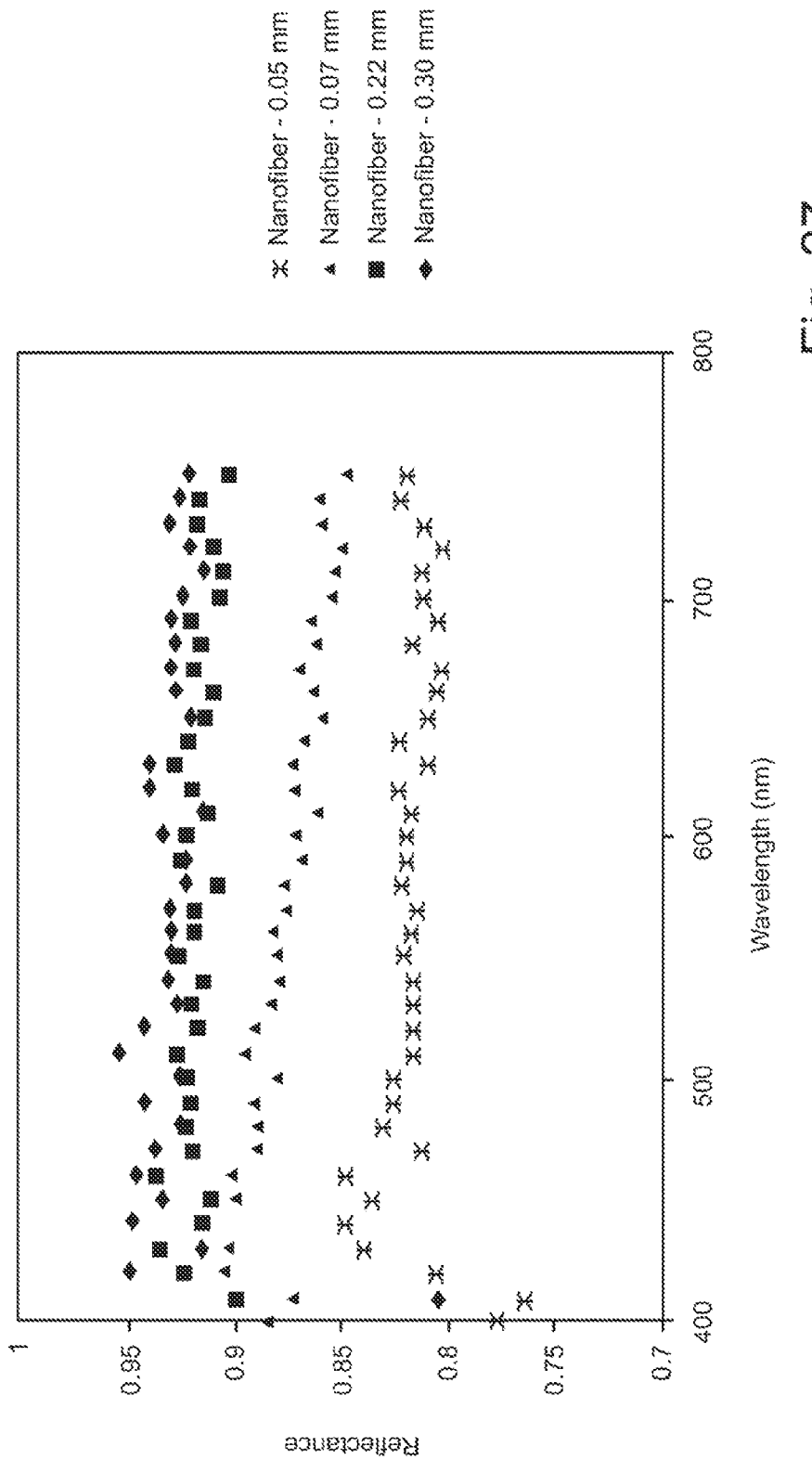
FIG. 27 provides reflectance data measured as a function of wavelength for four samples of nanofiber substrates of different thicknesses.

Additionally, the thickness of the nanofiber substrate 2600 may be selected to control the degree to which the nanofiber substrate 2600 is reflective of or (partially) transparent to light at wavelengths of interest. Generally, increasing thickness increases reflectivity and decreasing thickness increases transparency. In some examples, the thickness of the nanofiber substrate 2600 ranges from 0.1 to 2,000 µm. Thicknesses below 0.1 µm or above 2,000 µm are also encompassed by the present teachings, although an overly thin substrate 2600 may not be as effective at capturing incident excitation light while an overly thick substrate 2600 may promote too much scattering away from the particles 2512. In other examples, the thickness of the nanofiber substrate 2600 ranges from 1 to 500 µm. In some implementations, a thickness of greater than 5 µm will render the nanofiber substrate 2600 sufficiently diffusively reflective of light over the range of visible wavelengths processed by the lighting devices taught herein (i.e., primary light, secondary light, and auxiliary light). In some examples, the nanofiber substrate 2600 reflects greater than 80% of visible light. In other examples, the nanofiber substrate 2600 reflects greater than 90% of visible light, and may reflect almost 100% of visible light. FIG. 27 provides reflectance data measured as a function of wavelength for four samples of nanofiber substrates of different thicknesses (0.05 mm, 0.07 mm, 0.22 mm, and 0.30 mm). FIG. 27 demonstrates that reflectance of relatively thick nanofiber substrates may approach or exceed 95% over a broad spectrum of wavelengths. On the other hand, at thicknesses less than 5 μm the nanofiber substrate 2600 may be transparent to visible light of various wavelengths to an appreciable degree.

The nanofiber substrate 2600 may be fabricated by a variety of techniques. In some implementations, the method entails forming nanofibers 2508 of a controlled diameter by a technique such as electro spinning, extrusion, drawing, melt blowing, flash spinning, splitting/dissolving of bicomponent fibers, phase separation, solution spinning, template synthesis, or self-assembly. The method for fabricating the nanofiber substrate 2600 may be included as part of the methods described herein for fabricating color tuning materials and/or PL materials utilized as light converters.

In some advantageous implementations, the nanofibers 2508 are formed by an electrospinning technique. As appreciated by persons skilled in the art, a typical electrospinning apparatus may generally include a source (e.g., reservoir) of a polymer solution or melt utilized as a precursor to the nanofibers 2508. Various mixtures of polymers, solvents and additives may be utilized. The solvents may be organic or inorganic. Examples of solvents include, but are not limited to, distilled water, dimethylformamide, acetic acid, formic acid, dimethyl acetamide, toluene, methylene chloride, acetone, dichloromethane, combinations of the foregoing, one or more of the foregoing in combination with other solvents, or other suitable solvents. Additives may include viscosifiers, surfactants and the like. The polymer solution is flowed by any suitable means (e.g., a pump) to an electrospinning element (e.g., a head, needle, etc.). A positive electrode of a high-voltage power supply may be connected to the tip of the electrospinning element. The electrospinning element may be positioned at a specified distance from a metallic collector plate, which typically is electrically grounded. The electrospinning element and the collector plate may be located in a chamber configured to enable control over various processing conditions such as composition of gases, partial pressures, temperature, electrical field distribution, etc. With flow of the polymer solution at a specified flow rate established to the electrospinning element and a voltage of a specified magnitude applied to the electrospinning element, polymer nanofibers are drawn from the electrospinning element and accumulate as a nonwoven substrate on the collector plate. As appreciated by persons skilled in the art, the optimum operating parameters of the electrospinning apparatus (e.g., flow rate, voltage, distance between electrospinning element and collector plate, etc.) will depend on the composition of the nanofibers to be produced.

The general design, theory and operation of this type of electrospinning apparatus is known to persons skilled in the art and thus need not be described in detail herein. Some examples of suitable electrospinning apparatus and associated electrospinning-based techniques for forming nanofibers include those disclosed in U.S. Patent Application Pub. No. 2005/0224998; U.S. Patent Application Pub. No. 2005/0224999; U.S. Patent Application Pub. No. 2006/0228435; U.S. Patent Application Pub. No. 2006/0264140; U.S. Patent Application Pub. No. 2008/0110342; U.S. Patent Application Pub. No. 2008/0113214; International Pub. No. WO 2009/032378; and PCT Application No. PCT/US2010/031058.

In some implementations, electrospinning or other fiber-forming techniques may be utilized to produce a nanofiber substrate 2600 containing fibers of two or more average diameters. Fibers of different diameters may be mixed throughout the bulk of the nanofiber substrate 2600, or larger-diameter fibers may be located at one face of the nanofiber substrate 2600 while smaller-diameters are located at the opposite face. Fiber diameter may be graded through the thickness of the nanofiber substrate 2600.

In typical implementations, the nanofibers 2508 of the nanofiber substrate 2600 are polymers. Examples of suitable polymers include, but are not limited to, acrylonitrile/butadiene copolymer, cellulose, cellulose acetate, chitosan, collagen, DNA, fibrinogen, fibronectin, nylon, poly(acrylic acid), poly(chloro styrene), poly(dimethyl siloxane), poly (ether imide), poly(ether sulfone), poly(ethyl acrylate), poly (ethyl vinyl acetate), poly(ethyl-co-vinyl acetate), poly(ethylene oxide), poly(ethylene terephthalate), poly(lactic acid-co-glycolic acid), poly(methacrylic acid) salt, poly(methyl methacrylate), poly(methyl styrene), poly(styrene sulfonic acid) salt, poly(styrene sulfonyl fluoride), poly(styrene-co-acrylonitrile), poly(styrene-co-butadiene), poly(styrene-co-divinyl benzene), poly(vinyl acetate), poly(vinyl alcohol), poly(vinyl chloride), poly(vinylidene fluoride), polyacrylamide, polyacrylonitrile, polyamide, polyaniline, polybenzimidazole, polycaprolactone, polycarbonate, poly(dimethylsiloxane-co-polyethyleneoxide), poly(etheretherketone), polyethylene, polyethyleneimine, polyimide, polyisoprene, polylactide, polypropylene, polystyrene, polysulfone, polyurethane, poly(vinylpyrrolidone), proteins, SEBS copolymer, silk, and styrene/isoprene copolymer.

Additionally, the nanofibers 2508 may include a polymer blend. If electrospinning is to be implemented, the two or more polymers should be soluble in a common solvent or in a system of two or more appropriately selected solvents. Examples of suitable polymer blends include, but are not limited to, poly(vinylidene fluoride)-blend-poly(methyl methacrylate), polystyrene-blend-poly(vinylmethylether), poly(methyl methacrylate)-blend-poly(ethyleneoxide), poly (hydroxypropyl methacrylate)-blend-poly(vinylpyrrolidone), poly(hydroxybutyrate)-blend-poly(ethylene oxide), protein-blend-polyethyleneoxide, polylactide-blend-polyvinylpyrrolidone, polystyrene-blend-polyester, polyester-blend-poly(hyroxyethyl methacrylate), poly(ethylene oxide)-blend-poly(methyl methacrylate), and poly(hydroxystyrene)-blend-poly(ethylene oxide).

As noted above, in some implementations luminescent and/or reflective particles may be provided with the nanofibers 2508 prior to the nanofiber substrate 2600 being formed. In this manner light-stimulable fibers are formed, which thereafter may be collected and formed into a light-stimulable nanofiber substrate 2600. In one implementation, the particles 2512 may be applied (added) to the polymer solution supplied to the electrospinning apparatus and thus are discharged with the polymer matrix during electrospinning. The ratio of polymer to luminescent compound in the solution may typically range from 2:1 to 100:1. The large surface area of the nanofibers 2508 may be sufficient to prevent agglomeration of the particles 2512, although additional steps may be taken to inhibit agglomeration such as including de-agglomerating additives in the polymer/particle matrix, or other techniques disclosed in one or more of the references cited in the present disclosure. In another implementation, the particles 2512 are applied to an as-forming nanofiber (which at this stage may be in the form of a liquid jet, filament, proto-fiber, etc.) while the nanofiber is being electrospun and/or coalescing into a resultant fiber mat or substrate 2600. In this case, the particles 2512 may be transported to the as-forming nanofibers before they are dried by any suitable technique. In one advantageous implementation, a particle-inclusive solution is discharged from an electrospray apparatus positioned between the electrospinning element and the collector plate. The position of the electrospay apparatus may be selected to control the extent of penetration of the particles 2512 into the nanofiber 2508, thereby dictating whether the particles 2512 become embedded in the bulk of the nanofiber 2508 (e.g., FIG. 25A) or disposed on the outer surface of the nanofiber 2508 (e.g., FIG. 25B). The electrospray apparatus may be effective in inhibiting agglomeration of the particles 2512.

In other implementations, the particles 2512 are applied after electrospinning, i.e., after the nanofibers 2508 have been formed into a nanofiber substrate 2600, by the various coating, printing and other methods described earlier in the present disclosure.

As noted previously, the particles 2512 may be luminescent particles such as QDs, phosphors, nano-phosphors, organic dyes, or combinations of two or more of the foregoing. Reflective particles may also be included, such as barium sulfate, titanium (IV) oxide, alumina, zinc oxide, Teflon®, and combinations of two or more of the foregoing.

Examples of light-emitting QDs include, but are not limited to, silicon, germanium, indium phosphide, indium gallium phosphide, cadmium sulfide, cadmium selenide, lead sulfide, copper oxide, copper selenide, gallium phosphide, mercury sulfide, mercury selenide, zirconium oxide, zinc oxide, zinc sulfide, zinc selenide, zinc silicate, titanium sulfide, titanium oxide, and tin oxide. In certain specific examples, QDs found to be particularly suitable include CdSe, InGaP, InP, GaP, and ZnSe. More generally, the QDs are typically composed of inorganic semiconductor materials selected from various Group II-VI, Group I-III-VI, Group III-V, Group IV, Group IV-VI, and Group V-VI materials. For some implementations, the QDs utilized may be selected from a class specified as being heavy metal-free (or restricted metal-free) QDs. Heavy metal-free QDs do not include heavy metals such as cadmium, mercury, lead, hexavalent chromium, or the like.

As other examples, QDs having the following compositions may be found to produce suitable secondary emissions of desired wavelengths in response to excitation of primary light of the wavelengths contemplated herein: Group II-VI materials such as ZnS, ZnSe, ZnTe, ZnO, CdS, CdSe, CdTe, CdO, HgS, HgSe, HgTe, HgO, MgS, MgSe, MgTe, MgO, CaS, CaSe, CaTe, CaO, SrS, SrSe, SrTe, SrO, BaS, BaSe, BaTe, and BaO; Group I-III-VI materials such as $CuInS_2$, $Cu(In,Ga)S_2$, $CuInSe_2$, and $Cu(In,Ga)Se_2$; Group III-V materials such as MN, AlP, AlAs, AlSb, GaN, GaP, GaAs, GaSb, InN, InP, InAs, and InSb; Group IV materials such as Si, Ge, and C; Group IV-VI materials such as GeSe, PbS, PbSe, PbTe, PbO, SnSe, SnTe, and SnS; and Group V-VI materials such as $Sb_2Te_3$, $Bi_2Te_3$, and $Bi_2Se_3$. Transition metal compounds such as the oxides, sulfides, and phosphides of Fe, Ni, and Cu may also be applicable. Examples of QDs further encompass binary, ternary, quaternary, etc. alloys or compounds that include the foregoing species (e.g., SiGe, InGaAs, InGaN, InGaAsP, AlInGaP, etc.). Other QDs may include other types of semiconducting materials (e.g., certain organic and polymeric materials). For a QD having a core-shell structure, the shell may be composed of one of the foregoing species or other species, and the respective compositions of the core and the shell may be different. An example of a core-shell composition is CdSe—ZnS capped with organic ligands such as trioctylphosphine oxide (TOPO). Such core-shell structures are commercially available from Evident Technologies, Inc., Troy, N.Y.

As appreciated by persons skilled in the art, the composition selected for the QDs may be based on a desired property such as band gap energy or wavelength sensitivity. Moreover, the size or shape of the QDs may be selected to absorb or emit a desired wavelength of electromagnetic radiation when integrated with a nanofiber substrate or applied as a layer to other types of substrates. Generally for a given species of QD below a critical size, smaller sizes have larger band gaps and emit radiation at shorter (bluer) wavelengths while larger sizes have smaller band gaps and emit radiation at longer (redder) wavelengths. For example, CdSe nanoparticles of 2.8 nm nominal diameter emit green light at roughly 530 nm, whereas CdSe nanoparticles of 5.0 nm nominal diameter emit red light at roughly 625 nm. Additionally, the QDs utilized may include QDs of two or more different species (compositions) and/or two or more different specific sizes, as for example when fabricating a pattern of different PL materials. For example, a mixture or pattern of two or more different QDs may be selected so that the QDs emit different bands of visible electromagnetic radiation. Alternatively or additionally, more than one distinct QD layer or region of QDs may be provided, each having a different composition or size of QDs.

The QDs may be formed by various known techniques such as, for example, colloidal synthesis, plasma synthesis, vapor deposition, epitaxial growth, and nanolithography. The size, size distribution, shape, surface chemistry or other attributes of the QDs may be engineered or tuned to have desired properties (e.g., photon absorption and/or emission) by any suitable technique now known or later developed. In some implementations, QDs are provided in a solution of an organic carrier solvent such as anisole, octane, hexane, toluene, butylamine, etc., or in water, and with or without a matrix or host material, and are deposited to a desired thickness by any of the techniques disclosed herein. Alternatively, the QDs may be dispersed to a desired density or concentration in a matrix material, which may be composed of a polymer, sol-gel or other material that can easily form a film on the underlying target surface. Generally, the matrix material selected is one that does not impair luminescence or other desired performance parameters of the QDs.

Examples of phosphors and nano-phosphors include, but are not limited to, the following groups:

1. Rare-earth doped metal oxides such as $Y_2O_3$:Tb, $Y_2O_3$:$Eu^{3+}$, $Lu_2O_3$:$Eu^{3+}$, $CaTiO_3$:$Pr^{3+}$, CaO:$Er^{3+}$, (GdZn)O:$Eu^{3+}$, $Sr_4Al_{14}O_{25}$:$Eu^{3+}$, $GdMbB_3O_{10}$:$Ce^{3+}$:$Tb^{3+}$, and $CeMgAl_{11}O_{19}$:$Ce^{3+}$:$Tb^{3+}$;

2. Metal sulfides such as CaS:$Eu^{2+}$, $SrGa_2S_4$:Eu, and $Ca_wSr_xGa_y(S,Se)_z$:Eu such as those described in U.S. Pat. No. 6,982,045 and commercially available from PhosphorTech (Lithia Springs, Ga.).

3. Rare-Earth doped yttrium aluminum garnet (YAG) such as YAG:$Ce^{3+}$;

4. Metal silicates such as $Ca_3(Sc,Mg)_2Si_3O_{12}$:Ce $(Ba,Sr)_2SiO_4$:Eu, and rare-Earth doped silicates including Eu-doped silicates;

5. Rare-earth doped zirconium oxide such as $ZrO_2$:$Sm^{3+}$ and $ZrO_2$:$Er^{3+}$;

6. Rare-earth doped vanadate ($YVO_4$:Eu) and phosphate $(La,Ce,Tb)PO_4$;

7. Doped materials consisting of a host matrix (e.g., $Gd_2O_3$, $GdO_2S$, PbO, ZnO, ZnS, ZnSe) and a dopant (Eu, Tb, Tm, Cu, Al and Mn); and 8. Metal-doped forms of zinc sulfide and zinc selenide (e.g., ZnS:$Mn^{2+}$, ZnS:$Cu^+$, $Zn_{0.25}Cd_{0.75}S$:AgCl).

Other examples of phosphors that may be suitable may be found in W. M. Yen, S. Shionoya, and H. Yamamoto, Phosphor Handbook, Second Ed., the entire contents of which are incorporated by reference herein. In certain specific examples, phosphors found to be particularly suitable include rare-earth doped YAG, doped metal sulfides including doped ZnS and doped $SrGa_2S_4$, doped ZnSe, and doped silicates such as those available from Intematix of Fremont, Calif.

Phosphors are typically provided in aqueous dispersions and may include a polymeric binder as well as any of the additives noted above. Generally, phosphors may be applied to underlying substrates or particle layers by employing the same coating, printing and other techniques as for QDs.

Examples of organic dyes include, but are not limited to, various proteins and small molecules that exhibit fluorescence; fluorophores, such as resonance dyes like fluoresceins, rhodamines; most 4,4'-difluoro-4-bora-3a,4a-diaza-s-indacenes (BODIPY dyes); most cyanines; and charge transfer dyes (emission from intramolecular charge transfer transitions) such as coumarins.

As described above, a PL material as taught herein may include a combination (e.g., a blend, pattern, etc.) of QDs, phosphors, nano-phosphors and/or dyes, including a distribution of different sized particles of one or more of the foregoing classes of luminescent materials, to provide secondary emission of two or more different wavelengths. For instance, a PL material may include green-emitting phosphors and red-emitting QDs. A combination of luminescent particles may be selected such that, in further combination with the wavelength of the portion of the primary light emitted by the light source that is included in the output light of the lighting device, the output light has a broad-spectrum composition of wavelengths approaching that of a black-body radiator and accordingly characterized by a CRI value approaching 100.

Table 2 below provides some non-limiting examples of combinations of light sources and luminescent materials found to be suitable for producing white light in lighting devices such as those disclosed herein:

TABLE 2

| Example | Light source | PL material |
|---|---|---|
| 1 | Blue LED, 450-460 nm | CdSe/ZnS core-shell QDs (Evident Technologies), particle diameter 2.6-3.2 nm, yellow emission, |
| 2 | Blue LED, 450-460 nm | CdSe/ZnSe core-shell QDs (Evident Technologies): particle diameter 2.4 nm, green emission; And particle diameter 5.2 nm, red emission |
| 3 | Violet LED, 408 nm | CdSe/ZnSe core-shell QDs (Evident Technologies) particle diameter 1.9 nm, blue emission; And particle diameter 2.4 nm, green emission; And particle diameter 5.2 nm, red emission |
| 4 | UV LED, 350-370 nm | CdSe/ZnSe core-shell QDs (Evident Technologies) particle diameter 1.9 nm, blue emission; And particle diameter 2.4 nm, green emission; And particle diameter 5.2 nm, red emission |
| 5 | Blue LED, 450-470 nm | Sulfoselenide phosphor (PhosphorTech Corp., Lithia Springs, GA), green emission; And Red-emitting QDs |
| 6 | Blue LED, 450-470 nm | Eu-doped silicate phosphor (Intematix Corp., Fremont, CA), green emission; And Red-emitting QDs |
| 7 | Blue LED, 450-470 nm | Ce-doped YAG phosphor (Intematix Corp., Fremont, CA), yellow emission; And Red-emitting QDs |

In general, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

For purposes of the present disclosure, it will be understood that when a layer (or film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction. The term "interposed" is interpreted in a similar manner.

The following references contain subject matter related to the present subject matter, and each reference is incorporated by reference herein in its entirety: U.S. Patent Application Pub. No. 2005/0224998, filed on Apr. 8, 2004, titled "Electrospray/electrospinning Apparatus and Method;" U.S. Patent Application Pub. No. 2005/0224999, filed Apr. 8, 2004, titled "Electrospinning in a Controlled Gaseous Environment;" U.S. Patent Application Pub. No. 2006/0228435, filed on Apr. 8, 2004, titled "Electrospinning of Polymer Nanofibers Using a Rotating Spray Head;" U.S. Patent Application Pub. No. 2006/0264140, filed May 17, 2005 titled "Nanofiber Mats and Production Methods Thereof;" U.S. Patent Application Pub. No. 2008/0110342, filed Nov. 13, 2006, titled "Particle Filter System Incorporating Nanofibers;" U.S. Patent Application Pub. No. 2008/0113214, filed on Nov. 13, 2006, titled "Luminescent Device;" International Pub. No. WO 2009/032378, filed on Jun. 12, 2008, titled "Long-Pass Optical Filter Made from Nanofibers;" U.S. Provisional Patent Application No. 61/266,323, filed on Dec. 3, 2009, titled "Reflective Nanofibers in Lighting Devices;" PCT Application No. PCT/US2010/031058, filed on Apr. 14, 2010, titled "Stimulated Lighting Devices;" U.S. Provisional Patent Application 61/375,515 titled "Photoluminescent Nanofiber Composites, Methods for Fabrication, and Related Lighting Devices," filed concurrently with the present application; U.S. Provisional Patent Application 61/375,568 titled "Lighting Devices With Color-Tuning Materials and Methods for Tuning Color Output of Lighting Devices," filed concurrently with the present application; and U.S. Provisional Patent Application 61/375,589 titled "Lighting Devices Utilizing Optical Waveguide and Remote Light Converters, and Related Methods," filed concurrently with the present application.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A lighting device, comprising:
a housing enclosing a housing interior and comprising a light exit for outputting a combination of primary light and secondary light;
a light source configured for emitting a primary light beam of a primary wavelength through the housing interior;
a light converter comprising a luminescent material facing the housing interior and configured for emitting secondary light of one or more wavelengths different from the primary wavelength, in response to excitation by the primary light beam;
a color tuning device configured for adjusting a position of the primary light beam relative to the luminescent material; and
an optical element disposed in the housing interior and interposed in at least a portion of the primary light beam between the light source and the luminescent material, wherein the color tuning device is configured for moving the optical element, and
the optical element is selected from the group consisting of:
an optical waveguide comprising an input surface configured to receive the portion of the primary light beam at an incident direction and an output surface configured to output the portion of the primary light beam transmitted through the optical waveguide at an angle relative to the incident direction; and
an optical waveguide comprising an input end optically coupled to the light source and an output end facing the housing interior at an angle to the luminescent material, and the optical waveguide is configured for directing the primary light beam from the light source, through the housing interior and toward the luminescent material.

2. The lighting device of claim 1, wherein the luminescent material comprises a pattern of two or more luminescent components configured for emitting secondary light components of two or more different wavelengths, and the color tuning device is configured for adjusting a ratio of respective amounts of the primary light beam directly incident on respective areas of the two or more luminescent components.

3. The lighting device of claim 1, comprising a reflective surface facing the housing interior, wherein the color tuning device is configured for adjusting a ratio of an amount of the primary light beam directly incident on the luminescent material to an amount of the primary light beam directly incident on the reflective surface.

4. The lighting device of claim 1, wherein the color tuning device is configured for moving the luminescent material relative to the light source or for moving the light source relative to the luminescent material.

5. The lighting device of claim 4, wherein the color tuning device is configured for moving the luminescent material according to a mode selected from the group consisting of linearly translating the luminescent material in a plane orthogonal to a nominal output axis of the light source, linearly translating the luminescent material toward or away from the light source, rotating the luminescent material, and combinations of two of more of the foregoing.

6. The lighting device of claim 4, wherein the color tuning device comprises an actuator configured for actuating movement of the luminescent material or the light source, and a support structure configured for supporting the actuator or the luminescent material during movement.

7. The lighting device of claim 1, wherein the color tuning device comprises an actuator configured for actuating movement of the optical element, and a support structure configured for supporting the actuator or the optical element during movement.

8. The lighting device of claim 1, wherein the luminescent material comprises at least a first luminescent component and a second luminescent component configured for respectively emitting secondary light of a first wavelength and a second wavelength, and the first luminescent component and the second luminescent component are arranged in an alternating pattern.

9. The lighting device of claim 8, wherein the alternating pattern is selected from the group consisting of a plurality of polygons, a plurality of ellipses, a plurality of circular sectors, a spiral pattern, a dot or circular pattern, and combinations of two or more of the foregoing.

10. The lighting device of claim 1, wherein the housing comprises an inside surface coaxial with an axis of the housing interior, the light exit is disposed at an axial end of the housing interior, and the luminescent material is disposed at an opposite axial end of the housing interior.

11. The lighting device of claim 1, wherein the housing comprises an inside surface, the inside surface comprises at least two opposing curved sections, and the luminescent material is interposed between the at least two curved sections.

12. The lighting device of claim 1, comprising a reflective surface facing the housing interior.

13. The lighting device of claim 12, wherein the housing comprises an inside surface and the reflective surface is disposed on the inside surface.

14. The lighting device of claim 1, wherein the light converter comprises a reflective substrate and the luminescent material is supported by the substrate.

15. The lighting device of claim 14, wherein the substrate comprises a nonwoven material.

16. The lighting device of claim 14, wherein the substrate comprises a plurality of nanofibers.

17. The lighting device of claim 1, wherein the luminescent material is selected from the group consisting of quantum dots, phosphors, nano-phosphors, organic dyes, and combinations of two or more of the foregoing.

18. The lighting device of claim 1, wherein the light source is one of a plurality of light sources configured for emitting respective primary light beams, and further comprising a plurality of optical waveguides comprising respective input ends optically coupled to the respective light sources and respective output ends positioned at respective angles to the luminescent material, wherein the optical waveguides are configured for directing the respective primary light beams from the respective light sources, through the housing interior and toward the luminescent material.

19. The lighting device of claim 18, wherein the light converter comprises a reflective section facing the housing interior, at least one of the light sources or optical waveguides is configured to direct a corresponding primary light beam to the reflective section, and at least one of the other light sources or optical waveguides is configured to direct a corresponding primary light beam to the luminescent material.

20. The lighting device of claim 18, wherein the luminescent material comprises a first luminescent section configured for emitting secondary light of a first wavelength, and a second luminescent section configured for emitting secondary light of a second wavelength different from the first wavelength, and at least one of the light sources or optical waveguides is configured to direct a corresponding primary light beam to the first luminescent section, and at least one of the other light sources or optical waveguides is configured to direct a corresponding primary light beam to the second luminescent section.

21. A method for tuning a color of light outputted from a lighting device, the method comprising:
   emitting a primary light beam of a primary wavelength through a housing interior of a housing of the lighting device such that at least a portion of the primary light beam is incident on a luminescent material, by transmitting the primary light beam from a light source into an optical waveguide, and emitting the primary light beam from the optical waveguide along a nominal output axis oriented at an angle to the luminescent material;
   emitting secondary light from the luminescent material through the housing interior, in response to excitation by the primary light beam, wherein the secondary light is emitted at one or more wavelengths different from the primary wavelength;
   outputting an output light from a light exit of the housing, wherein the output light comprises a combination of primary light and emitted secondary light; and
adjusting a position of the primary light beam relative to the luminescent material to tune the output light to a desired color.

22. The method of claim 21, wherein outputting the output light comprises outputting primary light selected from the group consisting of primary light reflected from a reflective surface in the housing interior, unconverted primary light reflected from the luminescent material, primary light reflected from a substrate supporting the luminescent material, primary light transmitted through a substrate supporting the luminescent material, and combinations of two or more of the foregoing.

23. The method of claim 21, wherein the luminescent material comprises a pattern of two or more luminescent components configured for emitting secondary light of two or more different wavelengths, and adjusting the position of the primary light beam relative to the luminescent material comprises adjusting a ratio of respective amounts of the primary light beam directly incident on respective areas of the two or more luminescent components.

24. The method of claim 21, wherein adjusting the position of the primary light beam relative to the luminescent material comprises adjusting a ratio of an amount of the primary light beam directly incident on the luminescent material to an amount of the primary light beam directly incident on a reflective surface in the housing interior.

25. The method of claim 21, wherein adjusting the position of the primary light beam relative to the luminescent material comprises adjusting a size of an area of the primary light beam incident on the luminescent material.

26. The method of claim 21, wherein adjusting the position of the primary light beam relative to the luminescent material comprises making an adjustment selected from the group consisting of moving the luminescent material relative to the light source, moving the light source relative to the luminescent material, moving an optical element disposed in the housing interior and interposed in at least a portion of the primary light beam between the light source and the luminescent material, and combinations of two or more of the foregoing.

27. The method of claim 21, wherein:
   (a) the light converter comprises a plurality of sections facing the housing interior and having a configuration selected from the group consisting of: (i) a section of reflective material and a section of luminescent material; (ii) a section of a first luminescent material configured for emitting secondary light of a first wavelength, and a section of a second luminescent material configured for emitting secondary light of a second wavelength different from the first wavelength; and (iii) a section of reflective material, a section of a first luminescent material configured for emitting secondary light of a first wavelength, and a section of a second luminescent material configured for emitting secondary light of a second wavelength different from the first wavelength;
   (b) the primary light beam is incident on one or more of the plurality of sections; and
   (c) further comprising adjusting a color of the output light by adjusting a position of the light converter relative to the light source, adjusting a position of the light source relative to the light converter, adjusting a position of an optical waveguide relative to the light converter, modifying an optical path of the primary light beam between the light source and the light converter, or two or more of the foregoing.

28. A lighting device, comprising:
a housing enclosing a housing interior and comprising a light exit for outputting a combination of primary light and secondary light;
a plurality of light sources configured for emitting respective primary light beams of a primary wavelength through the housing interior;
a light converter comprising a luminescent material facing the housing interior and configured for emitting secondary light of one or more wavelengths different from the primary wavelength, in response to excitation by the primary light beams;
a color tuning device configured for adjusting a position of the primary light beam relative to the luminescent material; and
a plurality of optical waveguides comprising respective input ends optically coupled to the respective light sources and respective output ends positioned at respective angles to the luminescent material, wherein the optical waveguides are configured for directing the respective primary light beams from the respective light sources, through the housing interior and toward the luminescent material.

29. The lighting device of claim 28, wherein the light converter comprises a reflective section facing the housing interior, at least one of the light sources or optical waveguides is configured to direct a corresponding primary light beam to the reflective section, and at least one of the other light sources or optical waveguides is configured to direct a corresponding primary light beam to the luminescent material.

30. The lighting device of claim 28, wherein the luminescent material comprises a first luminescent section configured for emitting secondary light of a first wavelength, and a second luminescent section configured for emitting secondary light of a second wavelength different from the first wavelength, and at least one of the light sources or optical waveguides is configured to direct a corresponding primary light beam to the first luminescent section, and at least one of the other light sources or optical waveguides is configured to direct a corresponding primary light beam to the second luminescent section.

* * * * *